(12) United States Patent
Chou et al.

(10) Patent No.: US 10,223,810 B2
(45) Date of Patent: Mar. 5, 2019

(54) REGION-ADAPTIVE HIERARCHICAL TRANSFORM AND ENTROPY CODING FOR POINT CLOUD COMPRESSION, AND CORRESPONDING DECOMPRESSION

(71) Applicant: Microsoft Technology Licensing, LLC, Redmond, WA (US)

(72) Inventors: Philip A. Chou, Bellevue, WA (US); Ricardo L. de Queiroz, Brasilia (BR)

(73) Assignee: Microsoft Technology Licensing, LLC, Redmond, WA (US)

( * ) Notice: Subject to any disclaimer, the term of this patent is extended or adjusted under 35 U.S.C. 154(b) by 265 days.

(21) Appl. No.: 15/168,016

(22) Filed: May 28, 2016

(65) Prior Publication Data

US 2017/0347100 A1    Nov. 30, 2017

(51) Int. Cl.
*H04N 19/13* (2014.01)
*H04N 19/15* (2014.01)
(Continued)

(52) U.S. Cl.
CPC ............ *G06T 9/001* (2013.01); *H04N 19/54* (2014.11); *H04N 19/597* (2014.11); *H04N 19/61* (2014.11)

(58) Field of Classification Search
CPC .... H04N 19/124; H04N 19/13; H04N 19/139; H04N 19/15; H04N 19/1883
See application file for complete search history.

(56) References Cited

U.S. PATENT DOCUMENTS

| | | |
|---|---|---|
| 4,999,705 A | 3/1991 | Puri |
| 5,842,004 A | 11/1998 | Deering et al. |

(Continued)

FOREIGN PATENT DOCUMENTS

| | | |
|---|---|---|
| CN | 103701466 | 4/2014 |
| WO | WO 00/49571 | 8/2000 |

(Continued)

OTHER PUBLICATIONS

Ahn et al., "Motion-compensated Compression of 3D Animation Models," *Journal of Electronics Letters*, vol. 37, No. 24, pp. 1445-1446 (Nov. 2001).

(Continued)

*Primary Examiner* — Md N Haque
(74) *Attorney, Agent, or Firm* — Klarquist Sparkman, LLP

(57) ABSTRACT

Innovations in compression and decompression of point cloud data are described. For example, an encoder is configured to encode point cloud data, thereby producing encoded data. In particular, the encoder applies a region-adaptive hierarchical transform ("RAHT") to attributes of occupied points, thereby producing transform coefficients. The encoder can also quantize the transform coefficients and perform adaptive entropy coding of the quantized transform coefficients. For corresponding decoding, a decoder is configured to decode the encoded data to reconstruct point cloud data. In particular, the decoder applies an inverse RAHT to transform coefficients for attributes of occupied points. The decoder can also perform adaptive entropy decoding and inverse quantization of the quantized transform coefficients. The adaptive entropy coding/decoding can use estimates of the distribution of values for the quantized transform coefficients. In this case, the encoder calculates the estimates and signals them to the decoder.

30 Claims, 20 Drawing Sheets

(51) Int. Cl.

| | | |
|---|---|---|
| H04N 19/139 | (2014.01) | |
| G06T 9/00 | (2006.01) | |
| H04N 19/597 | (2014.01) | |
| H04N 19/61 | (2014.01) | |
| H04N 19/54 | (2014.01) | |

(56) References Cited

U.S. PATENT DOCUMENTS

| | | | |
|---|---|---|---|
| 6,028,635 | A | 2/2000 | Yamaguchi et al. |
| 6,519,284 | B1* | 2/2003 | Pesquet-Popescu .......................... H04N 19/647 375/240.11 |
| 6,563,500 | B1 | 5/2003 | Kim et al. |
| 6,771,809 | B1 | 8/2004 | Rubbert et al. |
| 8,340,177 | B2 | 12/2012 | Ji et al. |
| 2005/0041842 | A1 | 2/2005 | Frakes et al. |
| 2007/0121719 | A1 | 5/2007 | Van Der Schaar et al. |
| 2008/0267291 | A1 | 10/2008 | Vieron et al. |
| 2010/0239178 | A1 | 9/2010 | Osher et al. |
| 2011/0010400 | A1 | 1/2011 | Hayes |
| 2012/0093429 | A1 | 4/2012 | Van Der Vleuten et al. |
| 2012/0245931 | A1 | 9/2012 | Yamanashi et al. |
| 2013/0114707 | A1 | 5/2013 | Seregin et al. |
| 2013/0156306 | A1* | 6/2013 | Masuko ............... H04N 1/3873 382/164 |
| 2013/0242051 | A1 | 9/2013 | Balogh |
| 2013/0294706 | A1* | 11/2013 | Maurer ..................... G06T 9/00 382/251 |
| 2013/0297574 | A1 | 11/2013 | Thiyanaratnam |
| 2013/0300740 | A1 | 11/2013 | Snyder et al. |
| 2014/0205009 | A1 | 7/2014 | Rose et al. |
| 2015/0010074 | A1 | 1/2015 | Choi et al. |
| 2015/0101411 | A1 | 4/2015 | Zalev et al. |
| 2015/0288963 | A1 | 10/2015 | Sato |
| 2016/0047903 | A1 | 2/2016 | Dussan |
| 2016/0073129 | A1 | 3/2016 | Lee et al. |
| 2016/0086353 | A1 | 3/2016 | Lukac et al. |
| 2016/0232420 | A1* | 8/2016 | Fan ...................... G06K 9/4647 |
| 2017/0155906 | A1 | 6/2017 | Puri |
| 2017/0214943 | A1 | 7/2017 | Cohen et al. |

FOREIGN PATENT DOCUMENTS

| | | |
|---|---|---|
| WO | WO 2005/078663 | 8/2005 |
| WO | WO 2015/006884 | 1/2015 |
| WO | WO 2015/090682 | 6/2015 |

OTHER PUBLICATIONS

Altunbasak et al., "Realizing the Vision of Immersive Communication," *IEEE Signal Processing Magazine*, vol. 28, Issue 1, pp. 18-19 (Jan. 2011).

Alwani et al., "Restricted Affine Motion Compensation in Video Coding Using Particle Filtering," *Indian Conf on Computer Vision, Graphics, and Image Processing*, pp. 479-484 (Dec. 2010).

Anis et al., "Compression of Dynamic 3D Point Clouds Using Subdivisional Meshes and Graph Wavelet Transforms," *Int'l Conf. on Acoustics, Speech, and Signal Processing*, 5 pp. (Mar. 2016).

Apostolopoulos et al., "The Road to Immersive Communication," *Proc. of the IEEE*, vol. 100, No. 4, pp. 974-990 (Apr. 2012).

"Being There Centre," downloaded from http://imi.ntu.edu.sg/BeingThereCentre/Pages/BTChome.aspx, 1 p. (downloaded on May 13, 2016).

Briceño et al., "Geometry Videos: A New Representation for 3D Animations," *Eurographics/SIGGRAPH Symp. on Computer Animation*, pp. 136-146 (Jul. 2003).

Chou, "Advances in Immersive Communication: (1) Telephone, (2) Television, (3) Teleportation," *ACM Trans. on Multimedia Computing, Communications and Applications*, vol. 9, No. 1s, 4 pp. (Oct. 2013).

Collet et al., "High-Quality Streamable Free-Viewpoint Video," *ACM Trans. on Graphics*, vol. 34, Issue 4, 13 pp. (Aug. 2015).

"CyPhy—Multi-Modal Teleimmersion for Tele-Physiotherapy," downloaded from http://cairo.cs.uiuc.edu/projects/teleimmersion/ , 3 pp. (downloaded on May 13, 2016).

de Queiroz et al., "Compression of 3D Point Clouds Using a Region-Adaptive Hierarchical Transform," *IEEE Trans. on Image Processing*, 10 pp. (May 2016).

de Queiroz, "On Data Filling Algorithms for MRC Layers," *Int'l Conf. on Image Processing*, vol. 2, 4 pp. (Sep. 2000).

Devillers et al., "Geometric Compression for Interactive Transmission," *IEEE Conf. on Visualization*, pp. 319-326 (Oct. 2000).

Dou et al., "3D Scanning Deformable Objects with a Single RGBD Sensor," *IEEE Conf. on Computer Vision and Pattern Recognition*, pp. 493-501 (Jun. 2015).

Flierl et al., "Inter-Resolution Transform for Spatially Scalable Video Coding," *Picture Coding Symp.*, 6 pp. (Dec. 2004).

Girod et al., "3-D Image Models and Compression—Synthetic Hybrid or Natural Fit?," *Int'l Conf. on Image Processing*, vol. 2, 5 pp. (Oct. 1999).

Gottfried et al., "Computing Range Flow from Multi-modal Kinect Data," *Int'l Conf. on Advances in Visual Computing*, pp. 758-767 (Sep. 2011).

Gu et al., "Geometry Images," *Proc. Conf. on Computer Graphics and Interactive Techniques*, pp. 355-361 (Jul. 2002).

Gupta et al., "Registration and Partitioning-Based Compression of 3-D Dynamic Data," *IEEE Trans. on Circuits and Systems for Video Technology*, vol. 13, No. 11, pp. 1144-1155 (Nov. 2003).

Habe et al., "Skin-Off: Representation and Compression Scheme for 3D Video," *Proc. of Picture Coding Symp.*, pp. 301-306 (Dec. 2004).

Hadfield et al., "Scene Particles: Unregularized Particle-Based Scene Flow Estimation," *IEEE Trans. on Pattern Analysis and Machine Intelligence*, vol. 36, No. 3, pp. 564-576 (Mar. 2014).

Han et al., "Time-Varying Mesh Compression Using an Extended Block Matching Algorithm," *IEEE Trans. on Circuits and Systems for Video Technology*, vol. 17, No. 11, pp. 1506-1518 (Nov. 2007).

Hebert et al., "Terrain Mapping for a Roving Planetary Explorer," *IEEE Int'l Conf. on Robotics and Automation*, pp. 997-1002 (May 1989).

Herbst et al., "RGB-D Flow: Dense 3-D Motion Estimation Using Color and Depth," *Int'l Conf. on Robotics and Automation*, 7 pp. (May 2013).

Hornáček et al., "SphereFlow: 6 DoF Scene Flow from RGB-D Pairs," *IEEE Conf on Computer Vision and Pattern Recognition*, pp. 3526-3533 (Jun. 2014).

Hou et al., "Compressing 3-D Human Motions via Keyframe-Based Geometry Videos," *IEEE Trans. on Circuits and Systems for Video Technology*, vol. 25, No. 1, pp. 51-62 (Jan. 2015).

Houshiar et al., "3D Point Cloud Compression Using Conventional Image Compression for Efficient Data Transmission," *Int'l Conf. on Information, Communication and Automation Technologies*, 8 pp. (Oct. 2015).

Huang et al., "A Generic Scheme for Progressive Point Cloud Coding," *IEEE Trans. on Visualization and Computer Graphics*, vol. 14, No. 2, pp. 440-453 (Mar. 2008).

Huang et al., "Octree-Based Progressive Geometry Coding of Point Clouds," *Europgraphics Symp. on Point-Based Graphics*, 9 pp. (Jul. 2006).

Kammerl, "Development and Evaluation of Point Cloud Compression for the Point Cloud Library," *Institute for Media Technology, Powerpoint presentation*, 15 pp. (May 2011).

Kammerl et al., "Real-time Compression of Point Cloud Streams," *IEEE Int'l Conf. on Robotics and Automation*, pp. 778-785 (May 2012).

Kim et al., "Low Bit-Rate Scalable Video Coding with 3-D Set Partitioning in Hierarchical Trees (3-D SPIHT)," *IEEE Trans. on Circuits and Systems for Video Technology*, vol. 10, No. 8, pp. 1374-1387 (Dec. 2000).

Lanier, "Virtually There," *Journal of Scientific American*, 16 pp. (Apr. 2001).

Li, "Visual Progressive Coding," *Journal of International Society for Optics and Photonics*, 9 pp. (Dec. 1998).

(56) References Cited

OTHER PUBLICATIONS

Loop et al., "Real-Time High-Resolution Sparse Voxelization with Application to Image-Based Modeling," *Proc. High-Performance Graphics Conf.*, pp. 73-79 (Jul. 2013).
Malvar, "Adaptive Run-Length/Golomb-Rice Encoding of Quantized Generalized Gaussian Sources with Unknown Statistics," *Data Compression Conf.*, 10 pp. (Mar. 2006).
Mekuria et al., "A 3D Tele-Immersion System Based on Live Captured Mesh Geometry," *ACM Multimedia Systems Conf.*, pp. 24-35 (Feb. 2013).
Mekuria et al., "Design, Implementation and Evaluation of a Point Cloud Codec for Tele-Immersive Video," *IEEE Trans. on Circuits and Systems for Video Technology*, 14 pp. (May 2016).
Merkle et al., "Multi-View Video Plus Depth Representation and Coding," *IEEE Int'l Conf. on Image Processing*, vol. 1, 4 pp. (Sep. 2007).
Minami et al., "3-D Wavelet Coding of Video with Arbitrary Regions of Support," *IEEE Trans. on Circuits and Systems for Video Technology*, vol. 11, No. 9, pp. 1063-1068 (Sep. 2001).
Müller et al., "Rate-Distortion-Optimized Predictive Compression of Dynamic 3D Mesh Sequences," *Journal of Signal Processing: Image Communication*, vol. 21, Issue 9, 28 pp. (Oct. 2006).
Nguyen et al., "Compression of Human Body Sequences Using Graph Wavelet Filter Banks," *IEEE Int'l Conf. on Acoustics, Speech and Signal Processing*, pp. 6152-6156 (May 2014).
Niu et al., "Compass Rose: A Rotational Robust Signature for Optical Flow Computation," *IEEE Trans. on Circuits and Systems for Video Technology*, vol. 24, No. 1, pp. 63-73 (Jan. 2014).
Ochotta et al., "Compression of Point-Based 3D Models by Shape-Adaptive Wavelet Coding of Multi-Height Fields," *Europgraphics Symp. on Point-Based Graphics*, 10 pp. (Jun. 2004).
Peng et al., "Technologies for 3D Mesh Compression: A Survey," *Journal of Visual Communication and Image Representation*, vol. 16, Issue 6, pp. 688-733 (Apr. 2005).
Quiroga et al., "Dense Semi-Rigid Scene Flow Estimation from RGBD images," *European Conf. on Computer Vision*, 16 pp. (Sep. 2014).
Quiroga et al., "Local/Global Scene Flow Estimation," *IEEE Int'l Conf. on Image Processing*, pp. 3850-3854 (Sep. 2013).
"Reverie REal and Virtual Engagement in Realistic Immersive Environments," downloaded from http://www.reveriefp7.eu/, 3 pp. (downloaded on May 13, 2016).
Rusu et al., "3D is Here: Point Cloud Library (PCL)," *IEEE Int'l Conf. on Robotics and Automation*, 4 pp. (May 2011).
Said, "Introduction to Arithmetic Coding—Theory and Practice," HP Technical Report HPL-2004-76, 67 pp. (Apr. 2004).
Schnabel et al., "Octree-based Point-Cloud Compression," *Eurographics Symp. on Point-Based Graphics*, 11 pp. (Jul. 2006).
Seeker et al., "Motion-Compensated Highly Scalable Video Compression Using an Adaptive 3D Wavelet Transform Based on Lifting," *IEEE Int'l Conf. on Image Processing*, vol. 2, pp. 1029-1032 (Oct. 2001).
Stefanoski et al., "Spatially and Temporally Scalable Compression of Animated 3D Meshes with MPEG-4/FAMC," *IEEE Int'l Conf. on Image Processing*, pp. 2696-2699 (Oct. 2008).
Sun et al., "Rate-Constrained 3D Surface Estimation From Noise-Corrupted Multiview Depth Videos," *IEEE Trans. on Image Processing*, vol. 23, No. 7, pp. 3138-3151 (Jul. 2014).
Thanou et al., "Graph-based Compression of Dynamic 3D Point Cloud Sequences," *IEEE Trans. on Image Processing*, vol. 25, No. 4, 13 pp. (Apr. 2016).
Thanou et al., "Graph-Based Motion Estimation and Compensation for Dynamic 3D Point Cloud Compression," *IEEE Int'l Conf. on Image Processing*, pp. 3235-3239 (Sep. 2015).
Tran, "Image Coding and JPEG," ECE Department, The Johns Hopkins University, powerpoint presentation, 92 pp. (downloaded on May 9, 2016).
Triebel et al., "Multi-Level Surface Maps for Outdoor Terrain Mapping and Loop Closing," *IEEE Int'l Conf. on Intelligent Robots and Systems*, pp. 2276-2282 (Oct. 2006).
Váša et al., "Geometry-Driven Local Neighborhood Based Predictors for Dynamic Mesh Compression," *Computer Graphics Forum*, vol. 29, No. 6, pp. 1921-1933 (Sep. 2010).
Wang et al., "Handling Occlusion and Large Displacement Through Improved RGB-D Scene Flow Estimation," *IEEE Trans. on Circuits and Systems for Video Technology*, 14 pp. (Jul. 2015).
Waschbüsch et al., "Progressive Compression of Point-Sampled Models," *Eurographics Symp. on Point-Based Graphics*, 9 pp. (Jun. 2004).
Weiwei et al., "Fast Intra/Inter Frame Coding Algorithm for H.264/AVC," *Int'l Conf. on Signal Processing*, pp. 1305-1308 (May 2008).
Yuille et al., "A Mathematical Analysis of the Motion Coherence Theory," *Int'l Journal of Computer Vision*, vol. 3, pp. 155-175 (Jun. 1989).
Zhang et al., "Dense Scene Flow Based on Depth and Multi-channel Bilateral Filter," *Proc. 11th Asian Conf. on Computer Vision*, pp. 140-151 (Nov. 2012).
Zhang et al., "Point Cloud Attribute Compression with Graph Transform," *IEEE Int'l Conf. on Image Processing*, 5 pp. (Oct. 2014).
Zhang et al., "Viewport: A Distributed, Immersive Teleconferencing System with Infrared Dot Pattern," *IEEE Multimedia*, pp. 17-27 (Jan. 2013).
Chou, "Rate-Distortion Optimized Coder for Dynamic Voxelized Point Clouds," including attached document, MPEG 115th Meeting MPEG2016/m38675, 2 p. (May 25, 2016).
de Queiroz, "Motion-Compensated Compression of Dynamic Voxelized Point Clouds," Trans. on Image Procesing, 10 pp. (Apr. 2016).
Morell et al., "Geometric 3D Point Cloud Compression," Journal of Pattern Recognition Letters, Accepted Manuscript, 18 pp. (Dec. 2014).
MPEG "Geneva Meeting—Document Register", 115th MPEG Meeting, 26 pp. (Jul. 11, 2016).
Navarette et al., "3DCOMET: 3D Compression Methods Test Dataset," Robotics and Autonomous Systems, Accepted Manuscript, pp. 1-23 (Jul. 2015).

\* cited by examiner software 180 implementing one or more innovations for
point cloud compression with a region-adaptive hierarchical transform
and/or adaptive entropy coding, and corresponding decompression

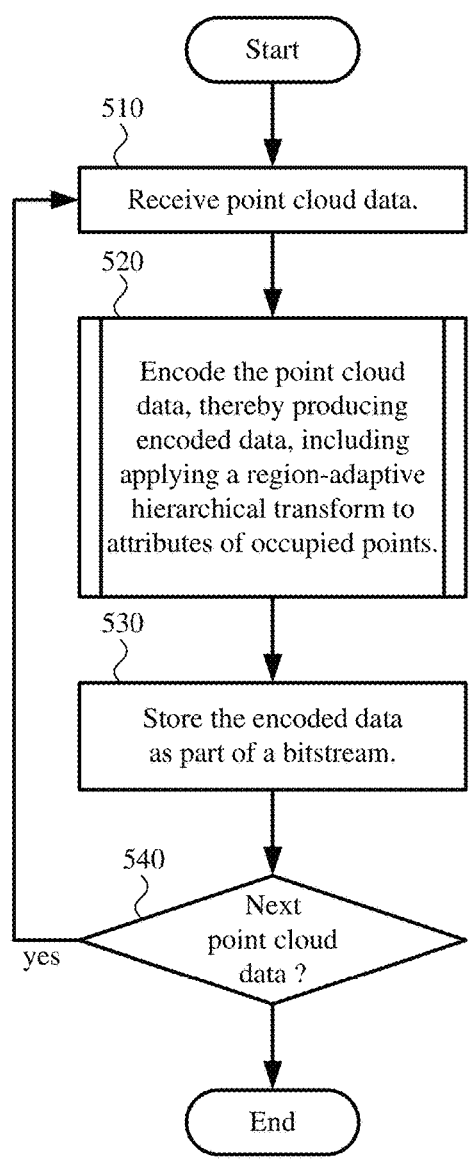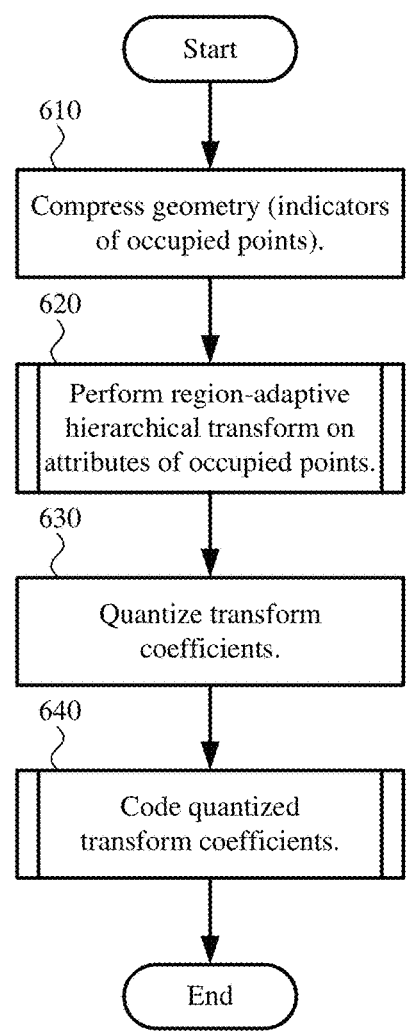

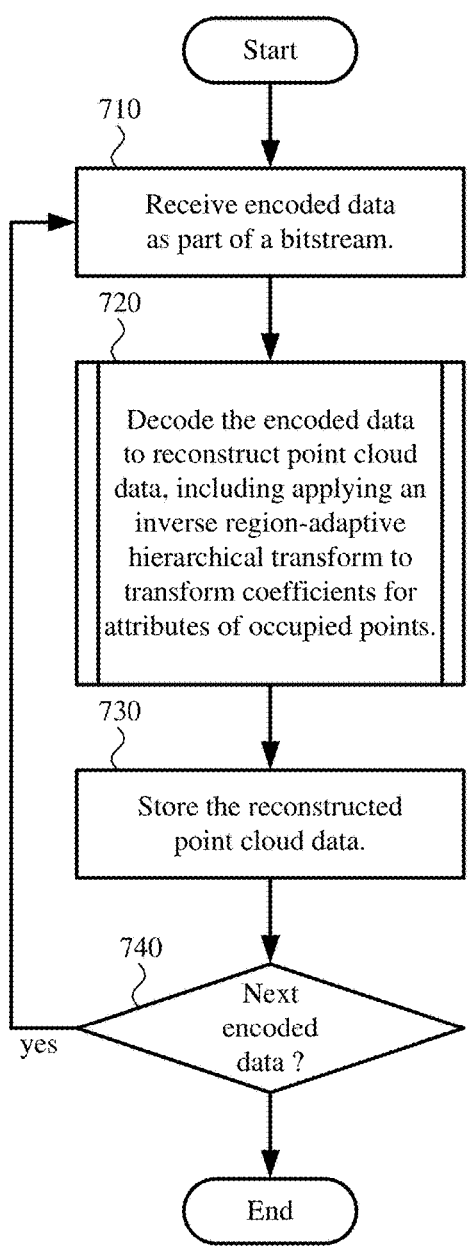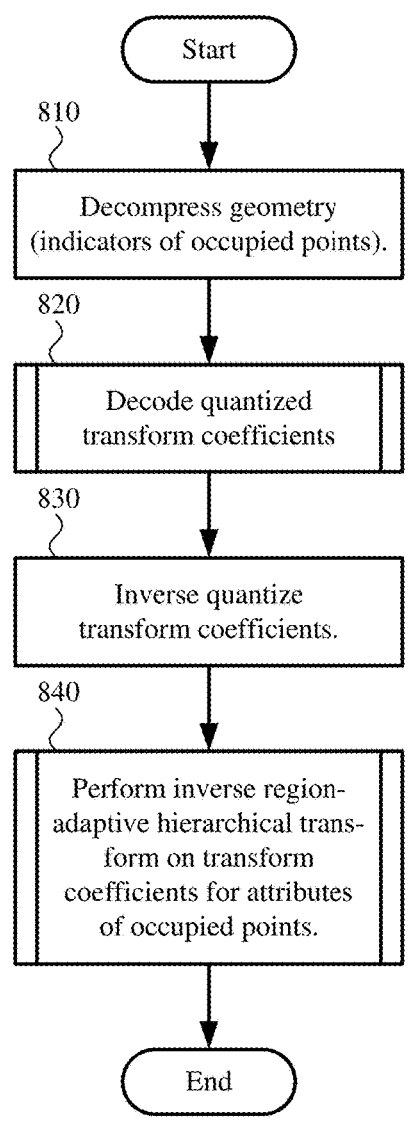

FIG. 9  900
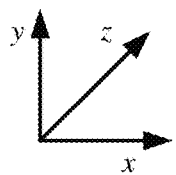
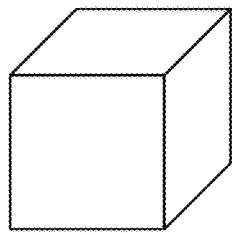
cube at level $l$, having
dimensions $W \times W \times W$
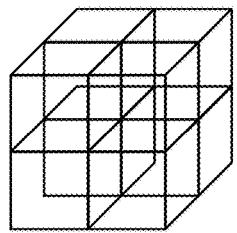
sub-cubes at level $l+1$,
each having dimensions
$W/2 \times W/2 \times W/2$
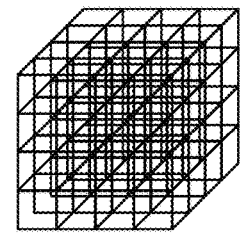
sub-cubes at level $l+2$,
each having dimensions
$W/4 \times W/4 \times W/4$
FIG. 10
1000
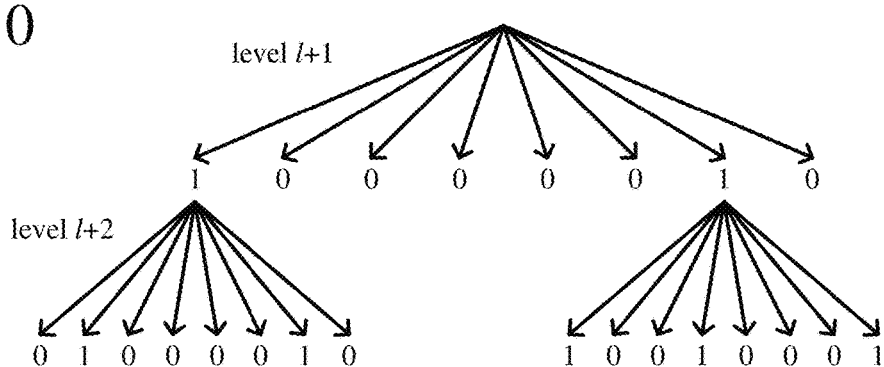
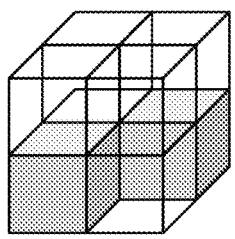
occupied points
at level $l+1$
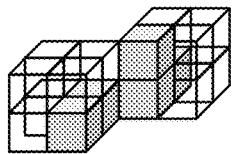
occupied points
at level $l+2$
 not occupied (0)
 occupied (1)

FIG. 15 1500
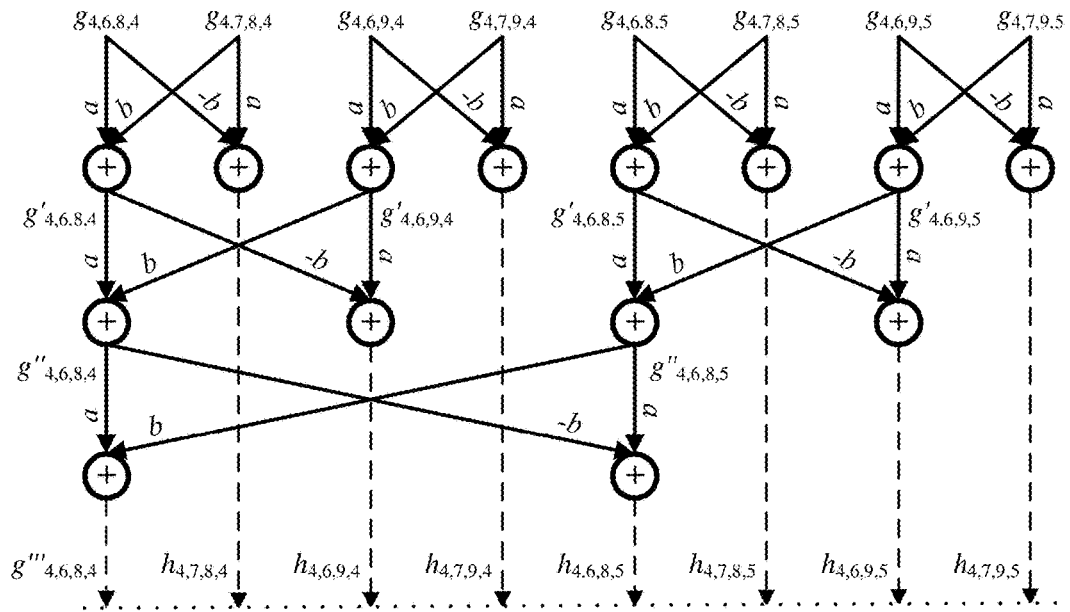
further RAHT (for lowpass coeff), compression (quantization, entropy coding, etc.), transfer (to/from storage, network, etc.), decompression (entropy decoding, inverse quantization, etc.), further inverse RAHT (for lowpass coeff)
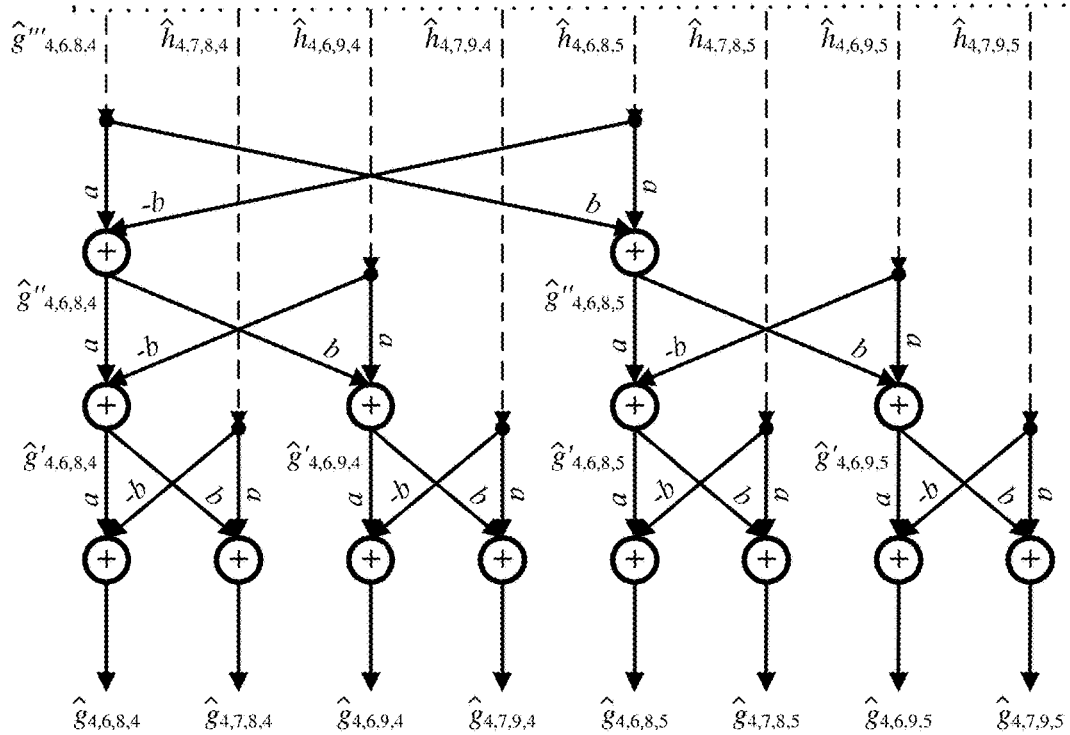

FIG. 19  1900 (example of stage 620)
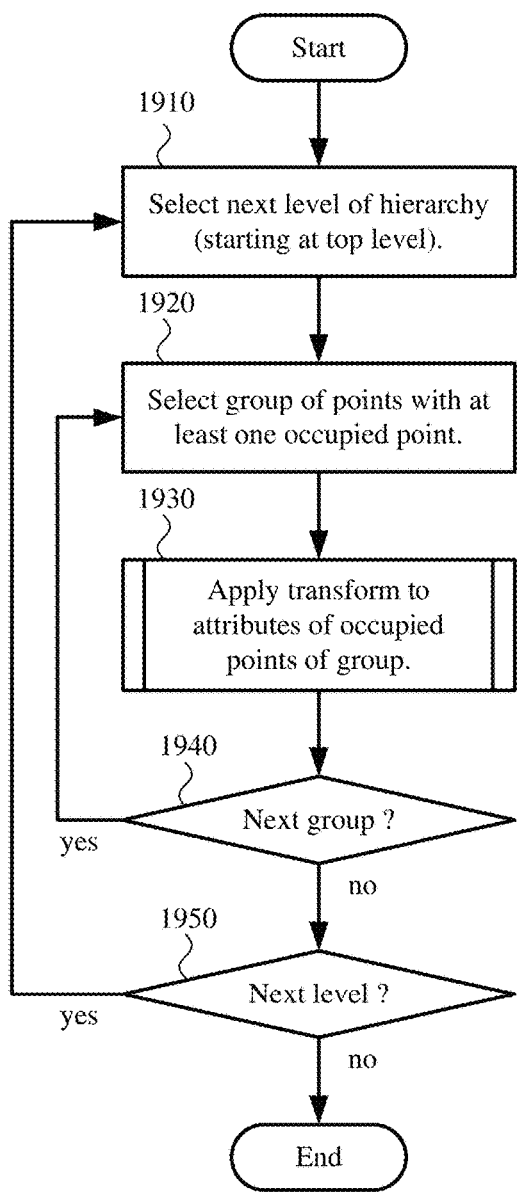
FIG. 20  2000 (example of stage 1930)
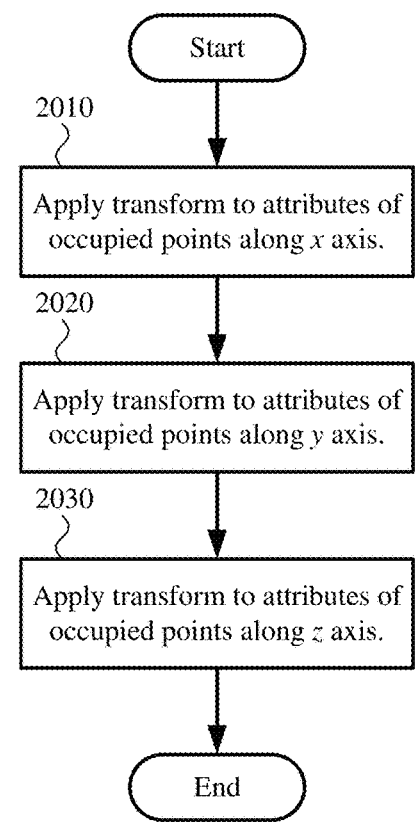

FIG. 21  2100 (example of stage 840)
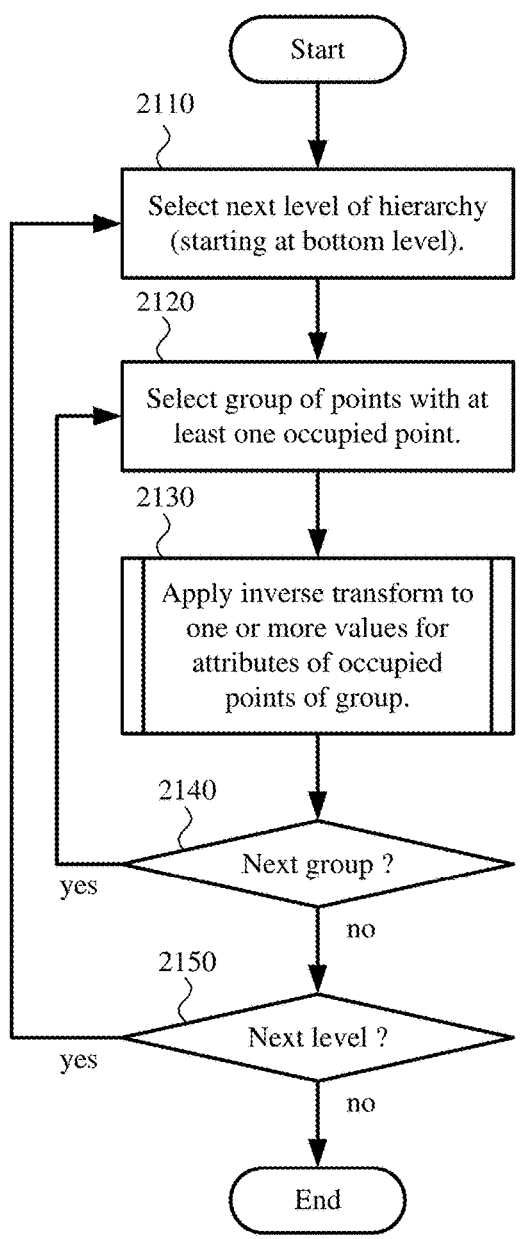
FIG. 22  2200 (example of stage 2130)
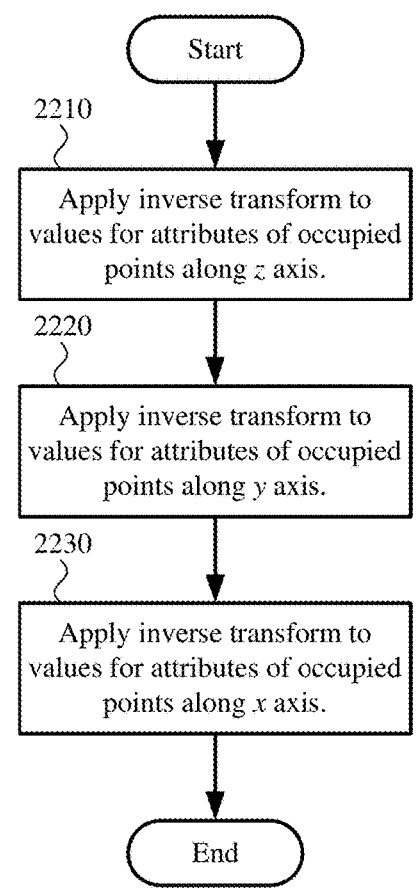

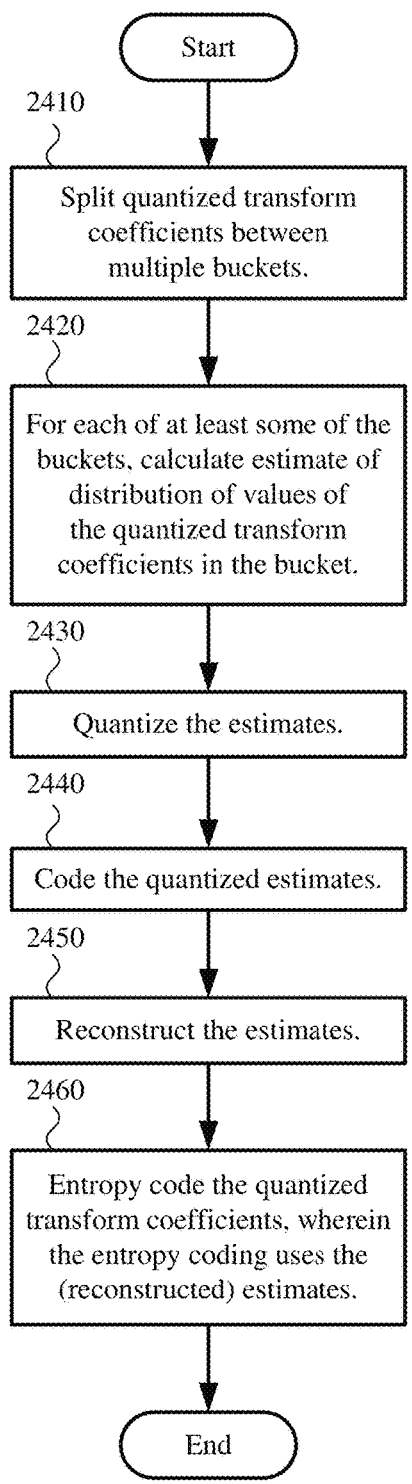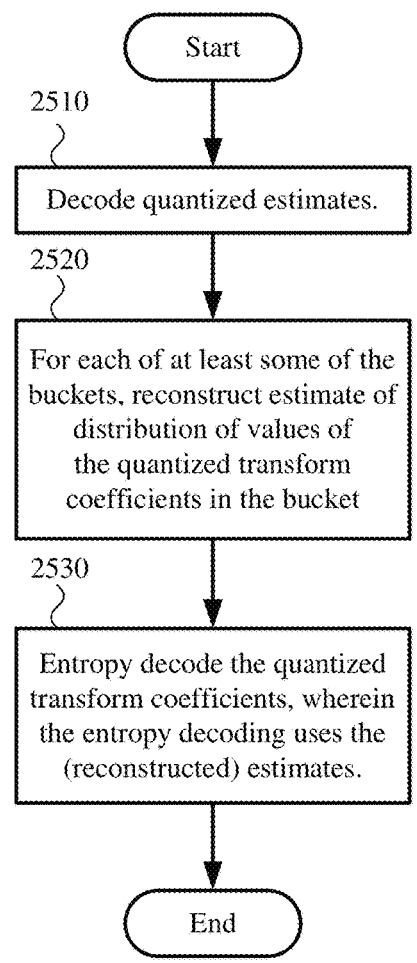

REGION-ADAPTIVE HIERARCHICAL TRANSFORM AND ENTROPY CODING FOR POINT CLOUD COMPRESSION, AND CORRESPONDING DECOMPRESSION

FIELD

Compression of three-dimensional point cloud data, and corresponding decompression.

BACKGROUND

Engineers use compression (also called source coding or source encoding) to reduce the bit rate of digital media content. Compression decreases the cost of storing and transmitting media information by converting the information into a lower bit rate form. Decompression (also called decoding) reconstructs a version of the original information from the compressed form. A "codec" is an encoder/decoder system.

Often, compression is applied to digital media content such as speech or other audio, images, or video. Recently, compression has also been applied to point cloud data. A point cloud represents one or more objects in three-dimensional ("3D") space. A point in the point cloud is associated with a position in the 3D space. If the point is occupied, the point has one or more attributes, such as sample values for a color. An object in the 3D space can be represented as a set of points that cover the surface of the object.

Point cloud data can be captured in various ways. In some configurations, for example, point cloud data is captured using special cameras that measure the depth of objects in a room, in addition to measuring attributes such as colors. After capture and compression, compressed point cloud data can be conveyed to a remote location. This enables decompression and viewing of the reconstructed point cloud data from an arbitrary, free viewpoint at the remote location. One or more views of the reconstructed point cloud data can be rendered using special glasses or another viewing apparatus, to show the subject within a real scene (e.g., for so-called augmented reality) or within a synthetic scene (e.g., for so-called virtual reality). Processing point cloud data can consume a huge amount of computational resources. One point cloud can include millions of occupied points, and a new point cloud can be captured 30 or more times per second for a real time application.

Some prior approaches to compression of point cloud data provide effective compression in terms of rate-distortion performance (that is, high quality for a given number of bits used, or a low number of bits used for a given level of quality). For example, one such approach uses a graph transform and arithmetic coding of coefficients. Such approaches are not computationally efficient, however, which makes them infeasible for real-time processing, even when powerful computer hardware is used (e.g., graphics processing units). Other prior approaches to compression of point cloud data are simpler to perform, but deficient in terms of rate-distortion performance in some scenarios.

SUMMARY

In summary, the detailed description presents innovations in compression and decompression of point cloud data. For example, an encoder uses a region-adaptive hierarchical transform ("RAHT"), which can provide a very compact way to represent the attributes of occupied points in the point cloud data, followed by quantization and adaptive entropy coding of transform coefficients. In addition to providing effective compression (in terms of rate-distortion efficiency), approaches described herein are computationally simpler than many previous approaches to compression of point cloud data. A corresponding decoder uses adaptive entropy decoding and inverse quantization, followed by an inverse RAHT.

According to one aspect of the innovations described herein, a computer system includes an input buffer, an encoder, and an output buffer. The input buffer is configured to receive point cloud data comprising multiple points in three-dimensional ("3D") space. Each of the multiple points is associated with an indicator of whether the point is occupied and, if the point is occupied, an attribute of the occupied point. The encoder is configured to encode the point cloud data, thereby producing encoded data. In particular, the encoder is configured to perform various operations, including applying a RAHT to attributes of occupied points among the multiple points, thereby producing transform coefficients. The encoder's operations can also include quantization of the transform coefficients and entropy coding of the quantized transform coefficients. For adaptive entropy coding, the encoder can split the quantized transform coefficients between multiple buckets and calculate, for each of at least some of the multiple buckets, an estimate of distribution of values of the quantized transform coefficients in the bucket. The encoder can encode the estimates of the distributions and output the encoded estimates. The encoder can then use the estimates to adapt how entropy coding is performed. The output buffer is configured to store the encoded data as part of a bitstream for output.

For corresponding decoding, a computer system includes an input buffer, a decoder, and an output buffer. The input buffer is configured to receive encoded data as part of a bitstream. The decoder is configured to decode the encoded data to reconstruct point cloud data. The point cloud data comprises multiple points in 3D space. Each of the multiple points is associated with an indicator of whether the point is occupied and, if the point is occupied, an attribute of the occupied point. In particular, the decoder is configured to perform various operations, including applying an inverse RAHT to transform coefficients for attributes of occupied points among the multiple points. The decoder's operations can also include entropy decoding of quantized transform coefficients and inverse quantization of the quantized transform coefficients (to reconstruct the transform coefficients for attributes of occupied points among the multiple points). For adaptive entropy decoding, for each of at least some of multiple buckets of the quantized transform coefficients, the decoder can decode, using part of the encoded data in the input buffer, an estimate of distribution of values of the quantized transform coefficients in the bucket. The decoder can then use the estimates to adapt how entropy decoding is performed. The output buffer is configured to store the reconstructed point cloud data.

The innovations can be implemented as part of a method, as part of a computer system configured to perform operations for the method, or as part of one or more computer-readable media storing computer-executable instructions for causing a computer system to perform the operations for the method. The various innovations can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the invention will become more apparent from the following detailed description, which proceeds with reference to the accompanying figures.

BRIEF DESCRIPTION OF THE DRAWINGS

FIG. 5 is a flowchart illustrating a generalized technique for encoding of point cloud data, including applying a RAHT to attributes of occupied points, and FIG. 6 is a flowchart illustrating an example of details for such encoding.

FIG. 7 is a flowchart illustrating a generalized technique for decoding of point cloud data, including applying an inverse RAHT to transform coefficients for attributes of occupied points, and FIG. 8 is a flowchart illustrating an example of details for such decoding.

FIG. 9 is a diagram illustrating hierarchical organization that may be applied to point cloud data for octtree compression and decompression.

FIG. 10 is a diagram illustrating features of scanning for octtree compression and decompression.

FIGS. 15-17 are diagrams illustrating features of transforms during coding and inverse transforms during decoding of attributes of occupied points of point cloud data.

FIGS. 19 and 20 are flowcharts illustrating an example technique for applying a RAHT during coding of attributes of occupied points of point cloud data.

FIGS. 21 and 22 are flowcharts illustrating an example technique for applying an inverse RAHT during decoding of attributes of occupied points of point cloud data.

FIGS. 24 and 25 are flowcharts illustrating example techniques for adaptive entropy coding and decoding, respectively, of quantized transform coefficients produced by applying a RAHT.

DETAILED DESCRIPTION

The detailed description presents innovations in compression and decompression of point cloud data. For example, an encoder uses a region-adaptive hierarchical transform ("RAHT"), which can provide a very compact way to represent the attributes of occupied points in point cloud data, followed by quantization and adaptive entropy coding of the transform coefficients produced by the RAHT. In addition to providing effective compression (in terms of rate-distortion efficiency), approaches described herein are computationally simpler than many previous approaches to compression of point cloud data. A corresponding decoder uses adaptive entropy decoding and inverse quantization, followed by application of an inverse RAHT.

In the examples described herein, identical reference numbers in different figures indicate an identical component, module, or operation. Depending on context, a given component or module may accept a different type of information as input and/or produce a different type of information as output, or be processed in a different way.

More generally, various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted in the background. Typically, a given technique/tool does not solve all such problems.

I. Example Computer Systems.

Figure 1:
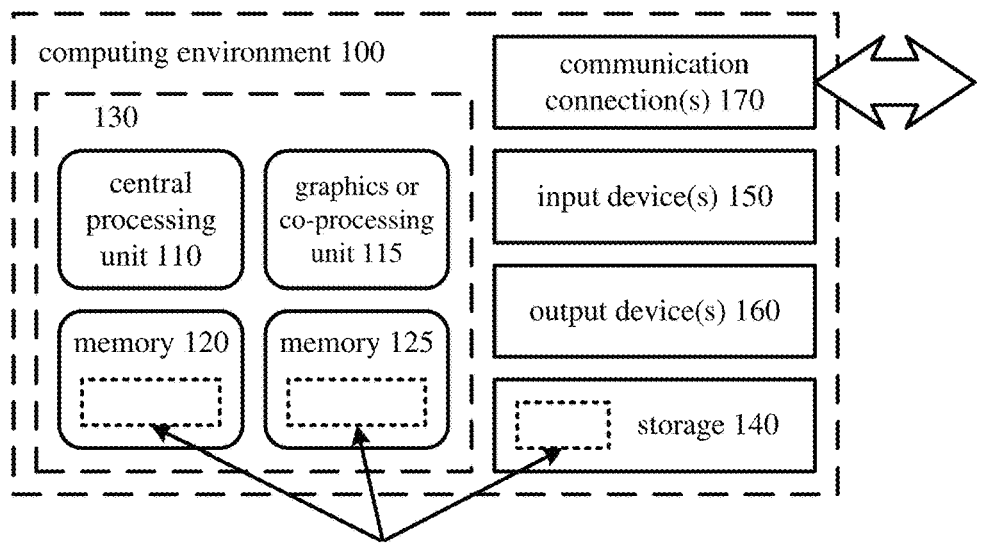
FIG. 1 is a diagram illustrating an example computer system in which some described embodiments can be implemented.

FIG. 1 illustrates a generalized example of a suitable computer system (100) in which several of the described innovations may be implemented. The computer system (100) is not intended to suggest any limitation as to scope of use or functionality, as the innovations may be implemented in diverse general-purpose or special-purpose computer systems.

With reference to FIG. 1, the computer system (100) includes one or more processing units (110, 115) and memory (120, 125). The processing units (110, 115) execute computer-executable instructions. A processing unit can be a general-purpose central processing unit ("CPU"), processor in an application-specific integrated circuit ("ASIC") or any other type of processor. In a multi-processing system, multiple processing units execute computer-executable instructions to increase processing power. For example, FIG. 1 shows a CPU (110) as well as a graphics processing unit or co-processing unit (115). The tangible memory (120, 125) may be volatile memory (e.g., registers, cache, RAM), non-volatile memory (e.g., ROM, EEPROM, flash memory, etc.), or some combination of the two, accessible by the processing unit(s). The memory (120, 125) stores software (180) implementing one or more innovations for point cloud compression with a RAHT and/or adaptive entropy coding, and corresponding decompression, in the form of computer-executable instructions suitable for execution by the processing unit(s).

A computer system may have additional features. For example, the computer system (100) includes storage (140), one or more input devices (150), one or more output devices (160), and one or more communication connections (170). An interconnection mechanism (not shown) such as a bus, controller, or network interconnects the components of the computer system (100). Typically, operating system software (not shown) provides an operating environment for other software executing in the computer system (100), and coordinates activities of the components of the computer system (100).

The tangible storage (140) may be removable or non-removable, and includes magnetic media such as magnetic disks, magnetic tapes or cassettes, optical media such as CD-ROMs or DVDs, or any other medium which can be used to store information and which can be accessed within the computer system (100). The storage (140) stores instructions for the software (180) implementing one or more innovations for point cloud compression with a RAHT and/or adaptive entropy coding, and corresponding decompression.

The input device(s) (150) may be a touch input device such as a keyboard, mouse, pen, or trackball, a voice input device, a scanning device, or another device that provides input to the computer system (100). For point cloud data, the input device(s) (150) may be a set of depth cameras or similar devices that capture video input used to derive point cloud data, or a CD-ROM or CD-RW that reads point cloud data into the computer system (100). The output device(s) (160) may be a display, printer, speaker, CD-writer, or other device that provides output from the computer system (100). For rendering of views of reconstructed point cloud data, the output device(s) (160) may be special glasses or another viewing apparatus, to show the reconstructed point cloud data within a real scene or a synthetic scene.

The communication connection(s) (170) enable communication over a communication medium to another computing entity. The communication medium conveys information such as computer-executable instructions, point cloud data input or encoded point could data output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-readable media. Computer-readable media are any available tangible media that can be accessed within a computing environment. By way of example, and not limitation, with the computer system (100), computer-readable media include memory (120, 125), storage (140), and combinations thereof. Thus, the computer-readable media can be, for example, volatile memory, non-volatile memory, optical media, or magnetic media. As used herein, the term computer-readable media does not include transitory signals or propagating carrier waves.

The innovations can be described in the general context of computer-executable instructions, such as those included in program modules, being executed in a computer system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computer system.

The terms "system" and "device" are used interchangeably herein. Unless the context clearly indicates otherwise, neither term implies any limitation on a type of computer system or computing device. In general, a computer system or computing device can be local or distributed, and can include any combination of special-purpose hardware and/or general-purpose hardware with software implementing the functionality described herein.

The disclosed methods can also be implemented using specialized computing hardware configured to perform any of the disclosed methods. For example, the disclosed methods can be implemented by an integrated circuit (e.g., an ASIC such as an ASIC digital signal processor ("DSP"), a graphics processing unit ("GPU"), or a programmable logic device ("PLD") such as a field programmable gate array ("FPGA")) specially designed or configured to implement any of the disclosed methods.

For the sake of presentation, the detailed description uses terms like "select" and "determine" to describe computer operations in a computer system. These terms are high-level abstractions for operations performed by a computer, and should not be confused with acts performed by a human being. The actual computer operations corresponding to these terms vary depending on implementation.

II. Example Network Environments.

Figure 2A:
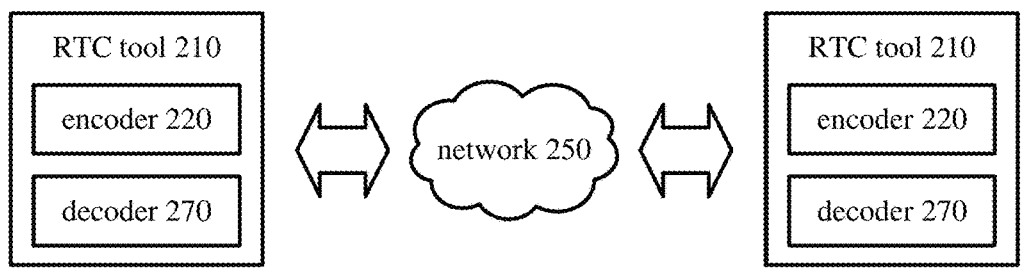
FIGS. 2a and 2b are diagrams illustrating example network environments in which some described embodiments can be implemented.
Figure 2B:
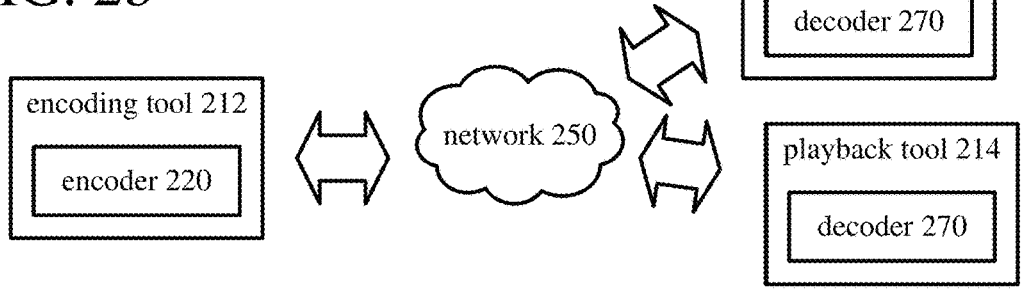

FIGS. 2a and 2b show example network environments (201, 202) that include encoders (220) and decoders (270). The encoders (220) and decoders (270) are connected over a network (250) using an appropriate communication protocol. The network (250) can include the Internet or another computer network.

In the network environment (201) shown in FIG. 2a, each real-time communication ("RTC") tool (210) includes both an encoder (220) and a decoder (270) for bidirectional communication. A given encoder (220) can receive point cloud data and produce, as output, encoded data compliant with a particular format, with a corresponding decoder (270) accepting encoded data from the encoder (220) and decoding it to reconstruct the point cloud data. The bidirectional communication can be part of a conference or other two-party or multi-party communication scenario. Although the network environment (201) in FIG. 2a includes two real-time communication tools (210), the network environment (201) can instead include three or more real-time communication tools (210) that participate in multi-party communication.

Figure 3A:
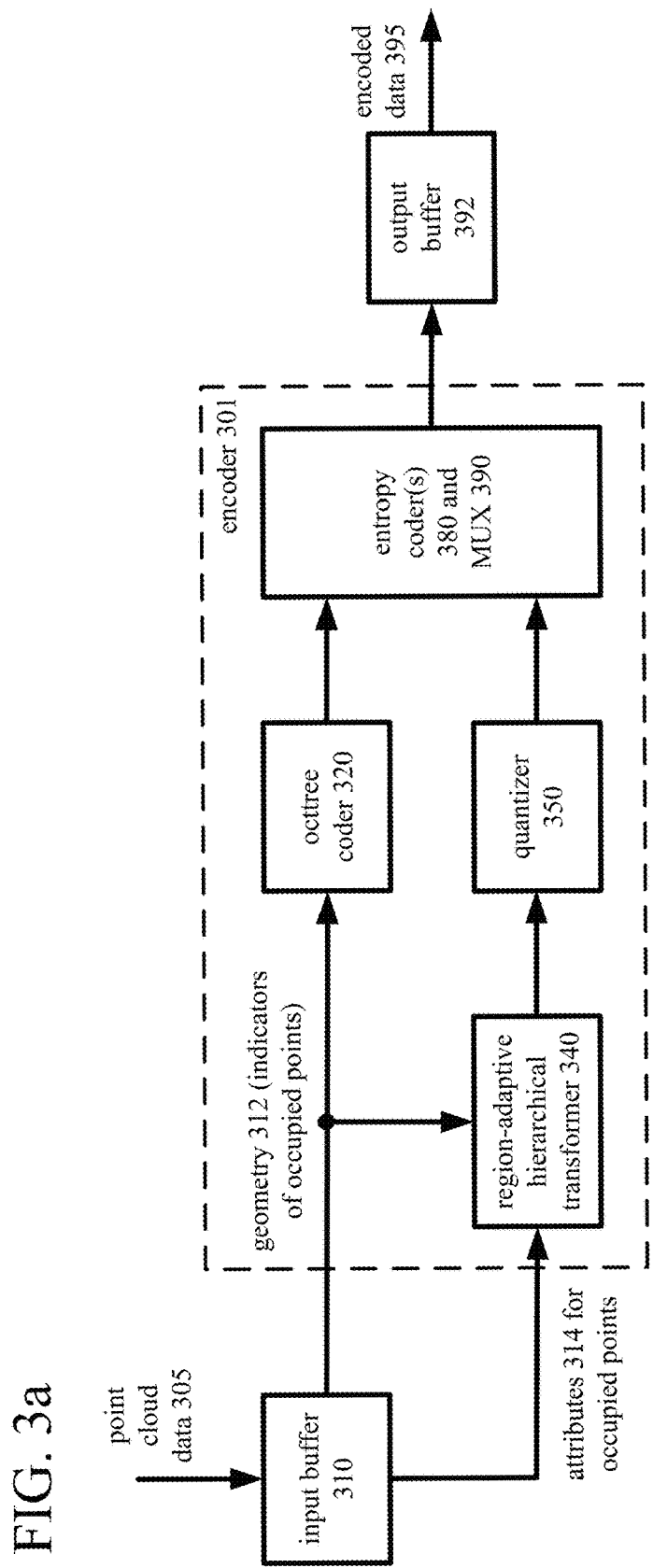
FIGS. 3a and 3b are diagrams illustrating example encoders in conjunction with which some described embodiments can be implemented.
Figure 3B:
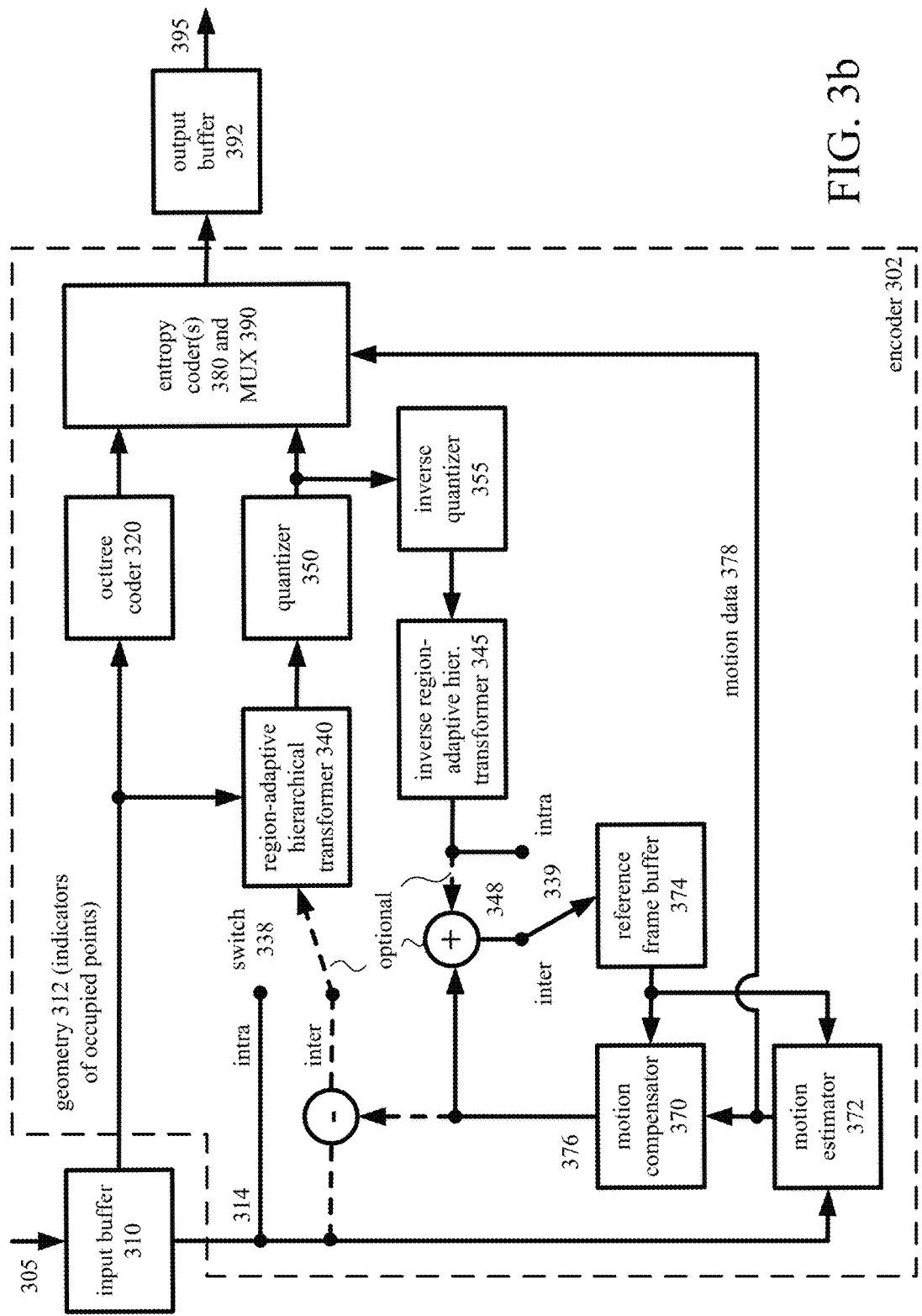
Figure 4A:
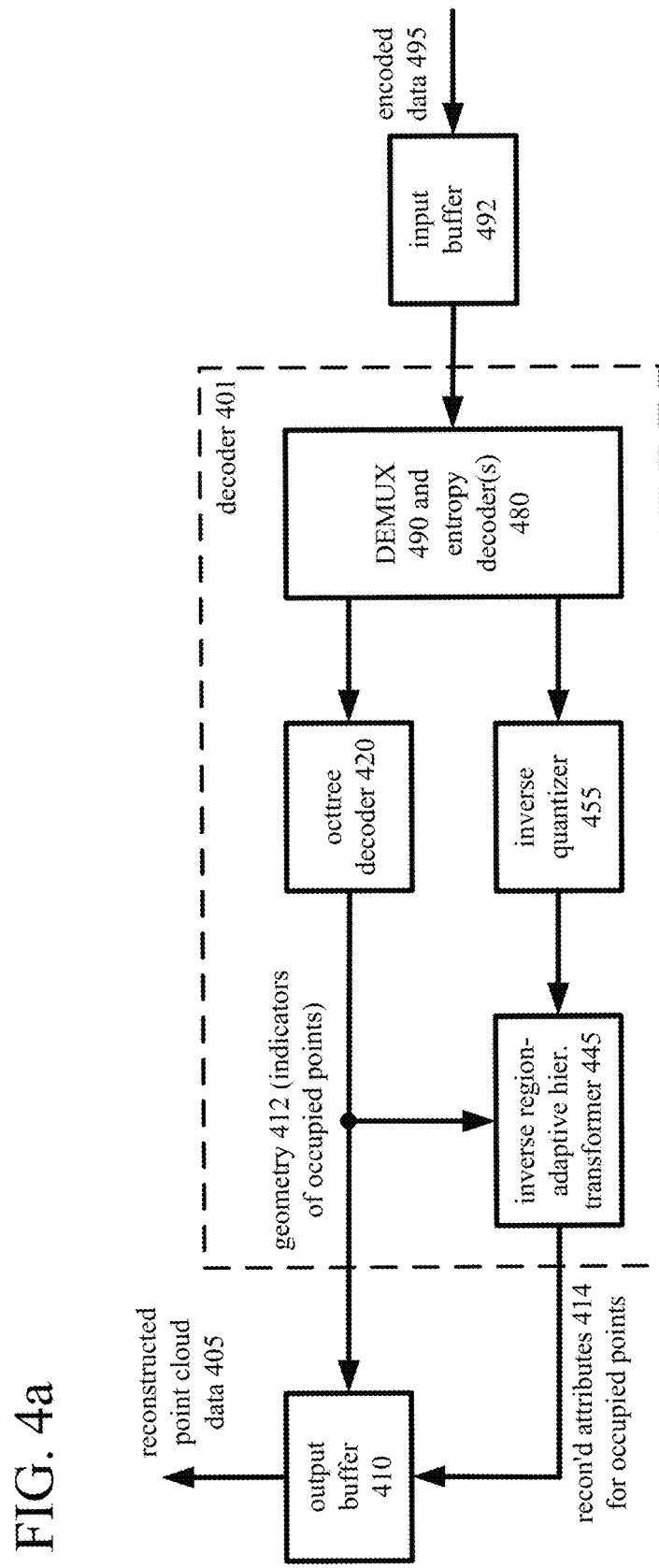
FIGS. 4a and 4b are diagrams illustrating example decoders in conjunction with which some described embodiments can be implemented
Figure 4B:
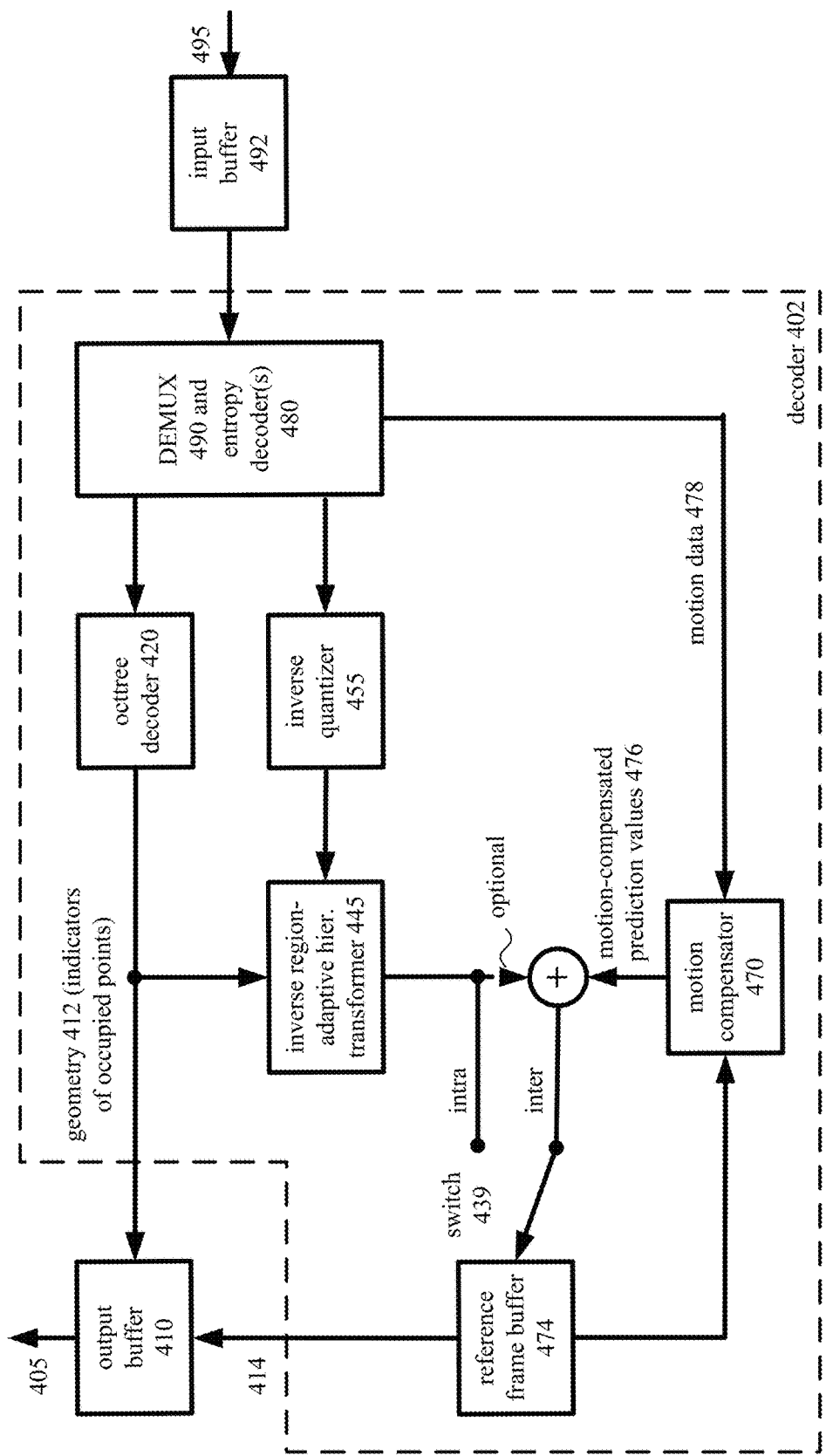

A real-time communication tool (210) manages encoding by an encoder (220). FIGS. 3a and 3b show example encoders (301, 302) that can be included in the real-time communication tool (210). Alternatively, the real-time communication tool (210) uses another encoder. A real-time communication tool (210) also manages decoding by a decoder (270). FIGS. 4a and 4b show example decoders (401, 402) that can be included in the real-time communication tool (210). Alternatively, the real-time communication tool (210) uses another decoder. A real-time communication tool (210) can also include one or more encoders and one or more decoders for other media (e.g., audio).

A real-time communication tool (210) can also include one or more capture components (not shown) that construct point cloud data based in input video received from capture devices (e.g., depth cameras). For example, the capture component(s) generate a series of frames of point cloud data for one or more objects depicted in the input video. For a given point cloud frame, the capture component(s) process multiple video images from different perspectives of the objects (e.g., 8 video images from different perspectives surrounding the objects) to generate a point cloud in 3D space. For typical frame rates of video capture (such as 15 or 30 frames per second), frames of point cloud data can be generated in real time and provided to the encoder (220).

A real-time communication tool (210) can also include one or more rendering components (not shown) that render views of reconstructed point cloud data. For example, the rendering component(s) generate a view of reconstructed point cloud data, from a perspective in the 3D space, for rendering in special glasses or another rendering apparatus. Views of reconstructed point cloud data can be generated in real time as the perspective changes and as new point cloud data is reconstructed.

In the network environment (202) shown in FIG. 2b, an encoding tool (212) includes an encoder (220) that receives point cloud data and encodes it for delivery to multiple playback tools (214), which include decoders (270). The unidirectional communication can be provided for a surveillance system or monitoring system, remote conferencing presentation or sharing, gaming, or other scenario in which point cloud data is encoded and sent from one location to one or more other locations. Although the network environment (202) in FIG. 2b includes two playback tools (214), the network environment (202) can include more or fewer playback tools (214). In general, a playback tool (214) communicates with the encoding tool (212) to determine a stream of point cloud data for the playback tool (214) to receive. The playback tool (214) receives the stream, buffers the received encoded data for an appropriate period, and begins decoding and playback.

FIGS. 3a and 3b show example encoders (301, 302) that can be included in the encoding tool (212). Alternatively, the encoding tool (212) uses another encoder. The encoding tool (212) can also include server-side controller logic for managing connections with one or more playback tools (214). An encoding tool (212) can also include one or more encoders for other media (e.g., audio) and/or capture components (not shown). A playback tool (214) can include client-side controller logic for managing connections with the encoding tool (212). FIGS. 4a and 4b show example decoders (401, 402) that can be included in the playback tool (214). Alternatively, the playback tool (214) uses another decoder. A playback tool (214) can also include one or more decoders for other media (e.g., audio) and/or rendering components (not shown).

III. Example Encoders.

FIGS. 3a and 3b show example encoders (301, 302) in conjunction with which some described embodiments may be implemented. The encoder (301) of FIG. 3a is used for intra-frame compression of a single point cloud frame, which exploits spatial redundancy in point cloud data. The encoder (301) of FIG. 3a can be used iteratively to compress individual frames of point cloud data in a time series. Or, the encoder (302) of FIG. 3b can be used for inter-frame compression of a time series of point cloud frames, which also exploits temporal redundancy between the point cloud frames in the time series.

Each of the encoders (301, 302) can be part of a general-purpose encoding tool capable of operating in any of multiple encoding modes such as a low-latency encoding mode for real-time communication and a higher-latency encoding mode for producing media for playback from a file or stream, or it can be a special-purpose encoding tool adapted for one such encoding mode. Each of the encoders (301, 302) can be implemented as part of an operating system module, as part of an application library, as part of a standalone application, or using special-purpose hardware.

The input buffer (310) is memory configured to receive and store point cloud data (305). The input buffer (310) receives point cloud data (305) from a source. The source can be one or more capture components that receive input video from a set of cameras (e.g., depth cameras) or other digital video source. The source produces a sequence of frames of point cloud data at a rate of, for example, 30 frames per second. As used herein, the term "frame of point cloud data" or "point cloud frame" generally refers to source, coded or reconstructed point cloud data at a given instance of time. A point cloud frame can depict an entire model of objects in a 3D space at a given instance of time. Or, a point cloud frame can depict a single object or region of interest in the 3D space at a given instance of time.

In the input buffer (310), the point cloud data (305) includes geometry data (312) for points as well as attributes (314) of occupied points. The geometry data (312) includes indicators of which of the points of the point cloud data (305) are occupied (that is, have at least one attribute). For example, for each of the points of the point cloud data (305), a flag value indicates whether or not the point is occupied. An occupied point has one or more attributes (314) in the point cloud data (305). (Alternatively, a point of the point cloud can be implicitly flagged as occupied simply by virtue of being included in a list of occupied points, which is encoded and transmitted.) The attributes (314) associated with occupied points depend on implementation (e.g., data produced by capture components, data processed by rendering components). For example, the attribute(s) for an occupied point can include: (1) one or more sample values each defining, at least in part, a color associated with the occupied point (e.g., YUV sample values, RGB sample values, or sample values in some other color space); (2) an opacity value defining, at least in part, an opacity associated with the occupied point; (3) a specularity value defining, at least in part, a specularity coefficient associated with the occupied point; (4) one or more surface normal values defining, at least in part, direction of a flat surface associated with the occupied point; (5) a light field defining, at least in part, a set of light rays passing through or reflected from the occupied point; and/or (6) a motion vector defining, at least in part, motion associated with the occupied point. Alternatively, attribute(s) for an occupied point include other and/or additional types of information. During later stages of encoding with the encoder (302) of FIG. 3b, the transformed value(s) for an occupied point can also include: (7) one or more sample values each defining, at least in part, a residual associated with the occupied point.

An arriving point cloud frame is stored in the input buffer (310). The input buffer (310) can include multiple frame storage areas. After one or more of the frames have been stored in input buffer (310), a selector (not shown) selects an individual point cloud frame to encode as the current point cloud frame. The order in which frames are selected by the selector for input to the encoder (301, 302) may differ from the order in which the frames are produced by the capture components, e.g., the encoding of some frames may be delayed in order, so as to allow some later frames to be encoded first and to thus facilitate temporally backward prediction. Before the encoder (301, 302), the system can include a pre-processor (not shown) that performs pre-processing (e.g., filtering) of the current point cloud frame before encoding. The pre-processing can include color space conversion into primary (e.g., luma) and secondary (e.g., chroma differences toward red and toward blue) components, resampling, and/or other filtering.

In general, a volumetric element, or voxel, is a set of one or more collocated attributes for a location in 3D space. For purposes of encoding, attributes can be grouped on a voxel-by-voxel basis. Or, to simplify implementation, attributes can be grouped for encoding on an attribute-by-attribute basis (e.g., encoding a first component plane for luma (Y) sample values for points of the frame, then encoding a second component plane for first chroma (U) sample values for points of the frame, then encoding a third component plane for second chroma (V) sample values for points of the frame, and so on). Typically, the geometry data (312) is the same for all attributes of a point cloud frame—each occupied point has values for the same set of attributes. Alternatively, however, different occupied points can have different sets of attributes.

The encoder (301, 302) can include a tiling module (not shown) that partitions a point cloud frame into tiles of the same size or different sizes. For example, the tiling module splits the frame along tile rows, tile columns, etc. that, with frame boundaries, define boundaries of tiles within the frame, where each tile is a rectangular prism region. Tiles can be used to provide options for parallel processing or spatial random access. The content of a frame or tile can be further partitioned into blocks or other sets of points for purposes of encoding and decoding. In general, a "block" of point cloud data is a set of points in an x×y×z rectangular prism. Points of the block may be occupied or not occupied. When attributes are organized in an attribute-by-attribute manner, the values of one attribute for occupied points of a block can be grouped together for processing.

The encoder (301, 302) also includes a general encoding control (not shown), which receives the current point cloud frame as well as feedback from various modules of the encoder (301, 302). Overall, the general encoding control provides control signals to other modules (such as the intra/inter switch (338), tiling module, transformer (340), inverse transformer (345), quantizer (350), inverse quantizer (355), motion estimator (372), and entropy coder(s) (380)) to set and change coding parameters during encoding. The general encoding control can evaluate intermediate results during encoding, typically considering bit rate costs and/or distortion costs for different options. In particular, in the encoder (302) of FIG. 3b, the general encoding control decides whether to use intra-frame compression or inter-frame compression for attributes of occupied points in blocks of the current point cloud frame. The general encoding control produces general control data that indicates decisions made during encoding, so that a corresponding decoder can make consistent decisions. The general control data is provided to the multiplexer (390).

With reference to FIG. 3a, the encoder (301) receives point cloud data (305) from the input buffer (310) and produces encoded data (395) using intra-frame compression, for output to the output buffer (392). The encoder (301) includes an octtree coder (320), a region-adaptive hierarchical transformer (340), a quantizer (350), one or more entropy coders (380), and a multiplexer (390).

As part of receiving the encoded data (305), the encoder (301) receives the geometry data (312), which is passed to the octtree coder (320) and region-adaptive hierarchical transformer (340). The octtree coder (320) compresses the geometry data (312). For example, the octtree coder (320) applies lossless compression to the geometry data (312) as described in section V.C. Alternatively, the octtree coder (320) compresses the geometry data (312) in some other way (e.g., lossy compression, in which case a reconstructed version of the geometry data (312) is passed to the region-adaptive hierarchical transformer (340) instead of the original geometry data (312)). The octtree coder (320) passes the compressed geometry data to the multiplexer (390), which formats the compressed geometry data to be part of the encoded data (395) for output.

As part of receiving the encoded data (305), the encoder (301) also receives the attributes (314), which are passed to the region-adaptive hierarchical transformer (340). The region-adaptive hierarchical transformer (340) uses the received geometry data (312) when deciding how to apply a RAHT to attributes (314). For example, the region-adaptive hierarchical transformer (340) applies a RAHT to the attributes (314) of occupied points as described in section V.D. Alternatively, the region-adaptive hierarchical transformer (340) applies a RAHT that is region-adaptive (processing attributes for occupied points) and hierarchical (passing coefficients from one level to another level for additional processing) in some other way. The region-adaptive hierarchical transformer (340) passes the transform coefficients resulting from the RAHT to the quantizer (350).

The quantizer (350) quantizes the transform coefficients. For example, the quantizer (350) applies uniform scalar quantization to the transform coefficients as described in section V.E. Alternatively, the quantizer (350) applies quantization in some other way. The quantizer (350) can change the quantization step size on a frame-by-frame basis. Alternatively, the quantizer (350) can change the quantization step size on a tile-by-tile basis, block-by-block basis, or other basis. The quantization step size can depend on a quantization parameter ("QP"), whose value is set for a frame, tile, block, and/or other portion of point cloud data. The quantizer (350) passes the quantized transform coefficients to the one or more entropy coders (380).

The entropy coder(s) (380) entropy code the quantized transform coefficients. When entropy coding the quantized transform coefficients, the entropy coder(s) (380) can use arithmetic coding, run-length Golomb-Rice coding, or some other type of entropy coding (e.g., Exponential-Golomb coding, variable length coding, dictionary coding). In particular, the entropy coder(s) (380) can apply one of the variations of adaptive entropy coding described in section V.E. Alternatively, the entropy coder(s) (380) apply some other form of adaptive or non-adaptive entropy coding to the quantized transform coefficients. The entropy coder(s) (380) can also encode general control data, QP values, and other side information (e.g., mode decisions, parameter choices). For the encoder (302) of FIG. 3b, the entropy coder(s) (380) can encode motion data (378). The entropy coder(s) (380) can use different coding techniques for different kinds of information, and they can apply multiple techniques in combination. The entropy coder(s) (380) pass the results of the entropy coding to the multiplexer (390), which formats the coded transform coefficients and other data to be part of the encoded data (395) for output. When the entropy coder(s) (380) use parameters to adapt entropy coding (e.g., estimates of distribution of quantized transform coefficients for buckets, as described in section V.E), the entropy coder(s) (380) also code the parameters and pass them to the multiplexer (390), which formats the coded parameters to be part of the encoded data (395).

With reference to FIG. 3b, the encoder (302) further includes an inverse quantizer (355), inverse region-adaptive hierarchical transformer (345), motion compensator (370), motion estimator (372), reference frame buffer (374), and intra/inter switch (338). The octtree coder (320) operates as in the encoder (301) of FIG. 3a. The region-adaptive hierarchical transformer (340), quantizer (350), and entropy coder(s) (380) of the encoder (302) of FIG. 3b essentially operate as in the encoder (301) of FIG. 3a, but may process residual values for any of the attributes of occupied points.

When a block of the current point cloud frame is compressed using inter-frame compression, the motion estimator (372) estimates the motion of attributes of the block with respect to one or more reference frames of point cloud data. The current point cloud frame can be entirely or partially coded using inter-frame compression. The reference frame buffer (374) buffers one or more reconstructed previously coded/decoded point cloud frames for use as reference frames. When multiple reference frames are used, the multiple reference frames can be from different temporal directions or the same temporal direction. As part of the general control data, the encoder (302) can include information that indicates how to update the reference frame buffer (374), e.g., removing a reconstructed point cloud frame, adding a newly reconstructed point cloud frame.

The motion estimator (372) produces motion data (378) as side information. The motion data (378) can include motion vector ("MV") data and reference frame selection data. The motion data (378) is provided to one of the entropy coder(s) (380) or the multiplexer (390) as well as the motion compensator (370). The motion compensator (370) applies MV(s) for a block to the reconstructed reference frame(s) from the reference frame buffer (374). For the block, the motion compensator (370) produces a motion-compensated prediction, which is a region of attributes in the reference frame(s) that are used to generate motion-compensated prediction values (376) for the block.

As shown in FIG. 3b, the intra/inter switch (338) selects whether a given block is compressed using intra-frame compression or inter-frame compression. Intra/inter switch (338) decisions for blocks of the current point cloud frame can be made using various criteria.

When inter-frame compression is used for a block, the encoder (302) can determine whether or not to encode and transmit the differences (if any) between prediction values (376) and corresponding original attributes (314). The differences (if any) between the prediction values (376) and corresponding original attributes (314) provide values of the prediction residual. If encoded/transmitted, the values of the prediction residual are encoded using the region-adaptive hierarchical transformer (340), quantizer (350), and entropy coder(s) (380), as described above, with reference to FIG. 3a. (In practice, calculating the differences between the prediction values (376) and corresponding original attributes (314) may be difficult because the number of points in the prediction block and original block may not be the same. In this case, since simple arithmetic differencing is not possible on a point-by-point basis, the original attributes cannot simply be subtracted from corresponding prediction values. To address this problem, for a prediction value that does not have a corresponding original attribute, the encoder can estimate (e.g., by interpolation or extrapolation using original attributes) the missing attribute, and calculate the prediction residual as the difference between the prediction value and estimated attribute. Or, to avoid this problem, the prediction residual values are not encoded at all. In this case, paths and components of the encoder (302) used to determine the prediction residual values and add reconstructed residual values to prediction values (376) can be omitted. Such paths and components, including the differencing module, switch (338), and addition module, are shown as optional in FIG. 3b.)

In the encoder (302) of FIG. 3b, a decoding process emulator implements some of the functionality of a decoder. The decoding process emulator determines whether a given frame needs to be reconstructed and stored for use as a reference frame for inter-frame compression of subsequent frames. For reconstruction, the inverse quantizer (355) performs inverse quantization on the quantized transform coefficients, inverting whatever quantization was applied by the quantizer (350). The inverse region-adaptive hierarchical transformer (345) performs an inverse RAHT, inverting whatever RAHT was applied by the region-adaptive hierarchical transformer (340), and thereby producing blocks of reconstructed residual values (if inter-frame compression was used) or reconstructed attributes (if intra-frame compression was used). When inter-frame compression has been used (inter path at switch (339)), reconstructed residual values, if any, are combined with the prediction values (376) to produce a reconstruction (348) of the attributes of occupied points for the current point cloud frame. (If the encoder (302) does not encode prediction residual values, for reasons explained above, the prediction values (376) can be directly used as the reconstructed attributes (348), bypassing the addition component.) When intra-frame compression has been used (intra path at switch (339)), the encoder (302) uses the reconstructed attributes (348) produced by the inverse region-adaptive hierarchical transformer (345). The reference frame buffer (374) stores the reconstructed attributes (348) for use in motion-compensated prediction of attributes of subsequent frames. The reconstructed attributes (348) can be further filtered. A filtering control (not shown) can determine how to perform filtering on reconstructed attributes (348), and one or more filters (not shown) can perform the filtering. The filtering control can produce filter control data, which is provided to the entropy coder(s) (380) and multiplexer (390).

The output buffer (392) is memory configured to receive and store the encoded data (395). The encoded data (395) that is aggregated in the output buffer (390) can also include metadata relating to the encoded data. The encoded data can be further processed by a channel encoder (not shown), which can implement one or more media system multiplexing protocols or transport protocols. The channel encoder provides output to a channel (not shown), which represents storage, a communications connection, or another channel for the output.

Depending on implementation and the type of compression desired, modules of the encoders (301, 302) can be added, omitted, split into multiple modules, combined with other modules, and/or replaced with like modules. In alternative embodiments, encoders with different modules and/or other configurations of modules perform one or more of the described techniques. Specific embodiments of encoders typically use a variation or supplemented version of one of the encoders (301, 302). The relationships shown between modules within the encoders (301, 302) indicate general flows of information in the respective encoders (301, 302); other relationships are not shown for the sake of simplicity. In general, a given module of the encoders (301, 302) can be implemented by software executable on a CPU, by software controlling special-purpose hardware (e.g., graphics hardware for video acceleration), or by special-purpose hardware (e.g., in an ASIC).

IV. Example Decoders.

FIGS. 4a and 4b show example decoders (401, 402) in conjunction with which some described embodiments may be implemented. The decoder (401) of FIG. 4a is used for intra-frame decompression of a single point cloud frame, and it can be used iteratively to decompress individual frames of point cloud data in a time series. Or, the decoder (402) of FIG. 4b can be used for inter-frame decompression of a time series of point cloud frames.

Each of the decoders (401, 402) can be a general-purpose decoding tool capable of operating in any of multiple decoding modes such as a low-latency decoding mode for real-time communication and a higher-latency decoding mode for media playback from a file or stream, or it can be a special-purpose decoding tool adapted for one such decoding mode. Each of the decoders (401, 402) can be implemented as part of an operating system module, as part of an application library, as part of a standalone application or using special-purpose hardware.

The input buffer (492) is memory configured to receive and store encoded data (495). The input buffer (492) receives the encoded data (495) from a channel, which can represent storage, a communications connection, or another channel for encoded data as input. The channel produces encoded data (495) that has been channel coded. A channel decoder (not shown), implementing one or more media system demultiplexing protocols or transport protocols, can process the channel coded data. The encoded data (495) that is output from the channel decoder is stored in the input buffer (492) until a sufficient quantity of such data has been received. The encoded data (495) that is aggregated in the input buffer (492) can include metadata relating to the encoded data. In general, the input buffer (492) temporarily stores encoded data (495) until such encoded data (495) is used by the decoder (401, 402). At that point, encoded data for a coded point cloud frame is transferred from the input buffer (492) to the decoder (401, 402). As decoding continues, new encoded data (495) is added to the input buffer (492) and the oldest encoded data (495) remaining in the input buffer (492) is transferred to the decoder (401, 402).

In the input buffer (492), the encoded data (495) includes encoded data for geometry data (412) as well as encoded data for attributes (414) of occupied points. The geometry data (412) includes indicators of which of the points of the reconstructed point cloud data (405) are occupied (that is, have at least one attribute). For example, for each of the points, a flag value indicates whether or not the point is occupied. An occupied point has one or more attributes (414) in the reconstructed point cloud data (405). The attributes (414) associated with occupied points depend on implementation (e.g., data produced by capture components, data processed by rendering components). For example, the attribute(s) for an occupied point can include: (1) one or more sample values each defining, at least in part, a color associated with the occupied point (e.g., YUV sample values, RGB sample values, or sample values in some other color space); (2) an opacity value defining, at least in part, an opacity associated with the occupied point; (3) a specularity value defining, at least in part, a specularity coefficient associated with the occupied point; (4) one or more surface normal values defining, at least in part, direction of a flat surface associated with the occupied point; (5) a light field defining, at least in part, a set of light rays passing through or reflected from the occupied point; and/or (6) a motion vector defining, at least in part, motion associated with the occupied point. Alternatively, attribute(s) for an occupied point include other and/or additional types of information. For decoding with the decoder (402) of FIG. 4b, the transform value(s) for an occupied point can also include: (7) one or more sample values each defining, at least in part, a residual associated with the occupied point.

For purposes of decoding, attributes can be grouped on a voxel-by-voxel basis. Or, to simplify implementation, attributes can be grouped for decoding on an attribute-by-attribute basis (e.g., decoding a first component plane for luma (Y) sample values for points of the frame, then decoding a second component plane for first chroma (U) sample values for points of the frame, then decoding a third component plane for second chroma (V) sample values for points of the frame, and so on). Typically, the geometry data (412) is the same for all attributes of a point cloud frame—each occupied point has values for the same set of attributes. Alternatively, however, different occupied points can have different sets of attributes.

With reference to FIG. 4a, the decoder (401) receives encoded data (495) from the input buffer (492) and produces reconstructed point cloud data (405) using intra-frame decompression, for output to the output buffer (410). The decoder (401) includes an octtree decoder (420), an inverse region-adaptive hierarchical transformer (445), an inverse quantizer (455), one or more entropy coders (480), and a demultiplexer (490). For purposes of decoding, a point cloud frame can be organized into multiple tiles of the same size or different sizes. The content of a point cloud frame or tile can be further organized as blocks or other sets of sample values.

The demultiplexer (490) receives encoded data (495) and parses elements of the encoded data (495) from a bitstream. The demultiplexer (490) makes the received encoded data (495) available to one or more entropy decoders (480) and/or other modules of the decoder (401).

The entropy decoder(s) (480) entropy decode the quantized transform coefficients. When entropy decoding the quantized transform coefficients, the entropy decoder(s) (480) can use arithmetic decoding, run-length Golomb-Rice decoding, or some other type of entropy decoding (e.g., Exponential-Golomb decoding, variable length decoding, dictionary decoding). In particular, the entropy decoder(s) (480) can apply one of the variations of adaptive entropy decoding described in section V.E. Alternatively, the entropy decoder(s) (480) apply some other form of adaptive or non-adaptive entropy decoding to the quantized transform coefficients. The entropy decoder(s) (480) can also decode general control data, QP values, and other side information (e.g., mode decisions, parameter choices). The entropy decoder(s) (480) can use different decoding techniques for different kinds of information, and they can apply multiple techniques in combination. When the entropy decoder(s) (480) use parameters to adapt entropy decoding (e.g., estimates of distribution of quantized transform coefficients for buckets, as described in section V.E), the entropy decoder(s) (480) also decode the parameters before decoding the quantized transform coefficients.

The decoder (401) includes a general decoding control (not shown), which receives general control data from the demultiplexer (490) and/or entropy decoder(s) (480). The general decoding control provides control signals (not shown) to other modules (such as the inverse quantizer (455), inverse region-adaptive hierarchical transformer (445), and entropy decoder(s) (480)) to set and change decoding parameters during decoding.

The octtree decoder (420) receives compressed geometry data from the demultiplexer (490) or entropy decoder(s) (480) and decompresses the geometry data (412). The octtree decoder (420) passes the geometry data (412) to the output buffer (410) and to the inverse region-adaptive hierarchical transformer (445). For example, the octtree decoder (420) applies lossless decompression to the compressed geometry data as described in section V.C. Alternatively, the octtree decoder (420) decompresses the geometry data (412) in some other way (e.g., lossy decompression, in which case a lossy-reconstructed version of the geometry data (412) is passed to the inverse region-adaptive hierarchical transformer (445)).

The inverse quantizer (455) receives quantized transform coefficients from the entropy decoders (480) and inverse quantizes the transform coefficients. For example, the inverse quantizer (455) inverts uniform scalar quantization previously applied to the transform coefficients as described in section V.E. Alternatively, the inverse quantizer (455) performs inverse quantization in some other way. Based on QPs that it receives, the inverse quantizer (455) can change the quantization step size on a frame-by-frame basis. Alternatively, the inverse quantizer (455) can change the quantization step size on a tile-by-tile basis, block-by-block basis, or other basis. The inverse quantizer (455) passes the transform coefficients to the inverse region-adaptive hierarchical transformer (445).

With the geometry data (412) received from the octtree decoder (420) and the transform coefficients received from the inverse quantizer (445), the inverse region-adaptive hierarchical transformer (445) applies an inverse RAHT to the transform coefficients to reconstruct attributes (414) of occupied points. The inverse region-adaptive hierarchical transformer (445) uses the received geometry data (412) when deciding how to apply the inverse RAHT to reconstruct attributes (414). For example, the inverse region-adaptive hierarchical transformer (445) applies an inverse RAHT to reconstruct attributes (414) of occupied points as described in section V.D. Alternatively, the inverse region-adaptive hierarchical transformer (445) applies an inverse RAHT that is region-adaptive (processing attributes for occupied points) and hierarchical (passing attributes from one level to another level for additional processing) in some other way. In FIG. 4a, the inverse region-adaptive hierarchical transformer (445) passes the reconstructed attributes (414) resulting from the inverse RAHT to the output buffer (410).

With reference to the decoder (402) of FIG. 4b, the octtree decoder (420) operates as in the decoder (401) of FIG. 4a. The inverse region-adaptive hierarchical transformer (445), inverse quantizer (455), and entropy decoder(s) (480) of the decoder (402) of FIG. 4b essentially operate as in the decoder (401) of FIG. 4a, but may process residual values for any of the attributes of occupied points. Also, for the decoder (402) of FIG. 4b, the entropy decoder(s) (480) can decode motion data (478). The decoder (402) of FIG. 4b further includes an intra/inter switch (439), a motion compensator (470), and a reference frame buffer (474). In addition to other control functions, a general decoding control provides control signals to the intra/inter switch (439), motion compensator (470), and reference frame buffer (474)) to set and change decoding parameters during decoding.

The decoder (402) of FIG. 4b determines whether a given point cloud frame needs to be stored for use as a reference frame for inter-frame decompression of subsequent frames. The reference frame buffer (474) buffers one or more reconstructed previously decoded point cloud frames for use as reference frames. When multiple reference frames are used, the multiple reference frames can be from different temporal directions or the same temporal direction. As part of the general control data, the decoder (402) can receive information that indicates how to update the reference frame buffer (474), e.g., removing a reconstructed point cloud frame, adding a newly reconstructed point cloud frame.

As shown in FIG. 4b, the intra/inter switch (439) selects whether a given block is decompressed using intra-frame decompression or inter-frame decompression. Intra/inter switch (439) decisions for blocks of the current point cloud frame can be indicated as part of the general control data. The current point cloud frame can be entirely or partially decoded using inter-frame decompression. The inverse region-adaptive hierarchical transformer (445) can produce blocks of reconstructed residual values (if inter-frame decompression is used) or reconstructed attributes (if intra-frame decompression is used). When inter-frame decompression is used (inter path at switch (439)), reconstructed residual values, if any, are combined with the prediction values (476) to produce a reconstruction of the attributes of occupied points for the current point cloud frame. (If the encoder (302) does not encode prediction residual values, for reasons explained above, then the decoder (402) does not decode any prediction residual values. In this case, the prediction values (476) can be directly used as the reconstructed attributes, bypassing the addition component. The path to the addition component, and the addition component, are shown as optional in FIG. 4b.) When intra-frame compression is used (intra path at switch (439)), the decoder (402) uses the reconstructed attributes produced by the inverse region-adaptive hierarchical transformer (445). The reference frame buffer (474) stores the reconstructed attributes for use in motion-compensated prediction of attributes of subsequent frames. The reconstructed attributes can be further filtered. One or more filters (not shown) can perform the filtering based on filter control data, which is provided by the entropy decoder(s) (480) or demultiplexer (490).

The motion compensator (470) receives motion data (478) from the entropy decoder(s) (480) or demultiplexer (490). The motion data (478) can include MV data and reference frame selection data. The motion compensator (470) applies MV(s) for a block to the reconstructed reference frame(s) from the reference frame buffer (474). For the block, the motion compensator (470) produces a motion-compensated prediction, which is a region of attributes in the reference frame(s) that are used to generate motion-compensated prediction values (476) for the block.

The output buffer (410) is memory configured to receive and store reconstructed point cloud data (405). For the reconstructed point cloud data (405), the decoder (401, 402) outputs geometry data (412) and reconstructed attributes (414) for occupied points to the output buffer (410). The output buffer (410) provides the reconstructed point cloud data (405) to a sink, e.g., one or more rendering components that generate one or more views of the reconstructed point cloud data (405). The output buffer (410) can include multiple frame storage areas. An output sequencer (not shown) can identify when the next point cloud frame to be produced in output order is available in the output buffer (410). When the next point cloud frame to be produced in output order is available in the output buffer (410), it is read by the output sequencer and output to the sink. In general, the order in which point cloud frames are output from the output buffer (410) may differ from the order in which the point cloud frames are decoded by the decoder (401, 402) (bitstream order).

Also, after the decoder (401, 402), the system can include a post-processor (not shown) that performs post-processing (e.g., filtering) of the current point cloud frame after decoding. The post-processing can include color space conversion from primary (e.g., luma) and secondary (e.g., chroma) components to another color space (e.g., RGB), resampling, and/or other filtering. Thus, the decoder (401, 402) can include a post-processing filter. Whereas "in-loop" filtering is performed on reconstructed attributes in a motion compensation loop, and hence affects attributes of reference frames, the post-processing filter is applied to reconstructed attributes outside of the motion compensation loop, before output for rendering.

Depending on implementation and the type of decompression desired, modules of the decoders (401, 402) can be added, omitted, split into multiple modules, combined with other modules, and/or replaced with like modules. In alternative embodiments, decoders with different modules and/or other configurations of modules perform one or more of the described techniques. Specific embodiments of decoders typically use a variation or supplemented version of one of the decoders (401, 402). The relationships shown between modules within the decoders (401, 402) indicate general flows of information in the respective decoders (401, 402); other relationships are not shown for the sake of simplicity. In general, a given module of the decoders (401, 402) can be implemented by software executable on a CPU, by software controlling special-purpose hardware (e.g., graphics hardware for video acceleration), or by special-purpose hardware (e.g., in an ASIC).

V. Compression of Point Cloud Data with a RAHT and/or Adaptive Entropy Coding, and Corresponding Decompression.

This section describes various innovations in compression and decompression of point cloud data. For example, an encoder uses a region-adaptive hierarchical transform ("RAHT"), which can provide a very compact way to represent the attributes of occupied points in point cloud data, followed by quantization and adaptive entropy coding of the transform coefficients produced by the RAHT. In addition to providing effective compression (in terms of rate-distortion efficiency), approaches described herein are computationally simpler than many previous approaches to compression of point cloud data. A corresponding decoder uses adaptive entropy decoding and inverse quantization, followed by application of an inverse RAHT.

In some example implementations, the RAHT is a hierarchical sub-band transform that resembles an adaptive variation of a Haar wavelet. The RAHT traverses a hierarchical representation of point cloud data (specifically, an octtree), starting from a top level and continuing through successively lower levels, and uses a two-point orthogonal transform. Collectively, the RAHT is non-expansive and orthogonal. Although the RAHT is adaptive, it can easily be computed with simple operations in a GPU or CPU. The transform coefficients produced by the RAHT are quantized and entropy coded (e.g., using arithmetic coding or run-length Golomb-rice ("RLGR") coding). The entropy coding can be adapted according to distribution models (e.g., Laplacian distribution models), whose parameters are specific to bands of the quantized transform coefficients. In this case, the parameters are themselves quantized, encoded, and output along with the rest of the encoded point cloud data. A corresponding decoder decodes the parameters, configures its entropy decoders to decode the transform coefficients, and entropy decodes and inverse quantizes the transform coefficients. Computation for the inverse RAHT is as simple as computation for the forward RAHT, making both excellent candidates for real time transmission of point cloud data. In these example implementations, compression of point cloud data using the RAHT and adaptive entropy coding provides rate-distortion efficiency comparable to (and sometimes outperforming) previous approaches to point cloud compression, while being much more computationally efficient for compression and corresponding decompression.

A. Introduction to Point Cloud Compression and Decompression.

A point cloud represents one or more objects in 3D space as a set of points. A point in the point cloud is associated with a position in 3D space (typically, a position having x, y, and z coordinates). In general, a point cloud has no regular spacing. In example implementations, however, point cloud data is "voxelized" such that points are aligned with positions in a 3D grid that have regular spacing. A point in the point cloud can be visualized as a small sub-block, or voxel, that occupies volume in 3D space, adjacent other sub-blocks (for other points) in the 3D space. Alternatively, a point in the point cloud can be considered an infinitesimally small point, occupying no volume in the 3D space, but connected to other points during rendering operations. For purposes of explaining compression and decompression of point cloud data, the terms "voxel" and "point" are used interchangeably herein.

A point can be occupied or not occupied. If the point is occupied, the point has one or more attributes. Examples of attributes associated with an occupied point include sample values that define a color in a color space (e.g., RGB, YUV), surface normal values defining the direction of a flat surface associated with the occupied point, a motion vector defining motion associated with the occupied point (e.g., for a motion vector field at the occupied point), an opacity value defining an opacity associated with the occupied point, a specularity value defining a specularity coefficient associated with the occupied point, and a light field defining a set of light rays passing through or reflected from the occupied point. Alternatively, an occupied point can have other and/or additional attributes.

In previous approaches to compression/decompression of data for 3D visualization, most approaches use mesh compression/decompression. In many scenarios, such approaches are computationally inefficient, which makes them impractical for real-time applications. Previous approaches to point cloud compression/decompression are also unsuitable for real-time applications. One previous approach to point cloud compression uses an orthogonal graph transform and arithmetic coding of the transform coefficients. Although the graph transform may seem like a natural choice to spatially transform attributes of point cloud data (due to the irregular domain of definition of the attributes), the graph transform requires repeated eigen-decompositions of many graph Laplacians and/or large graph Laplacians, which makes the approach infeasible for real-time processing. Another approach to point cloud compression uses a shape-adaptive transform, but the transform is not orthogonal, which can hurt the quality of compression. Still another approach to point cloud compression involves padding the attributes to a regular domain then using an ordinary block transform, but critical sampling is sacrificed, which again can hurt the quality of compression. In these two approaches, the region of support for the transform of point cloud data can become, in essence, a two-dimensional manifold within 3D space.

In contrast, in example implementations described in this section, compression uses a RAHT that is both region-adaptive and orthogonal on attributes of occupied points of point clouds. The RAHT is also hierarchical, resembling an adaptive variation of a Haar wavelet. The RAHT is coupled with a feedforward approach to entropy coding the quantized transform coefficients. The RAHT compares well, in terms of rate-distortion performance, to previous approaches that use a graph transform. Further, the RAHT is far superior to those previous approaches in terms of computational complexity. In many cases, this enables compression of point cloud data in real time. In some cases, a typical point cloud frame has 300,000-400,000 occupied points in a voxel grid, and point cloud frames are processed at a rate of 30 frames per second, which leaves about 30 ms to process each point cloud frame.

B. Encoding with a RAHT and Decoding with an Inverse RAHT, Generally.

FIG. 5 shows a generalized technique (500) for encoding of point cloud data, including applying a RAHT to attributes of occupied points. An encoder such as the encoder (301) of FIG. 3*a*, encoder (302) of FIG. 3*b*, or other encoder performs the technique (500).

To start, the encoder receives (510) point cloud data including multiple points in 3D space. For example, the point cloud data is a point cloud frame. Each of the points is associated with an indicator of whether the point is occupied. If the point is occupied, the point is also associated with one or more attributes of the occupied point. Examples of attributes are described above.

The encoder encodes (520) the point cloud data, thereby producing encoded data. As part of the encoding (520), the encoder applies a RAHT to attributes of occupied points among the multiple points, which produces transform coefficients. For example, for intra-frame compression, the encoder applies a RAHT to attributes of occupied points among the multiple points, which produces the transform coefficients. Alternatively, for inter-frame compression, the encoder applies a RAHT to prediction residuals for attributes of occupied points among the multiple points, which produces the transform coefficients.

FIG. 6 shows an example (600) of details for the encoding (520) stage during intra-frame compression. (If used during inter-frame compression, the operations shown in FIG. 6 are the same, except the RAHT is applied to prediction residuals instead of attributes.)

The encoder compresses (610) geometry for the point cloud data. The geometry includes indicators of which points of the point cloud data are occupied points. Examples of ways to compress geometry data are described in section V.C. The encoder performs (620) the RAHT on attributes of occupied points. In doing so, the encoder uses the indicators (geometry data) to determine which of the points of the point cloud data are occupied. Examples of RAHT are described in section V.D. The encoder quantizes (630) and codes (640) the transform coefficients produced by the RAHT. The coding (640) includes entropy coding of the transform coefficients (e.g., arithmetic coding, RLGR coding), which may be adaptive or non-adaptive. Section V.E describes examples of quantization and coding of the transform coefficients produced by the RAHT. Alternatively, the encoder performs the encoding (520) in some other way (still applying a RAHT to attributes of occupied points).

Returning to FIG. 5, the encoder stores (530) the encoded data as part of a bitstream for output. The encoder checks (540) whether to continue for the next batch of point cloud data. If so, the encoder receives (510) the next batch of point cloud data. In this way, the encoder can encode point cloud frames on a frame-by-frame basis or encode point cloud data on some other basis.

FIG. 7 shows a generalized technique (700) for decoding of point cloud data, including applying an inverse RAHT to transform coefficients for attributes of occupied points. A decoder such as the decoder (401) of FIG. 4a, decoder (402) of FIG. 4b, or other decoder performs the technique (700).

To start, the decoder receives (710) encoded data as part of a bitstream. The decoder decodes (720) the encoded data to reconstruct point cloud data. The point cloud data includes multiple points in 3D space. Each of the points is associated with an indicator of whether the point is occupied. If the point is occupied, the point is also associated with an attribute of the occupied point. Examples of attributes are described above. As part of the decoding (720), the decoder applies an inverse RAHT to transform coefficients for attributes of occupied points among the multiple points.

FIG. 8 shows an example (800) of details for the decoding (720) stage during intra-frame decompression. (If used during inter-frame decompression, the operations shown in FIG. 8 are the same, except the inverse RAHT is applied to transform coefficients for prediction residuals instead of transform coefficients for attributes.)

The decoder decompresses (810) geometry for the point cloud data, which includes indicators of which points of the point cloud data are occupied. Examples of ways to decompress geometry data are described in section V.C. The decoder decodes (820) quantized transform coefficients. The decoding (820) includes entropy decoding of the quantized transform coefficients (e.g., arithmetic decoding, RLGR decoding), which may be adaptive or non-adaptive. The decoder also inverse quantizes (830) the quantized transform coefficients, which reconstructs the transform coefficients for attributes of occupied points. Section V.E describes examples of decoding and inverse quantization of transform coefficients. The decoder performs (840) the inverse RAHT on the transform coefficients for attributes of occupied points. In doing so, the decoder uses the indicators (geometry data) to determine which of the points of the point cloud data are occupied. Examples of inverse RAHT are described in section V.D. Alternatively, the decoder performs the decoding (720) in some other way (still applying an inverse RAHT to transform coefficients for attributes of occupied points).

Returning to FIG. 7, the decoder stores (730) the reconstructed point cloud data. The decoder checks (740) whether to continue for the next batch of point cloud data. If so, the decoder receives (710) encoded data for the next batch of point cloud data. In this way, the decoder can decode point cloud frames on a frame-by-frame basis or decode point cloud data on some other basis.

C. Examples of Geometry Compression and Decompression.

This section describes examples of compression and decompression of geometry data, which indicates which points of point cloud data are occupied.

In a point cloud that represents a 3D object, a point is associated with a position in 3D space and, potentially, one or more attributes. A point can be occupied or not occupied. If the point has any attributes, the point is occupied. Otherwise (no attributes), the point is not occupied. A non-occupied point is transparent, and its attributes are void. Point cloud data can be represented as a list of points, with each occupied point being described by its geometry (position in 3D space) and attributes. For example, a point v is: $v_1=[x_1, y_1, z_1, att1_1, att2_1, att3_1]$, where $att1_1, att2_1, att3_1$ are three attributes such as sample values defining a color. In practice, the position in 3D space of a point can be implied by geometry data and a scanning pattern, rather than being explicitly specified in encoded data.

In some example implementations, geometry is compressed and decompressed using octtree scanning of points in 3D space. An octtree is a 3D extension of a quadtree, which is a two-dimensional structure. FIG. 9 shows an example (900) of hierarchical organization that may be applied to point cloud data for octtree compression and decompression. The point cloud data is hierarchically organized in levels in 3D space having x, y, and z dimensions. At a given level l, a group of points of the point cloud data can be represented as a W×W×W unit cube for a voxel. At level l+1, the W×W×W unit cube is partitioned into eight smaller sub-cubes for voxels with dimensions W/2×W/2×W/2 by splitting each dimension by half. Similarly, at level l+2, each W/2×W/2×W/2 sub-cube can be partitioned into eight smaller sub-cubes for voxels with dimensions W/4×W/4×W/4. If all W/2×W/2×W/2 sub-cubes are split, there are 64 W/4×W/4×W/4 sub-cubes for voxels. The partitioning process can be repeated for L levels, yielding $2^{3L}$ voxels each having dimensions of $2^{-L}W \times 2^{-L}W \times 2^{-L}W$.

To encode geometry data for a point cloud, one could explicitly signal a binary symbol per voxel at level L, indicating whether the voxel is occupied or not. In typical cases, however, a very small proportion of voxels are occupied. For example, in typical cases, less than 1% of the total number of voxels are occupied.

Octtree compression and decompression use a scanning pattern along voxels of an octtree to exploit the sparseness of occupied points and efficiently represent large unoccupied regions. At the first level of the octtree, the entire space is partitioned into eight sub-cubes. For each of the eight sub-cubes, the sub-cube is marked as "occupied" if any of the occupied voxels (points) of the point cloud data belong to the sub-cube. If the sub-cube includes no occupied voxels (points), the sub-cube is marked as "not occupied." The binary symbols for the first level of the octtree use 8 bits, providing an indicator for each of the eight sub-cubes at the first level. At the next level of the octtree, only the sub-cubes marked as occupied at the first level are subject to further splitting. The scanning process continues for L levels, only partitioning sub-cubes which are occupied. This results in large unoccupied areas being represented by tree leaves (for non-occupied voxels) and a small number of occupied voxels (points) each having the size $2^{-L}W \times 2^{-L}W \times 2^{-L}W$.

FIG. 10 shows an example (1000) of scanning for octtree compression and decompression. At level l+1, a sub-cube includes two occupied voxels (points). The points are traversed along a scanning pattern. In FIG. 10, the scanning pattern starts at the bottom-left, near point and continues to the right, then up, and then left to the top-left, near point. The scanning pattern continues at the top-left far point and continues to the right, then down, then left to the bottom-left far point. The scanning pattern depends on implementation. Alternatively, another scanning pattern can be used for octtree compression and decompression.

In FIG. 10, the octtree pattern of points for the sub-cube at level l+1 is 1 0 0 0 0 0 1 0. The first point (bottom-left, near) and seventh point (bottom-right, far) are occupied. The occupied points are indicated with the binary value 1. The remaining points at level l+1 are not occupied, as indicated with the binary value 0. As shown, a non-occupied point (0) is a leaf in the octtree. At level l+2, the sub-cubes for occupied points at level l+1 are further split. The bottom-left, near sub-cube at level l+1 includes two occupied voxels (points) at the second and seventh positions in the scanning pattern, as indicated by the octtree pattern 0 1 0 0 0 0 1 0. The bottom-right, far sub-cube at level l+1 includes three occupied voxels (points) at the first, fourth, and eighth positions in the scanning pattern, as indicated by the octtree pattern 1 0 0 1 0 0 0 1. In this example, the geometry data for the sub-cubes at level l+2 can be represented with 3 bytes.

For the first level of the octtree representation, there are eight sub-cubes, which are represented with 8 bits. If $n_1$ bits are 1 at the first level (that is, $n_1$ points are occupied), a second-level decomposition for the octtree representation uses another $8 \times n_1$ bits. If, at the second level, $n_2$ bits are 1 (that is, $n_2$ points are occupied), a third-level decomposition for the octtree representation uses another $8 \times n_2$ bits. After this process continues through L levels of the octtree representation, the number of bits B used to represent the octtree is:

$$B = 8 \times \sum_{k=0}^{L-1} n_k.$$

For the root level (k=0), $n_0$ is assumed to be 1.

For an L-level decomposition, there are $2^{3L}$ voxels (points), of which N voxels are occupied. The bitrate $R_g$ is the number of bits used to encode the geometry data (i.e., to indicate where the occupied points are). The bitrate can be measured in bits per occupied voxel (bpv) as $R_g = B/N_v$. In typical scenarios, the goal is to represent the surface of a solid 3D object in the 3D space. If voxels at level L are sufficiently small, the intersection of the surface of the 3D object and a voxel at level L is approximately planar (flat). The bitrate $R_g$ can be estimated if one assumes occupied voxels lie in a flat surface crossing the entire voxel space. If a unit cube is sliced into two pieces through a planar cut, the area of the cross-section is between 0 and $\sqrt{2}$, with a cross-sectional area of 1 being the most common. For an L-level decomposition with $2^{3L}$ voxels (points), a slice of the voxel space parallel to one of the external faces encompasses $2^{2L}$ voxels (points). The number of occupied voxels N in a surface crossing the entire voxel space is assumed to be proportional to this number: $N_v = \beta \times 2^{2L}$. For any level of the L-level decomposition, a fraction a of the eight child sub-cubes is assumed to be occupied. For that level, $8\alpha$ sub-cubes are further sub-divided. Thus, the number of bits B used for all levels is $8+8\alpha(8+8\alpha(8+8\alpha \ldots))$ for L levels, which is $8+8(8\alpha)+8(8\alpha)^2+8(8\alpha)^3 \ldots$ bits. The bitrate $R_g$ can be estimated as:

$$R_g = \frac{B}{N_v} \approx \frac{8}{\beta \times 2^{2L}} \sum_{k=0}^{L-1} (8\alpha)^k.$$

As L increases, $R_g$ approaches $$\frac{2^{3+L}\alpha^L}{\beta(8\alpha - 1)}.$$

For typical values of $\beta$ and $\alpha$ (specifically, $\beta=1$ and $\alpha=\frac{1}{2}$), $R_g \approx 8/3$ bpv. In practice, this estimate is quite accurate—typical geometry data can be compressed with about 2.5 bpv using octtree scanning.

For additional details about variations of octtree compression and decompression, see Loop et al., "Real-time High-resolution Sparse Voxelization with Application to Image-based Modeling" (2013); Schnabel et al., "Octtree-based Point Cloud Compression" (2006); and Huang et al., "A Generic Scheme for Progressive Point Cloud Coding," (2008).

In the preceding examples, the bytes of the octtree representation are not further compressed. Alternatively, the bytes of the octtree representation can be further encoded, e.g., using binary arithmetic coding, or some other form of entropy coding adapted to series of binary values. During decoding, corresponding entropy decoding is performed to recover the bytes of the octtree representation.

Thus, when encoding point cloud data, an encoder can apply octtree compression to the indicators of whether multiple points, respectively, are occupied. When decoding point cloud data, a decoder can apply octtree decompression to recover the indicators of whether the multiple points, respectively, are occupied. In the preceding examples, the octtree compression of geometry data is lossless, and the octtree decompression reverses the lossless compression.

Alternatively, the compression of geometry data can be lossy. For example, the encoder applies lossy geometric compression to the indicators of whether the multiple points, respectively, are occupied. The encoder reconstructs the indicators and uses the reconstructed indicators in later operations (e.g., RAHT) to determine which of the points, respectively, are occupied. A corresponding decoder also reconstructs the indicators and uses the reconstructed indicators in later operations (e.g., inverse RAHT) to determine which of the points, respectively, are occupied. Thus, the encoder and decoder use the same reconstructed geometry data.

In addition to determining which of the points of point cloud data are occupied, an encoder and decoder can use the geometry data to determine weights used in a RAHT and inverse RAHT, as described in the section V.D.

In the preceding examples, the indicator for a point is a 0/1 flag or symbol per point. The position of a point (e.g., in terms of x, y, and z coordinates) is not itself compressed, since the position can be inferred from the 0/1 indicators and scanning pattern of the octtree processing. Alternatively, to compress the geometry data for a point cloud, an encoder can compress the positions of the occupied points of the point cloud data (but not the positions of the non-occupied points). In this case, the indicator of whether a point is occupied is the position of the point, if any, in the encoded data. For an occupied point, including the position of the point in the encoded data indicates the point is occupied. For a non-occupied point, omitting the position of the point from the encoded data indicates the point is not occupied. Alternatively, indicators of whether points are occupied in point cloud data can be signaled in some other way.

D. Examples of RAHT and Inverse RAHT.

This section describes examples of a region-adaptive hierarchical transform ("RAHT") and examples of a corresponding inverse RAHT. For intra-frame compression, the RAHT is applied to attributes of occupied points of point cloud data, producing transform coefficients. For corresponding intra-frame decompression, the inverse RAHT is applied to the transform coefficients, producing reconstructed versions of the attributes of occupied points. In conjunction with inter-frame compression, the RAHT can be applied to prediction residuals for attributes of occupied points of point cloud data, where the prediction residuals represent differences between predicted values and original values of the attributes. Again, the RAHT produces transform coefficients. In conjunction with corresponding inter-frame decompression, the inverse RAHT is applied to the transform coefficients to reconstruct versions of the prediction residuals for the attributes of occupied points.

The RAHT and inverse RAHT are "region-adaptive" in that they are not automatically applied to all points of point cloud data, and in that weights are applied that depend on the count of occupied points in a region. The RAHT and inverse RAHT are applied to attributes of occupied points of the point cloud data. Or, the RAHT and inverse RAHT are applied to prediction residuals for attributes of occupied points of the point cloud data. The RAHT and inverse RAHT use geometry data (indicators of which points are occupied points) to guide application of the RAHT and inverse RAHT and to determine weights used for the RAHT and inverse RAHT.

The RAHT and inverse RAHT are "hierarchical" in that results from applying the transform (or inverse transform) at one level of hierarchically organized data are selectively passed to another level of the hierarchically organized data for successive application of the transform (or inverse transform). For example, lowpass transform coefficients that result from applying the transform at a level l are passed to a lower level l−1, and the transform is repeated at the lower level l−1. Or, as another example, attributes (or prediction residuals) that result from applying the inverse transform at a level l are passed to a higher level l+1, and the inverse transform is repeated at the higher level l+1.

For the sake of simplicity, this section mostly describes examples of application of the RAHT to attributes of occupied points, and application of the inverse RAHT to transform coefficients for attributes of occupied points. During inter-frame compression/decompression, the RAHT is instead applied to prediction residuals for attributes of occupied points, and the inverse RAHT is applied to transform coefficients for the prediction residuals for attributes of occupied points.

1. Introduction, Flow of RAHT and Inverse RAHT.

In general, the RAHT uses the attributes of a level l of a hierarchy of point cloud data to predict the attributes of a lower level l−1 of the hierarchy. The RAHT combines the attributes of occupied points (voxels) in a given level l of the hierarchy, passing the combined attributes to the next lower level l−1 of the hierarchy. The RAHT also produces highpass coefficients that can be used, with the combined attributes, to reconstruct the attributes of occupied points in the given level l. At the next level l−1 of the hierarchy, the RAHT repeats the process of combining attributes of occupied points, passing combined attributes to the next lower level l−2, and producing highpass coefficients that can be used to reconstruct attributes of occupied points at the level l−1. In this way, for example, the RAHT can follow an octtree representation from level L to level 1, combining the smallest voxels into successively larger voxels until the RAHT reaches the root for the entire 3D space.

The inverse RAHT proceeds in the opposite direction. The inverse RAHT uses the attributes of a level l of a hierarchy of point cloud data to predict the attributes of a higher level l+1 of the hierarchy. The inverse RAHT reconstructs the attributes of occupied points (voxels) in a given level l of the hierarchy and passes the reconstructed attributes to the next higher level l+1 of the hierarchy. To reconstruct attributes at the given level l, the inverse RAHT uses highpass coefficients for the given level l along with lowpass coefficients (for the bottom level) or attributes passed from the lower level l−1 of the hierarchy (for another level). At the next level l+1 of the hierarchy, the inverse RAHT repeats the process of reconstructing attributes (using highpass coefficients and passed attributes) and passing reconstructed attributes to the next higher level l+2. In this way, for example, the inverse RAHT can follow an octtree representation from level 1 to level L, splitting the root for the entire 3D space into successively smaller voxels until the inverse RAHT reaches the smallest voxels at level L.

Suppose the attributes for points at level l are $g_{l,x,y,z}$, for integers x, y, and z. With the RAHT, the attribute $g_{l,x,y,z}$ for a given point is obtained by grouping (e.g., taking a linear combination of) the following attributes of any occupied points among eight points at level l+1: $g_{l+1,2x,2y,2z}$, $g_{l+1,2x+1,2y,2z}$, $g_{l+1,2x,2y+1,2z}$, $g_{l+1,2x+1,2y+1,2z}$, $g_{l+1,2x,2y,2z+1}$, $g_{l+1,2x+1,2y,2z+1}$, $g_{l+1,2x,2y+1,2z+1}$, and $g_{l+1,2x+1,2y+1,2z+1}$. When the RAHT is applied to the attributes of the eight points, up to seven highpass coefficients at level l+1 are also generated. The highpass coefficients are coded and output as part of encoded data, but are not subjected to further application of the RAHT. If only one of the points in the group is occupied, the attribute for that occupied point is promoted to be $g_{l,x,y,z}$, and no highpass coefficients are created. After the RAHT generates attributes $g_{l,x,y,z}$ for points at level l, such attributes can be further transformed at a lower level l−1. With the inverse RAHT, the attributes of any occupied points among the eight points at level l+1 are reconstructed from $g_{l,x,y,z}$ and any highpass coefficients generated at level l+1.

Instead of transforming eight points at a time, the RAHT can transform attributes of occupied points in three steps along different dimensions. For example, the RAHT transforms attributes for points along the x axis, then transforms attributes for points along the y axis, and then transforms attributes for points along the z axis. Alternatively, the transform is applied along the three axes in a different order. With this approach, the RAHT uses pair-wise transforms to traverse the entire hierarchy. For the RAHT, a point is occupied if the point has an attribute, which may be an original value, a reserved value passed from a higher level, or an intermediate attribute resulting from a previous transform along another axis at the current level of processing. If only one of the points in a pair is occupied, the attribute for that occupied point is promoted, and no highpass coefficient is created.

For example, the attribute for a given point $g_{l,x,y,z}$ is obtained from the attributes of any occupied points among eight points at level l+1 as follows. First, attributes for pairs of points along the x axis are combined, if both points are occupied:

- $g_{l+1,2x,2y,2z}$ and $g_{l+1,2x+1,2y,2z}$ are transformed to produce $g'_{l+1,2x,2y,2z}$ and $h_{l+1,2x+1,2y,2z}$, where $g'_{l+1,2x,2y,2z}$ is an intermediate attribute and $h_{l+1,2x+1,2y,2z}$ is a highpass coefficient;
- $g_{l+1,2x,2y+1,2z}$ and $g_{l+1,2x+1,2y+1,2z}$ are transformed to produce $g'_{l+1,2x,2y+1,2z}$ and $h_{l+1,2x+1,2y+1,2z}$ where $g'_{l+1,2x,2y+1,2z}$ is an intermediate attribute and $h_{l+1,2x+1,2y+1,2z}$ is a highpass coefficient;
- $g_{l+1,2x,2y,2z+1}$ and $g_{l+1,2x+1,2y,2z+1}$ are transformed to produce $g'_{l+1,2x,2y,2z+1}$ and $h_{l+1,2x+1,2y,2z+1}$, where $g'_{l+1,2x,2y,2z+1}$ is an intermediate attribute and $h_{l+1,2x+1,2y,2z+1}$ is a highpass coefficient; and
- $g_{l+1,2x,2y+1,2z+1}$ and $g_{l+1,2x+1,2y+1,2z+1}$ are transformed to produce $g'_{l+1,2x,2y+1,2z+1}$ and $h_{l+1,2x+1,2y+1,2z+1}$, where $g'_{l+1,2x,2y+1,2z+1}$ is an intermediate attribute and $h_{l+1,2x+1,2y+1,2z+1}$ is a highpass coefficient.

If only one of the points in a pair is occupied, the attribute for that occupied point is promoted to be the appropriate intermediate attribute, and no highpass coefficient is created. Next, attributes for pairs of points along the y axis are combined, if both points are occupied:

- $g'_{l+1,2x,2y,2z}$ and $g'_{l+1,2x,2y+1,2z}$ are transformed to produce $g''_{l+1,2x,2y,2z}$ and $h_{l+1,2x,2y+1,2z}$, where $g''_{l+1,2x,2y,2z}$ is an intermediate attribute and $h_{l+1,2x,2y+1,2z}$ is a highpass coefficient; and
- $g'_{l+1,2x,2y,2z+1}$ and $g'_{l+1,2x,2y+1,2z+1}$ are transformed to produce $g''_{l+1,2x,2y,2z+1}$ and $h_{l+1,2x,2y+1,2z+1}$, where $g''_{l+1,2x,2y,2z+1}$ is an intermediate attribute and $h_{l+1,2x,2y+1,2z+1}$ is a highpass coefficient.

If only one of the points in a pair is occupied, the attribute for that occupied point is promoted to be the appropriate intermediate attribute, and no highpass coefficient is created. Next, attributes for the pair of points along the z axis are combined, if both points are occupied:

- $g''_{l+1,2x,2y,2z}$ and $g''_{l+1,2x,2y,2z+1}$ are transformed to produce $g'''_{l+1,2x,2y,2z}$ and $h_{l+1,2x,2y,2z+1}$, where $g'''_{l+1,2x,2y,2z}$ is the lowpass coefficient passed to the lower level as $g_{l,x,y,z}$, and $h_{l+1,2x,2y,2z+1}$ is a highpass coefficient.

If only one of the points in the pair is occupied, the attribute for that occupied point is promoted to be the lowpass coefficient, and no highpass coefficient is created.

Figure 11:
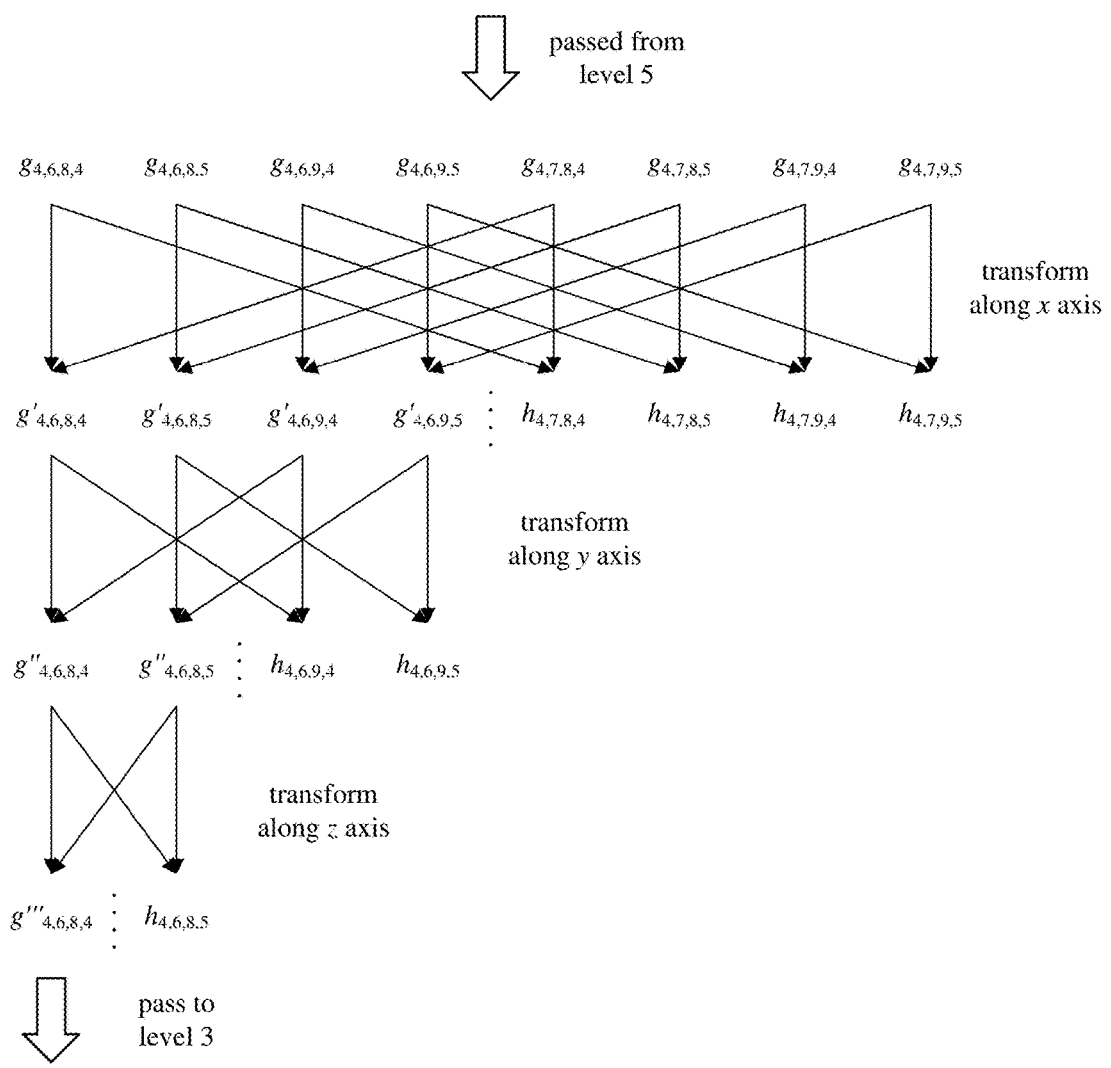
FIGS. 11-14 are diagrams illustrating examples of a transform and inverse transform, respectively, applied along different dimensions for attributes of occupied points of point cloud data.

FIG. 11 shows an example of the RAHT applied in three steps along different dimensions. The attributes that are transformed are associated with points of a sub-cube anchored at position (6, 8, 4) of level 4 of the hierarchy. The points in the sub-cube are (6, 8, 4), (6, 8, 5), (6, 9, 4), (6, 9, 5), (7, 8, 4), (7, 8, 5), (7, 9, 4), and (7, 9, 5). Initially, the attributes for the respective points of the sub-cube at level 4 are passed from level 5. The RAHT transforms attributes for points along the x axis, then transforms attributes for points along the y axis, and then transforms attributes for points along the z axis. In particular, the following pairs of attributes are transformed along the x axis: $g_{4,6,8,4}$ and $g_{4,7,8,4}$, $g_{4,6,8,5}$ and $g_{4,7,8,5}$, $g_{4,6,9,4}$ and $g_{4,7,9,4}$, and $g_{4,6,9,5}$ and $g_{4,7,9,5}$. The transforms produce intermediate attributes $g'_{4,6,8,4}$, $g'_{4,6,8,5}$, $g'_{4,6,9,4}$, and $g'_{4,6,9,5}$, respectively. The pair-wise transforms also produce highpass coefficients $h_{4,7,8,4}$, $h_{4,7,8,5}$, $h_{4,7,9,4}$, and $h_{4,7,9,5}$, respectively. Then, the following pairs of attributes are transformed along the y axis: $g'_{4,6,8,4}$ and $g'_{4,6,9,4}$, and $g'_{4,6,8,5}$ and $g'_{4,6,9,5}$. The transforms produce intermediate attributes $g''_{4,6,8,4}$ and $g''_{4,6,8,5}$, respectively, along with highpass coefficients $h_{4,6,9,4}$ and $h_{4,6,9,5}$, respectively. Finally, the pair of attributes $g''_{4,6,8,4}$ and $g''_{4,6,8,5}$ is transformed along the z axis, producing the intermediate attribute $g'''_{4,6,8,4}$ and highpass coefficient $h_{4,6,8,5}$. The intermediate attribute $g'''_{4,6,8,4}$ is passed to level 3 as the attribute $g_{3,3,4,2}$.

For the RAHT, this grouping process is repeated for each group that has an occupied point at a given level of the hierarchy. The grouping process is then repeated for successively lower levels of the hierarchy, until the root (level 1) is reached.

Figure 12:
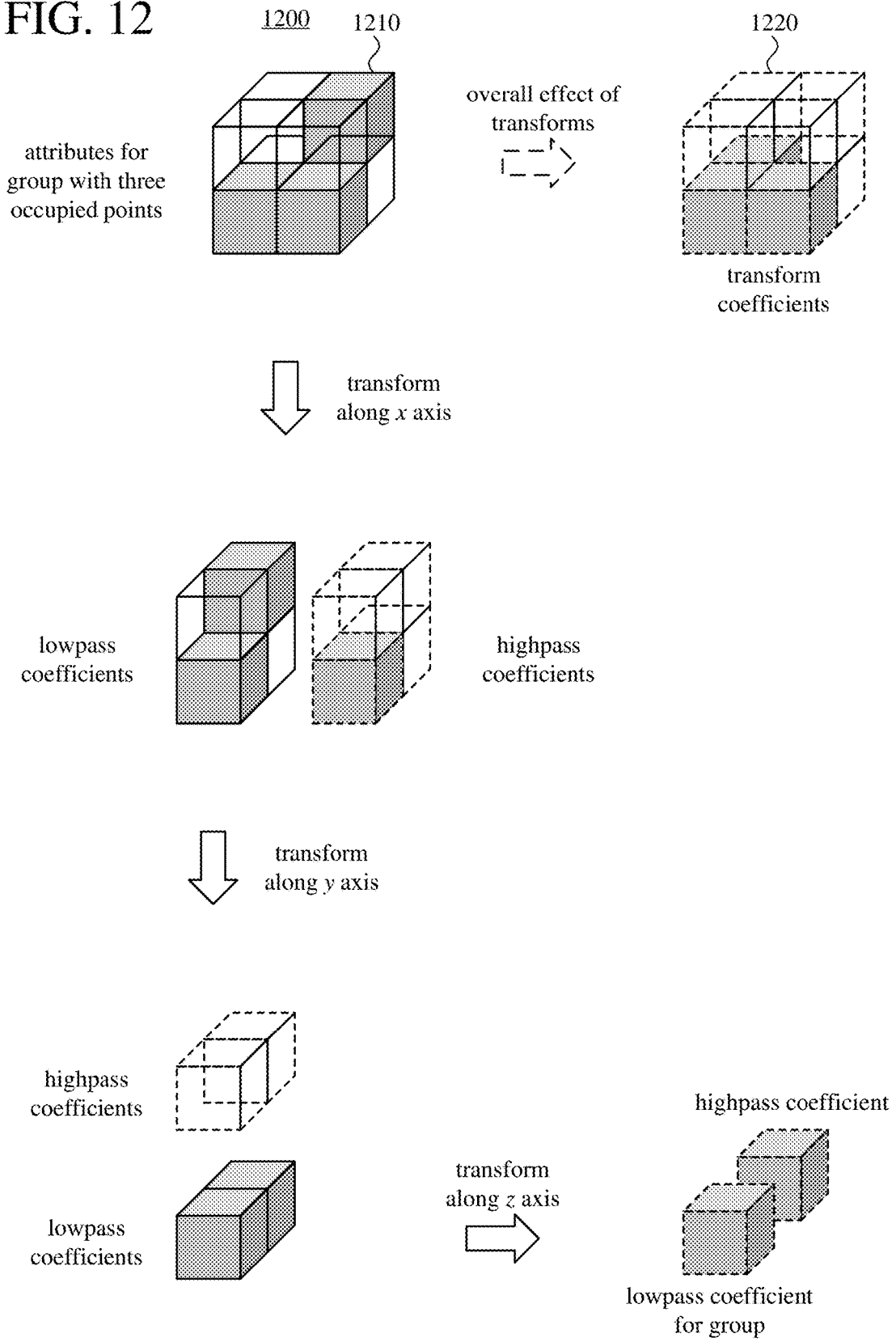

FIG. 12 shows an example (1200) of a transform applied along different dimensions for attributes of occupied points of point cloud data. In FIG. 12, the group (1210) includes three occupied points. Overall, the transform produces transform coefficients (1220) for the attributes of the occupied points of the group.

First, the attributes for the three occupied points are transformed along the x axis (combining points at positions 2x and 2x+1 for any y and any z). This can produce lowpass coefficients (at positions 2x along the x axis) and highpass coefficients (at positions 2x+1 along the x axis). In FIG. 12, for one pair of points, both points are occupied points, and the transform produces a lowpass coefficient (intermediate attribute) and highpass coefficient. For another pair of points, only one point is occupied, and the transform passes through the attribute of the occupied point to be the lowpass coefficient (intermediate attribute) without adjustment. No highpass coefficient is generated for this pair of points. For the other two pairs of points, neither point is occupied, and no values are generated.

Next, the intermediate attributes (lowpass coefficients from the transform along the x axis) are transformed along the y axis. This can produce lowpass coefficients (at positions 2y along the y axis) and highpass coefficients (at positions 2y+1 along the y axis). In FIG. 12, for each pair of points, only one point is occupied, and the transform passes through the attribute of the occupied point to be the lowpass coefficient (intermediate attribute) without adjustment. No highpass coefficients are generated for the two pairs of points.

Finally, the intermediate attributes (lowpass coefficients from the transform along the y axis) are transformed along the z axis. In FIG. 12, for the pair of points, both points are occupied points. The transform can produce a lowpass coefficient (at position 2z along the z axis) and a highpass coefficient (at position 2z+1 along the z axis). The lowpass coefficient can be passed to the next lower level for successive application of the RAHT. The resulting highpass coefficients among the transform coefficients (1220) from the three transforms can be further processed (e.g., quantization, entropy coding). The number of transform coefficients (1220) is the same as the number of occupied points in the group (1210). Although not shown in FIG. 12, with appropriate processing logic, it is possible to keep the transform coefficients "in place" (i.e., in the same x, y, and z positions of the occupied points in the group (1210)).

The corresponding inverse RAHT reconstructs attributes of occupied points in three steps along different dimensions. For example, the inverse RAHT reconstructs attributes for points along the z axis, then reconstructs attributes for points along the y axis, and then reconstructs attributes for points along the x axis. Alternatively, the inverse transform is applied along the three axes in a different order (but still mirrors the order used for the forward transform). With this approach, the inverse RAHT uses pair-wise transforms to traverse the entire hierarchy. For the inverse RAHT, a point is occupied if the point has an attribute, which may be a reserved value passed from a lower level or an intermediate attribute resulting from a previous transform along another axis at the current level of processing.

For example, the attributes of any occupied points among eight points at level l+1 are obtained from the reconstructed attribute for a given point $\hat{g}_{l,x,y,z}$ and highpass coefficients as follows. The reconstructed attribute for the given point $\hat{g}_{l,x,y,z}$ provides $\hat{g}'''_{l+1,2x,2y,2z}$. First, attributes for a pair of points along the z axis are reconstructed, if both points are occupied:

reconstructed versions of attributes (intermediate attributes) $\hat{g}''_{l+1,2x,2y,2z}$ and $\hat{g}''_{l+1,2x,2y,2z+1}$ are calculated from $\hat{g}'''_{l+1,2x,2y,2z}$ and $\hat{h}_{l+1,2x,2y,2z+1}$ where $\hat{h}_{l+1,2x,2y,2z+1}$ is a reconstructed highpass coefficient.

If only one of the points in the pair is occupied, the lowpass coefficient passed from the lower level is promoted to be the attribute (intermediate attribute) for that occupied point, and no highpass coefficient is used. Next, attributes for pairs of points along the y axis are reconstructed, if both points are occupied:

reconstructed versions of attributes (intermediate attributes) $\hat{g}'_{l+1,2x,2y,2z}$ and $\hat{g}'_{l+1,2x,2y+1,2z}$ are calculated from $\hat{g}''_{l+1,2x,2y,2z}$ and $\hat{h}_{l+1,2x,2y+1,2z}$ where $\hat{h}_{l+1,2x,2y+1,2z}$ is a reconstructed highpass coefficient; and reconstructed versions of attributes (intermediate attributes) $\hat{g}'_{l+1,2x,2y,2z+1}$ and $\hat{g}'_{l+1,2x,2y+1,2z+1}$ are calculated from $\hat{g}''_{l+1,2x,2y,2z+1}$ and $\hat{h}_{l+1,2x,2y+1,2z+1}$, where $\hat{h}_{l+1,2x,2y+1,2z+1}$ is a reconstructed highpass coefficient.

If only one of the points in a pair is occupied, the intermediate attribute from the previous inverse transform at the given level is promoted to be the attribute (intermediate attribute) for that occupied point, and no highpass coefficient is used. Finally, attributes for pairs of points along the x axis are reconstructed, if both points are occupied:

reconstructed versions of attributes $\hat{g}_{l+1,2x+1,2y,2z}$ and $\hat{g}_{l+1,2x+1,2y,2z}$ are calculated from $\hat{g}'_{l+1,2x,2y,2z}$ and $\hat{h}_{l+1,2x,2y,2z}$, where $\hat{h}_{l+1,2x+1,2y,2z}$ is a reconstructed highpass coefficient;

reconstructed versions of attributes $\hat{g}_{l+1,2x,2y+1,2z}$ and $\hat{g}_{l+1,2x+1,2y+1,2z}$ are calculated from $\hat{g}'_{l+1,2x,2y+1,2z}$ and $\hat{h}_{l+1,2x+1,2y+1,2z}$, where $\hat{h}_{l+1,2x+1,2y+1,2z}$ is a reconstructed highpass coefficient;

reconstructed versions of attributes $\hat{g}_{l+1,2x,2y,2z+1}$ and $\hat{g}_{l+1,2x+1,2y,2z+1}$ are calculated from $\hat{g}'_{l+1,2x,2y,2z+1}$ and $\hat{h}_{l+1,2x+1,2y,2z+1}$, where $\hat{h}_{l+1,2x+1,2y,2z+1}$ is a reconstructed highpass coefficient; and reconstructed versions of attributes $\hat{g}_{l+1,2x,2y+1,2z+1}$ and $\hat{g}_{l+1,2x+1,2y+1,2z+1}$ are calculated from $\hat{g}'_{l+1,2x,2y+1,2z+1}$ and $\hat{h}_{l+1,2x+1,2y+1,2z+1}$, where $\hat{h}_{l+1,2x+1,2y+1,2z+1}$ is a reconstructed highpass coefficient.

If only one of the points in a pair is occupied, the intermediate attribute from the previous inverse transform at the given level is promoted to be the attribute for that occupied point, and no highpass coefficient is used.

Figure 13:
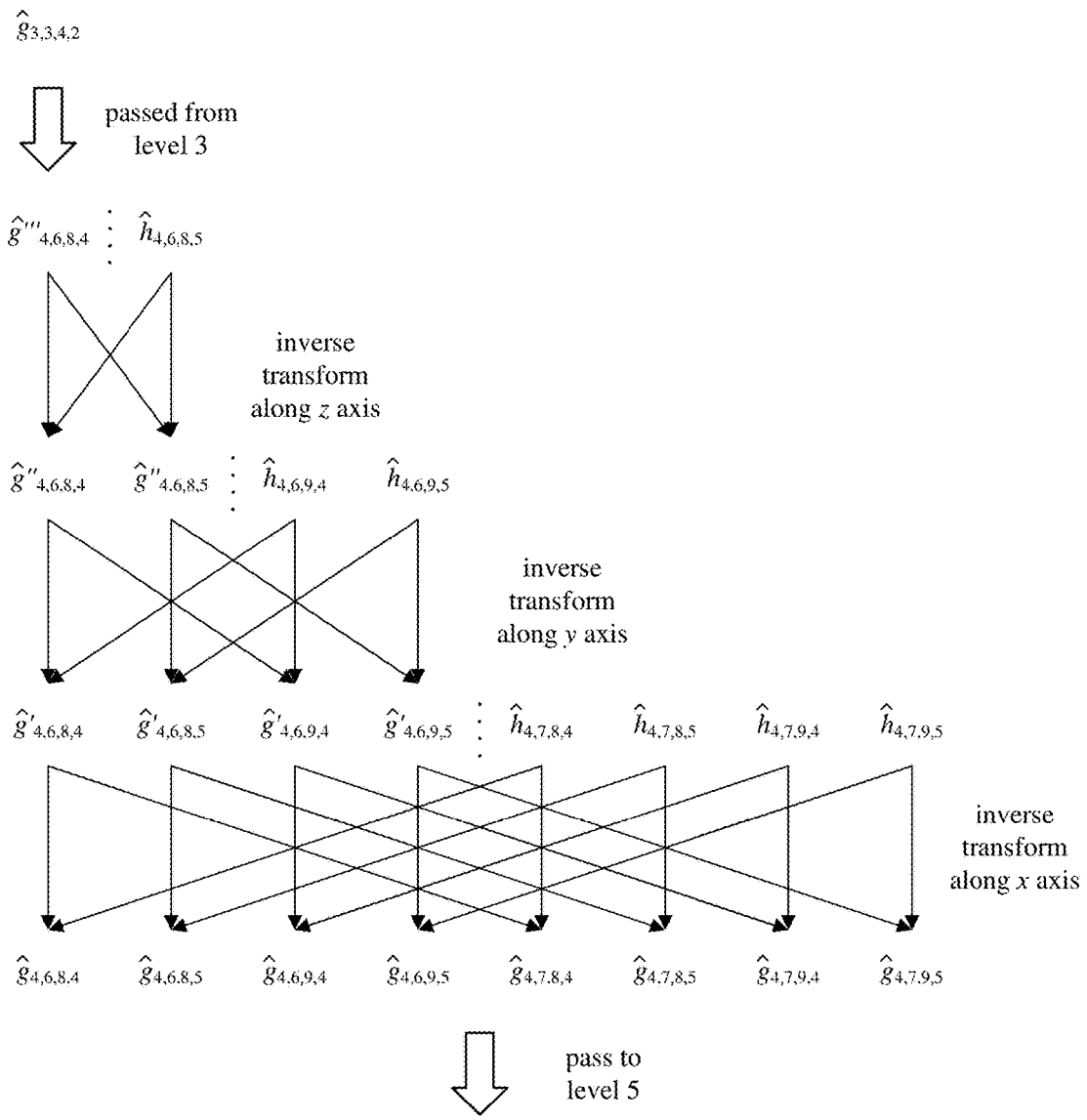

FIG. 13 shows an example (1300) of the inverse RAHT applied in three steps along different dimensions. The attributes that are reconstructed are associated with points of a sub-cube anchored at position (6, 8, 4) of level 4 of the hierarchy. The points in the sub-cube are (6, 8, 4), (6, 8, 5), (6, 9, 4), (6, 9, 5), (7, 8, 4), (7, 8, 5), (7, 9, 4), and (7, 9, 5). The inverse RAHT reconstructs attributes for points along the z axis, then reconstructs attributes for points along the y axis, and then reconstructs attributes for points along the x axis. The reconstructed attribute $\hat{g}_{3,3,4,2}$ is passed from level 3 to provide the reconstructed intermediate attribute $\hat{g}'''_{4,6,8,4}$. The reconstructed intermediate attribute $\hat{g}'''_{4,6,8,4}$ and reconstructed highpass coefficient $\hat{h}_{4,6,8,5}$ are inverse transformed along the z axis to produce the pair of reconstructed intermediate attributes $\hat{g}''_{4,6,8,4}$ and $\hat{g}''_{4,6,8,5}$. Next, the following pairs of values are inverse transformed along the y axis: $\hat{g}''_{4,6,8,5}$ and $\hat{h}_{4,6,9,5}$ and $\hat{h}_{4,6,9,5}$. The inverse transforms produce the reconstructed intermediate attributes $\hat{g}'_{4,6,8,4}$, $\hat{g}'_{4,6,8,5}$, $\hat{g}'_{4,6,9,4}$, and $\hat{g}'_{4,6,9,5}$. Finally, the following pairs of values are inverse transformed along the x axis: $\hat{g}'_{4,6,8,4}$ and $\hat{h}_{4,7,8,4}$, $\hat{g}'_{4,6,8,5}$ and $\hat{h}_{4,7,8,5}$, $\hat{g}'_{4,6,9,4}$ and $\hat{h}_{4,7,9,4}$, and $\hat{g}'_{4,6,9,5}$ and $\hat{h}_{4,7,9,5}$. The inverse transforms produce the reconstructed attributes $\hat{g}_{4,6,8,4}$, $\hat{g}_{4,7,8,4}$, $\hat{g}_{4,6,8,5}$, $\hat{g}_{4,7,8,5}$, $\hat{g}_{4,6,9,4}$, $\hat{g}_{4,7,9,4}$, $\hat{g}_{4,6,9,5}$, and $\hat{g}_{4,7,9,5}$, as shown, which can be passed to level 5 for use in further inverse transform operations.

For the inverse RAHT, this splitting process is repeated for each group that has an occupied point at a given level of the hierarchy. The splitting process is then repeated for successively higher levels of the hierarchy, until the top level (L) has been reached.

Figure 14:
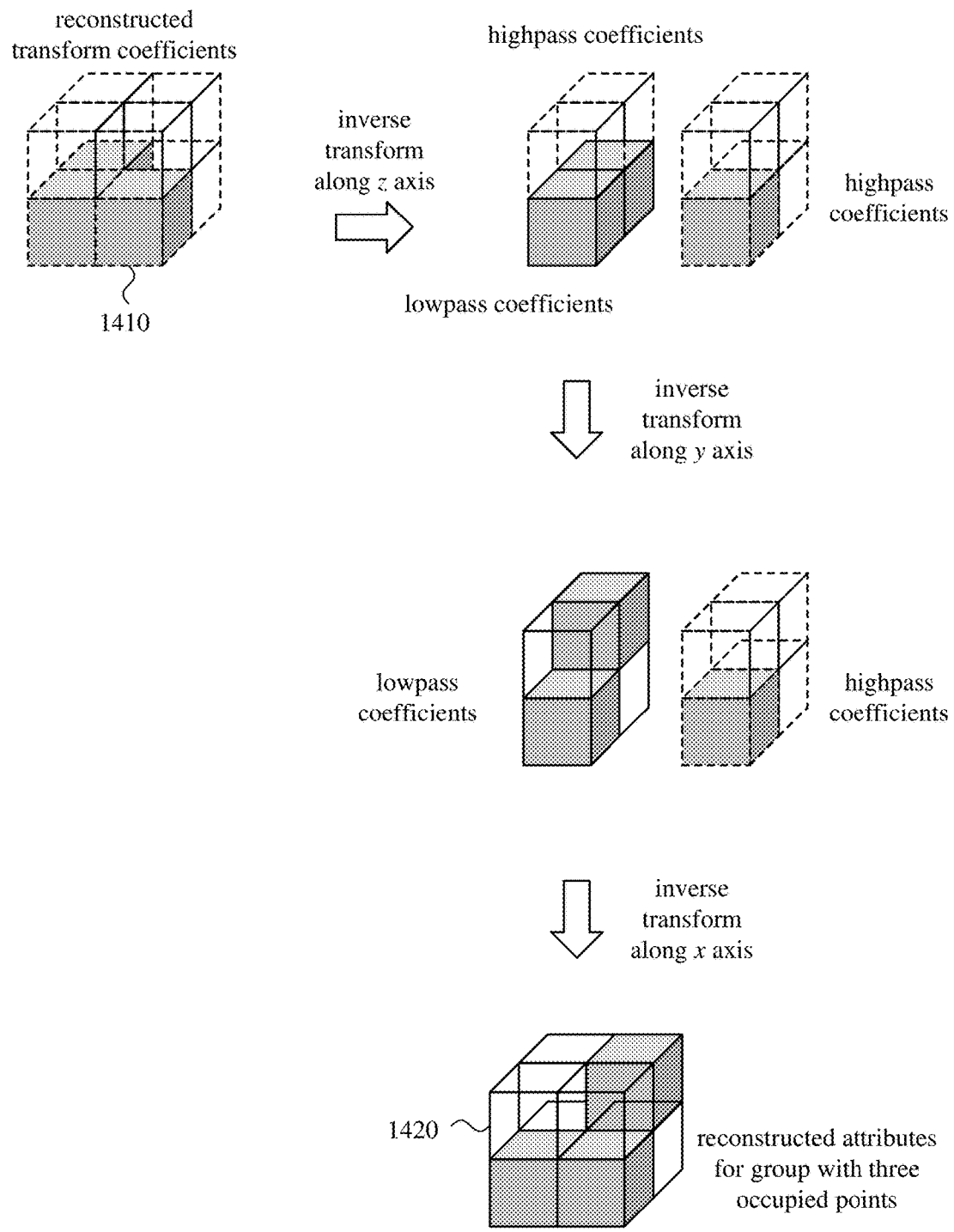

FIG. 14 shows an example (1400) of an inverse transform applied along different dimensions for attributes of occupied points of point cloud data. In FIG. 14, the group (1420) includes three occupied points. Overall, the inverse transform uses transform coefficients (1410) to reconstruct the attributes of the occupied points of the group. The transform coefficients (1210) are recovered using, e.g., entropy decoding and inverse quantization. One of the transform coefficient (lowpass coefficient) may be passed from a lower level.

First, a lowpass coefficient and highpass coefficient for a pair of points are inverse transformed along the z axis. The lowpass coefficient can be a reserved value passed from the next lower level for successive application of the inverse RAHT. The inverse transform can produce intermediate attributes at positions (2x, 2y, 2z) and (2x, 2y, 2z+1) along the z axis.

Next, lowpass coefficients (intermediate attributes) and highpass coefficients are inverse transformed along the y axis. This can produce intermediate attributes at positions (2x, 2y, 2z), (2x, 2y, 2z+1), (2x, 2y+1, 2z), and (2x, 2y+1, 2z+1) along the y axis. In FIG. 14, for each pair of points, only one point is occupied, and the inverse transform passes through the lowpass coefficient (intermediate attribute) without adjustment to be the attribute of the occupied point. No highpass coefficients are used for the two pairs of points.

Finally, lowpass coefficients (intermediate attributes) and highpass coefficients are inverse transformed along the x axis. This can produce reconstructed versions of the attributes of occupied points. In FIG. 14, for one pair of points, both points are occupied points, and the inverse transform produces attributes for the respective occupied points. For another pair of points, only one point is occupied, and the inverse transform passes through the lowpass coefficient (intermediate attribute) without adjustment to be the attribute of the occupied point. No highpass coefficient is used for this pair of points. For the other two pairs of points, neither point is occupied, and no values are generated.

Figure 16:
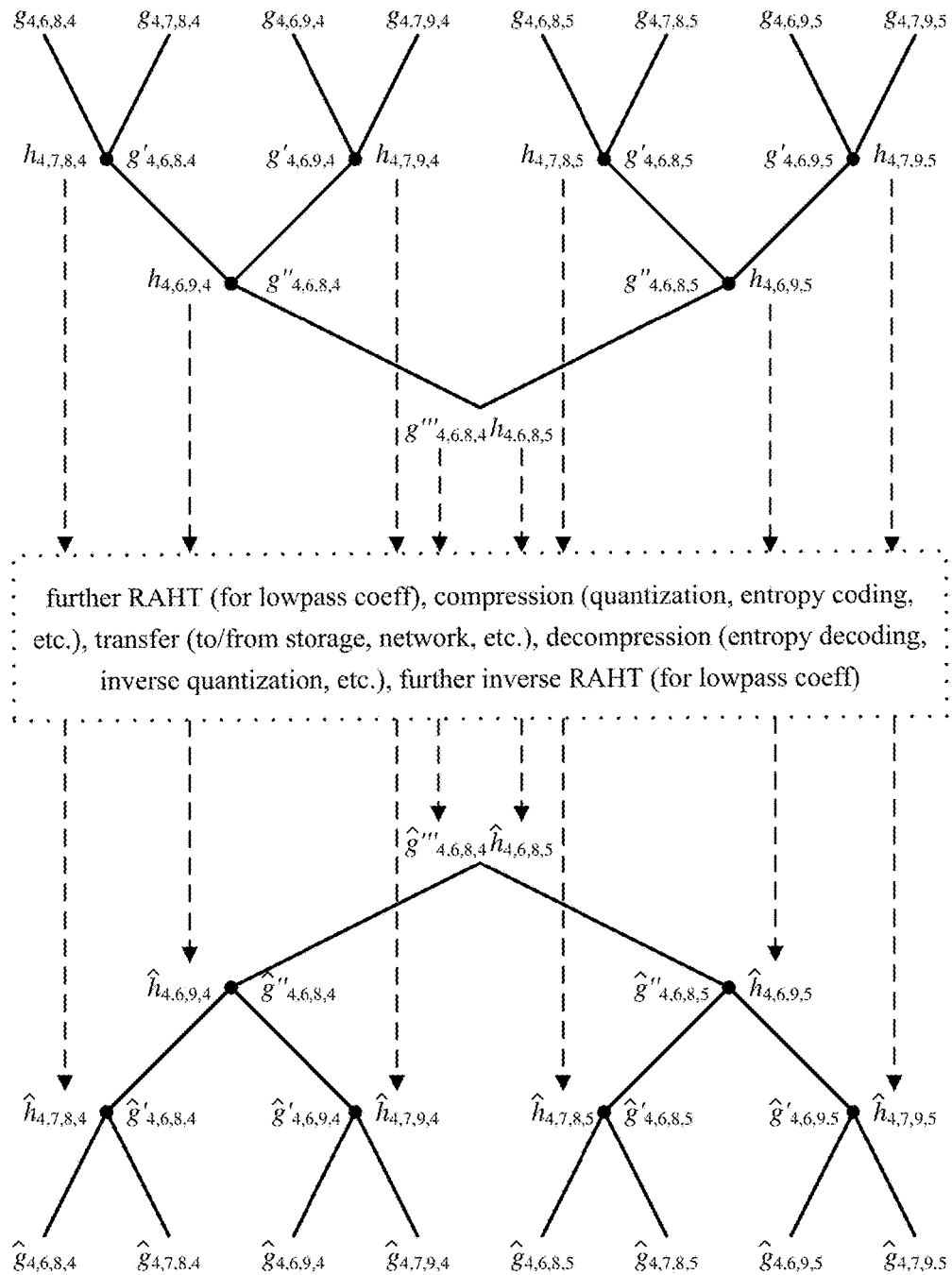

FIGS. 15 and 16 show other views (1500, 1600) of the RAHT and inverse RAHT illustrated in FIGS. 11 and 13, respectively. In the example (1500) of FIG. 15, each transform includes (1) a linear combination of two inputs, weighted by a and b, respectively, and (2) a linear combination of the two inputs, weighted by −b and a, respectively. Ways of calculating the weights are described below. Each inverse transform includes (1) a linear combination of two inputs, weighted by a and −b, respectively, and (2) a linear combination of the two inputs, weighted by a and b, respectively. The example (1600) of FIG. 16 shows a simplified view of the flow for the RAHT and inverse RAHT.

2. Examples of Weights, Weighted Transforms, and Inverse Weighted Transforms.

For the RAHT, the transform applied to attributes of pairs of points can be defined as follows. For attributes $g_1$ and $g_2$ of a pair of adjacent points, a lowpass coefficient $g'_1 = ag_1 + bg_2$ and highpass coefficient $h_2 = -bg_1 + ag_2$ are generated by applying a transform matrix to the attributes:

$$\begin{bmatrix} g'_1 \\ h_2 \end{bmatrix} = T_{w1w2} \begin{bmatrix} g_1 \\ g_2 \end{bmatrix},$$

where $T_{w1w2} = [a\ b;\ -b\ a]$ is a transform matrix whose elements a and b are based on weights w1 and w2 associated with the two points $g_1$ and $g_2$, respectively. For example, the transform matrix $T_{w1w2}$ is:

$$T_{w1w2} = \frac{1}{\sqrt{w1+w2}} \begin{bmatrix} \sqrt{w1} & \sqrt{w2} \\ -\sqrt{w2} & \sqrt{w1} \end{bmatrix},$$

where the weights w1 and w2 are counts of occupied points. Specifically, the weight w1 is a count of occupied points, at the current level and any higher levels, that have contributed attributes for point $g_1$. Similarly, the weight w2 is a count of occupied points, at the current level and any higher levels, that have contributed attributes for point $g_2$. The weight for a given occupied point is the number of occupied points (including the given point and points at higher levels of the hierarchy) that have been grouped to form the given occupied point. Stated differently, the number of occupied points grouped to generate $g_{l,x,y,z}$ provides the weight $w_{l,x,y,z}$ of $g_{l,x,y,z}$. With this choice for elements a and b, each lowpass coefficient is a scaled average of all the attributes contributing to the lowpass coefficient. After the transform, a new weight w'1 associated with the lowpass coefficient $g'_1$ (and also the highpass coefficient $h_2$) can be computed as follows: w'1=w1+w2. The new weight w'1 associated with the lowpass coefficient $g'_1$ is used in subsequent iterations of the RAHT. The new weight w'1 associated with the highpass coefficient $h_2$ can be used when sorting quantized transform coefficients in adaptive entropy coding.

For the example of the RAHT applied in three steps along different dimensions, the transform along the x dimension is:

$$\begin{bmatrix} g'_{l+1,2x,2y,2z} \\ h_{l+1,2x+1,2y,2z} \end{bmatrix} = T_{w1w2} \begin{bmatrix} g_{l+1,2x,2y,2z} \\ g_{l+1,2x+1,2y,2z} \end{bmatrix},$$

where the matrix $T_{w1w2}$ incorporates a weight w1 for $g_{l+1,2x,2y,2z}$ and a weight w2 for $g_{l+1,2x+1,2y,2z}$. A new weight w'1 for $g'_{l+1,2x,2y,2z}$ (and the highpass coefficient $h_{l+1,2x+1,2y,2z}$) is calculated as the weight w1 for $g_{l+1,2x,2y,2z}$ plus the weight w2 for $g_{l+1,2x+1,2y,2z}$. Similarly, the transform along the y dimension is:

$$\begin{bmatrix} g''_{l+1,2x,2y,2z} \\ h_{l+1,2x,2y+1,2z} \end{bmatrix} = T_{w1w2} \begin{bmatrix} g'_{l+1,2x,2y,2z} \\ g'_{l+1,2x,2y+1,2z} \end{bmatrix},$$

where the matrix $T_{w1w2}$ incorporates a weight w'1 for $g'_{l+1,2x,2y,2z}$ and a weight w'2 for $g'_{l+1,2x,2y+1,2z}$. A new weight w''1 for $g''_{l+1,2x,2y,2z}$ (and the highpass coefficient $h_{l+1,2x,2y+1,2z}$) is calculated as the weight w'1 for $g'_{l+1,2x,2y,2z}$ plus the weight w'2 for $g'_{l+1,2x,2y+1,2z}$. The transform along the z dimension is:

$$\begin{bmatrix} g'''_{l+1,2x,2y,2z} \\ h_{l+1,2x,2y,2z+1} \end{bmatrix} = T_{w1w2} \begin{bmatrix} g''_{l+1,2x,2y,2z} \\ g''_{l+1,2x,2y,2z+1} \end{bmatrix},$$

where the matrix $T_{w1w2}$ incorporates a weight w''1 for $g''_{l+1,2x,2y,2z}$ and a weight w''2 for $g''_{l+1,2x,2y,2z+1}$. A new weight w'''1 for $g'''_{l+1,2x,2y,2z}$ (and the highpass coefficient $h_{l+1,2x,2y,2z+1}$) is calculated as the weight w''1 for $g''_{l+1,2x,2y,2z}$ plus the weight w''2 for $g''_{l+1,2x,2y,2z+1}$.

The matrix $T_{w1w2}$ changes dynamically, adapting to the weights associated with the attributes that are transformed. In this way, the matrix $T_{w1w2}$ can adapt to the density of occupied points in different regions of the hierarchy of point cloud data.

In the last stage of the RAHT, the remaining two attributes $g''_{1,0,0,0}$ and $g''_{1,0,0,1}$ are transformed into the DC coefficient $g_{DC} = g_{0,0,0,0} = g'''_{1,0,0,0}$ and final highpass coefficient $h_{1,0,0,1}$.

$$\begin{bmatrix} g'''_{1,0,0,0} \\ h_{1,0,0,1} \end{bmatrix} = T_{w1w2} \begin{bmatrix} g''_{1,0,0,0} \\ g''_{1,0,0,1} \end{bmatrix}.$$

The matrix $T_{w1w2}$ is orthonormal at every level of the RAHT. Therefore, the entire RAHT, as a composition of orthonormal transforms, is orthonormal. This is a valuable property for compression, as the norm of quantization error in the transform domain remains the same in the signal domain.

For the inverse RAHT, the inverse transform applied to reconstruct attributes of pairs of points can be defined as follows. To reconstruct attributes $\hat{g}_1$ and $\hat{g}_2$ of a pair of adjacent points, a reconstructed lowpass coefficient $\hat{g}'_1$ (DC coefficient or attribute from lower level) and reconstructed highpass coefficient $\hat{h}_2$ are inverse transformed by applying a transform matrix to the coefficients.

$$\begin{bmatrix} \hat{g}_1 \\ \hat{g}_2 \end{bmatrix} = T_{w1w2}^T \begin{bmatrix} \hat{g}'_1 \\ \hat{h}_2 \end{bmatrix},$$

where $T_{w1w2}^T$ is a matrix based on weights w1 and w2 associated with the two attributes $g_1$ and $g_2$, respectively (and their reconstructed versions). The matrix $T_{w1w2}^T$ is the transpose of $T_{w1w2}$:

$$T_{w1w2}^T = \frac{1}{\sqrt{w1+w2}} \begin{bmatrix} \sqrt{w1} & -\sqrt{w2} \\ \sqrt{w2} & \sqrt{w1} \end{bmatrix},$$

where the weights w1 and w2 are the counts of occupied points associated with the reconstructed attributes $\hat{g}_1$ and $\hat{g}_2$. The weights for the reconstructed attributes $\hat{g}_1$ and $\hat{g}_2$ are the same as the weights for the attributes $g_1$ and $g_2$, as described above.

For the example of the inverse RAHT applied in three steps along different dimensions, the inverse transform along the z dimension is:

$$\begin{bmatrix} \hat{g}''_{l+1,2x,2y,2z} \\ \hat{g}''_{l+1,2x,2y,2z+1} \end{bmatrix} = T_{w1w2}^T \begin{bmatrix} \hat{g}'''_{l+1,2x,2y,2z} \\ \hat{h}_{l+1,2x,2y,2z+1} \end{bmatrix},$$

where the matrix $T_{w1w2}^T$ incorporates a weight w'''1 for $\hat{g}''_{l+1,2x,2y,2z}$ and a weight w'''2 for $\hat{g}''_{l+1,2x,2y,2z+1}$. Similarly, the inverse transform along the y dimension is:

$$\begin{bmatrix} \hat{g}'_{l+1,2x,2y,2z} \\ \hat{g}'_{l+1,2x,2y+1,2z} \end{bmatrix} = T_{w1w2}^T \begin{bmatrix} \hat{g}''_{l+1,2x,2y,2z} \\ \hat{h}_{l+1,2x,2y+1,2z} \end{bmatrix},$$

where the matrix $T_{w1w2}^T$ incorporates a weight w'1 for $\hat{g}'_{l+1,2x,2y,2z}$ and a weight w'2 for $\hat{g}'_{l+1,2x,2y+1,2z}$. Finally, the inverse transform along the x dimension is:

$$\begin{bmatrix} \hat{g}_{l+1,2x,2y,2z} \\ \hat{g}_{l+1,2x+1,2y,2z} \end{bmatrix} = T_{w1w2}^T \begin{bmatrix} \hat{g}'_{l+1,2x,2y,2z} \\ \hat{h}_{l+1,2x+1,2y,2z} \end{bmatrix},$$

where the matrix $T_{w1w2}^T$ incorporates a weight w1 for $\hat{g}'_{l+1,2x,2y,2z}$ and a weight w2 for $\hat{g}'_{l+1,2x+1,2y,2z}$.

Like the matrix $T_{w1w2}$ used in the RAHT, the matrix $T_{w1w2}^T$ changes dynamically, adapting to the weights associated with the attributes Like the matrix $T_{w1w2}$ used in the RAHT, the matrix $T_{w1w2}^T$ is orthonormal at every level of the RAHT. Therefore, the entire inverse RAHT, as a composition of orthonormal transforms, is orthonormal.

Figure 17:
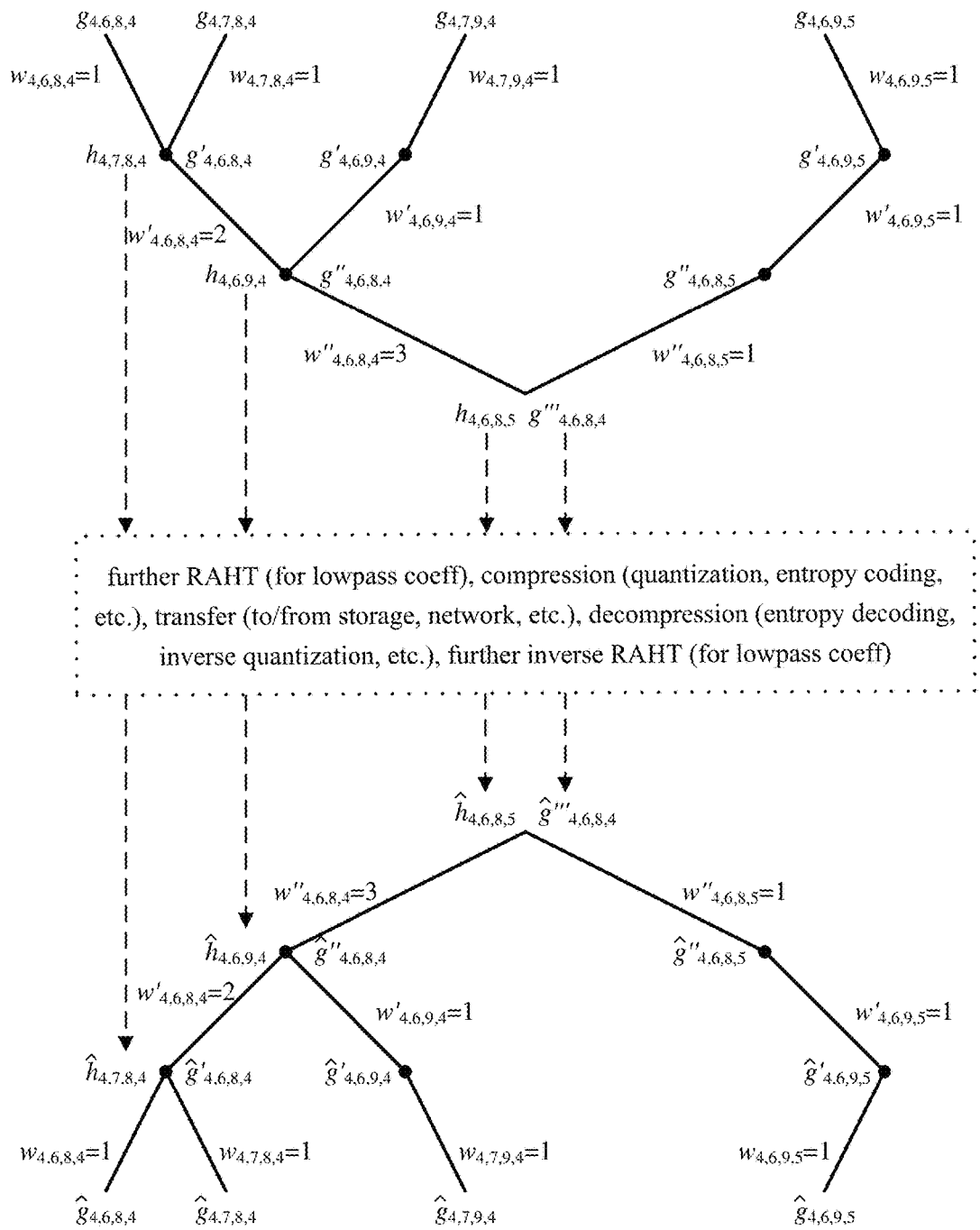

FIG. 17 shows an example (1700) of weights applied when only of a subset of the points in the example (1600) of FIG. 16 are occupied. In FIG. 17, the occupied points are at positions (6, 8, 4), (7, 8, 4), (7, 9, 4), (6, 9, 5) of level 4 of the hierarchy of point cloud data. In this simplified example, level 4 is the top level of the hierarchy. As such, the weights for the occupied points at level 4 are each 1. For the transform of attributes $g_{4,6,8,4}$ and $g_{4,7,8,4}$, the transform matrix is:

$$T_{w1w2} = \frac{1}{\sqrt{2}} \begin{bmatrix} 1 & 1 \\ -1 & 1 \end{bmatrix} = \begin{bmatrix} 1/\sqrt{2} & 1/\sqrt{2} \\ -1/\sqrt{2} & 1/\sqrt{2} \end{bmatrix}.$$

After the attributes $g_{4,6,8,4}$ and $g_{4,7,8,4}$ are transformed, the weight $w'_{4,6,8,4}$ for the new attribute $g'_{4,6,8,4}$ is 2: $w'_{4,6,8,4} = w_{4,6,8,4} + w_{4,7,8,4}$. The attributes $g_{4,7,9,4}$ and $g_{4,6,9,5}$ are each passed through without adjustment, and their associated weights are unchanged (still 1). In the next step of the transform process, the attributes $g'_{4,6,8,4}$ and $g'_{4,6,9,4}$ are transformed, producing a new attribute $g''_{4,6,8,4}$. For this transform, the transform matrix is:

$$T_{w1w2} = \frac{1}{\sqrt{3}} \begin{bmatrix} \sqrt{2} & 1 \\ -1 & \sqrt{2} \end{bmatrix} = \begin{bmatrix} \sqrt{2}/\sqrt{3} & 1/\sqrt{3} \\ -1/\sqrt{3} & \sqrt{2}/\sqrt{3} \end{bmatrix}.$$

The weight $w''_{4,6,8,4}$ for the new attribute $g''_{4,6,8,4}$ is 3: $w''_{4,6,8,4} = w'_{4,6,8,4} + w'_{4,6,9,4}$. The attribute $g'_{4,6,9,5}$ is passed through without adjustment, and its associated weight is unchanged (still 1). In the next step of the transform process, the attributes $g''_{4,6,8,4}$ and $g''_{4,6,8,5}$ are transformed, producing a new attribute $g'''_{4,6,8,4}$. For this transform, the transform matrix is:

$$T_{w1w2} = \frac{1}{\sqrt{4}} \begin{bmatrix} \sqrt{3} & 1 \\ -1 & \sqrt{3} \end{bmatrix} = \begin{bmatrix} \sqrt{3}/2 & 1/2 \\ -1/2 & \sqrt{3}/2 \end{bmatrix}.$$

The weight $w'''_{4,6,8,4}$ for the new attribute $g'''_{4,6,8,4}$ is 4: $w'''_{4,6,8,4} = w''_{4,6,8,4} + w''_{4,6,8,5}$. The weight $w'''_{4,6,8,4}$ may be used for subsequent transforms at level 3.

In FIG. 17, the inverse transform mirrors the forward transform. The values $\hat{g}'''_{4,6,8,4}$ and $\hat{h}_{4,6,8,5}$ are inverse transformed, producing reconstructed attributes $\hat{g}''_{4,6,8,4}$ and $\hat{g}''_{4,6,8,5}$. The weight $w''_{4,6,8,4}$ for the reconstructed attribute $\hat{g}''_{4,6,8,4}$ is 3, and the weight $w''_{4,6,8,5}$ for the reconstructed attribute $\hat{g}''_{4,6,8,5}$ is 1. For this inverse transform, the transform matrix is:

$$T_{w1w2}^T = \frac{1}{\sqrt{4}} \begin{bmatrix} \sqrt{3} & -1 \\ 1 & \sqrt{3} \end{bmatrix} = \begin{bmatrix} \sqrt{3}/2 & -1/2 \\ 1/2 & \sqrt{3}/2 \end{bmatrix}.$$

Next, the values $\hat{g}''_{4,6,8,4}$ and $\hat{h}_{4,6,9,4}$ are inverse transformed, producing reconstructed attributes $\hat{g}'_{4,6,8,4}$ and $\hat{g}'_{4,6,9,4}$. The weight $w'_{4,6,8,4}$ for the reconstructed attribute $\hat{g}'_{4,6,8,4}$ is 2, and the weight $w'_{4,6,9,4}$ for the reconstructed attribute $\hat{g}'_{4,6,9,4}$ is 1. Thus, for this inverse transform, the transform matrix is:

$$T_{w1w2}^T = \frac{1}{\sqrt{3}} \begin{bmatrix} \sqrt{2} & -1 \\ 1 & \sqrt{2} \end{bmatrix} = \begin{bmatrix} \sqrt{2}/\sqrt{3} & -1/\sqrt{3} \\ 1/\sqrt{3} & \sqrt{2}/\sqrt{3} \end{bmatrix}.$$

The reconstructed attribute $\hat{g}''_{4,6,8,5}$ is passed through without adjustment, and its associated weight is unchanged (still 1). Next, the values $\hat{g}'_{4,6,8,4}$ and $\hat{h}_{4,7,8,4}$ are inverse transformed, producing reconstructed attributes $\hat{g}_{4,6,8,4}$ and $\hat{g}_{4,7,8,4}$. The weight $w_{4,6,8,4}$ for the reconstructed attribute $\hat{g}_{4,6,8,4}$ is 1, and the weight $w_{4,7,8,4}$ for the reconstructed attribute $\hat{g}'_{4,7,8,4}$ is 1. Thus, for this inverse transform, the transform matrix is:

$$T_{w1w2}^T = \frac{1}{\sqrt{2}}\begin{bmatrix} 1 & -1 \\ 1 & 1 \end{bmatrix} = \begin{bmatrix} 1/\sqrt{2} & -1/\sqrt{2} \\ 1/\sqrt{2} & 1/\sqrt{2} \end{bmatrix}.$$

The reconstructed attributes $\hat{g}'_{4,6,9,4}$ and $\hat{g}'_{4,6,9,5}$ are each passed through without adjustment, and their associated weights are unchanged (still 1).

Formally, the RAHT can be described recursively as follows. Suppose $s_1=(s_{11}, \ldots, s_{1w1})$ and $s_2=(s_{21}, \ldots, s_{2w2})$ are signal vectors defined over non-intersecting domains (i.e., regions) $\mathcal{R}_1$ and $\mathcal{R}_2$, respectively, where w1 is the cardinality of $\mathcal{R}_1$ (w1=$|\mathcal{R}_1|$), and w1 is the cardinality of $\mathcal{R}_2$ (w2=$|\mathcal{R}_2|$). Also suppose the transforms are $t_1=(t_{11}, \ldots, t_{1w1})$ and $t_1=(t_{11}, \ldots, t_{1w1})$, respectively. Suppose $s=(s_{11}, \ldots, s_{1w1}, s_{21}, \ldots, s_{2w2})$ is the concatenated signal vector defined over $\mathcal{R}=\mathcal{R}_1 \cup \mathcal{R}_2$. In this case, the (w1+w2)-point transform of s is $t=(at_{11}+bt_{21}, t_{12}, \ldots, t_{1w1}, -bt_{11}+at_{21}, t_{22} \ldots, t_{2w2})$, where $a=\sqrt{w1/(w1+w2)}$ and $b=\sqrt{w2/(w1+w2)}$. That is, the matrix:

$$T_{w1w2} = \frac{1}{\sqrt{w1+w2}}\begin{bmatrix} \sqrt{w1} & \sqrt{w2} \\ -\sqrt{w2} & \sqrt{w1} \end{bmatrix},$$

is applied to the first ("DC") components of $t_1$ and $t_2$ (namely $t_{11}$ and $t_{21}$) to obtain the first ("DC") and w1+1'th components of t, while the other components remain unchanged. As the base case, the transform of a scalar is the scalar itself. The domain of definition is a discrete abstract set and can be embedded in any dimension.

In example implementations, the RAHT and inverse RAHT can be performed "in place." This can greatly simplify implementation by avoiding use of extra memory locations to store intermediate values.

Figure 18:
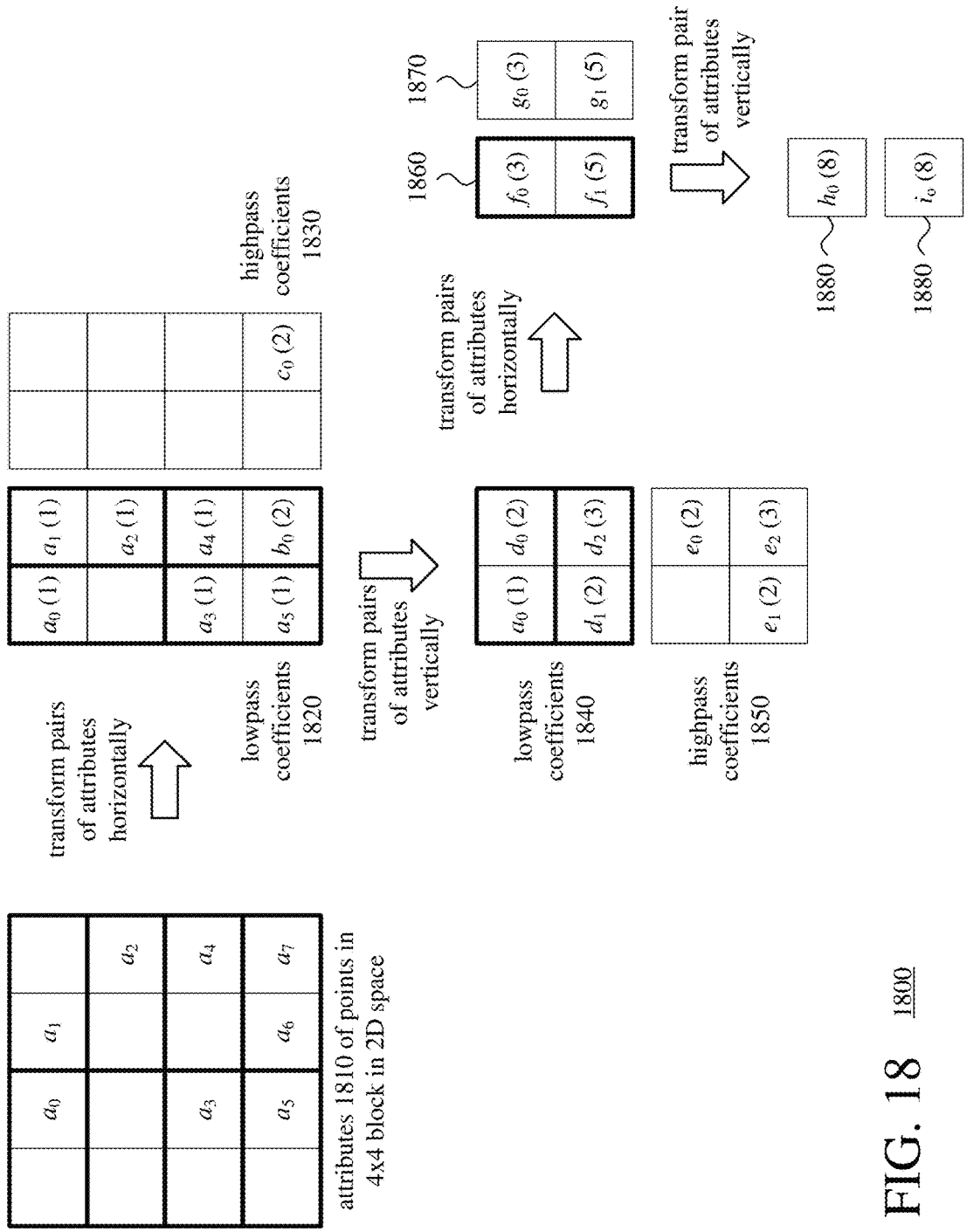
FIG. 18 is a diagram illustrating features of a hierarchical weighted transform.

FIG. 18 shows an example (1800) illustrating features of a hierarchical weighted transform. The example (1800) shows a hierarchical weighted transform applied to attributes (1810) of points in a 4×4 block in 2D space. (For the sake of simplicity, and to illustrate adjustment of weights between levels of the weighted transform, a 2D example is shown in FIG. 18. For point cloud compression, attributes in 3D blocks are transformed using a weighted hierarchical transform, as described above.)

In FIG. 18, the attributes (1810) of points in a 4×4 block include attributes for eight occupied points. The occupied points are labeled $a_0 \ldots a_8$. Unoccupied points are empty. Pairs of attributes at horizontally adjacent positions of the 4×4 block are transformed, producing lowpass coefficients (1820) and highpass coefficients (1830). When a pair includes a single occupied point, the attribute for that single occupied point is passed through as the lowpass coefficient. This is the case for attributes $a_0$, $a_1$, $a_2$, $a_3$, $a_4$, and $a_5$. For these six attributes, the weights are determined as shown—each attribute has a weight of 1. For the other two attributes ($a_6$ and $a_7$), the transform produces a lowpass coefficient $b_0$ and a highpass coefficient $c_0$.

$$\begin{bmatrix} b_0 \\ c_0 \end{bmatrix} = T_{11}\begin{bmatrix} a_6 \\ a_7 \end{bmatrix}.$$

For the lowpass coefficient $b_0$ and highpass coefficient $c_0$, the weights are updated as shown—each coefficient has a weight of 2 since attributes for two occupied points were combined.

The lowpass coefficients (1820) are further transformed as attributes. Pairs of attributes at vertically adjacent positions (among the lowpass coefficients (1820)) are transformed, producing lowpass coefficients (1840) and highpass coefficients (1850). One pair includes a single occupied point ($a_0$), and the attribute for that single occupied point is passed through as one of the lowpass coefficients (1840). For this attribute, the weight is unchanged (weight of 1). For pairs of the other attributes ($a_1$ and $a_2$, $a_3$ and $a_5$, $a_4$ and $b_0$), the transform produces lowpass coefficients ($d_0$, $d_1$, and $d_2$ for the three pairs, respectively) and highpass coefficients ($e_0$, $e_1$, and $e_2$ for the three pairs, respectively).

$$\begin{bmatrix} d_0 \\ e_0 \end{bmatrix} = T_{11}\begin{bmatrix} a_1 \\ a_2 \end{bmatrix};$$

$$\begin{bmatrix} d_1 \\ e_1 \end{bmatrix} = T_{11}\begin{bmatrix} a_3 \\ a_5 \end{bmatrix}; \text{ and}$$

$$\begin{bmatrix} d_2 \\ e_2 \end{bmatrix} = T_{12}\begin{bmatrix} a_4 \\ b_0 \end{bmatrix}.$$

The weights for $d_0$, $d_1$, $e_0$, and $e_1$ are updated to be 2 (since two attributes having weight 1 were combined). The weights for $d_2$ and $e_2$ is updated to be 3 (since an attribute having weight 1 was combined with an attribute having weight 2).

Next, the lowpass coefficients (1840) are further transformed as attributes. Pairs of attributes at horizontally adjacent positions (among the lowpass coefficients (1840)) are transformed, producing lowpass coefficients (1860) and highpass coefficients (1870). For each pair of the attributes ($a_0$ and $d_0$, $d_1$ and $d_3$), the transform produces a lowpass coefficient ($f_0$ for the first pair, and $f_1$ for the second pair) and a highpass coefficient ($g_0$ for the first pair, and $g_1$ for the second pair).

$$\begin{bmatrix} f_0 \\ g_0 \end{bmatrix} = T_{12}\begin{bmatrix} a_0 \\ d_0 \end{bmatrix}; \text{ and}$$

$$\begin{bmatrix} f_1 \\ g_1 \end{bmatrix} = T_{23}\begin{bmatrix} d_1 \\ d_2 \end{bmatrix}.$$

The weights for $f_0$ and $g_0$ are updated to be 3 (since an attribute having weight 1 was combined with an attribute having weight 2). The weights for $f_1$ and $g_1$ are updated to be 5 (since an attribute having weight 2 was combined with an attribute having weight 3).

Finally, the lowpass coefficients (1860) are further transformed as attributes. The pair of attributes at vertically adjacent positions (among the lowpass coefficients (1860)) is transformed, producing a lowpass coefficient $h_0$ (1880), which corresponds to the DC coefficient, and a highpass coefficient $i_0$ (1890).

$$\begin{bmatrix} h_0 \\ i_0 \end{bmatrix} = T_{35}\begin{bmatrix} f_0 \\ f_1 \end{bmatrix}.$$

The weights for $h_0$ and $i_0$ are updated to be 8 (since an attribute having weight 3 was combined with an attribute having weight 5).

In the example (1800) of FIG. 18, the final number of coefficients (8) is the same as the number of occupied points. The coefficients that are encoded and output are $c_0$, $e_0$, $e_1$, $e_2$, $g_0$, $g_1$, and $i_0$. The coefficient $h_0$ can be encoded and output, or it can be passed to a lower level. The weights need not be signaled explicitly, since they can be derived from compressed geometry data that is output.

3. Compression Using a RAHT.

FIG. 19 shows an example technique (1900) for applying a RAHT during coding of attributes of occupied points of point cloud data. An encoder such as the encoder (301) of FIG. 3a, encoder (302) of FIG. 3b, or other encoder performs the technique (1900) when performing a RAHT during encoding (e.g., in stage (620) described with reference to FIG. 6).

To start, the encoder selects (1910) a level of a hierarchy for point cloud data. The encoder can start at the top level of the hierarchy (i.e., at level L of an L-level decomposition). In later iterations, the encoder can select successively lower levels of the hierarchy for point cloud data.

At a given level of the hierarchy for the point cloud data, the encoder performs operations for each of one or more groups of points at the level. Thus, at the selected level (given level), the encoder selects (1920) a group of points (given group) with at least one occupied point. The encoder applies (1930) the transform to any attributes of occupied points of the given group. At the top level of the hierarchy, the attributes are initially actual values of attributes of occupied points of the given group. If the given level is not the top level of the hierarchy, the attributes of occupied points of the given group are initially reserved values (i.e., lowpass coefficients) passed from a next higher level in the hierarchy. Also, for a given group, the attributes can be intermediate attributes that result from one or more previous transforms applied to attributes of occupied points of the given group (e.g., from transforming along the x axis, or x and y axes).

In some example implementations, the transform is a weighted transform. The weights of the weighted transform depend at least in part on counts of occupied points that contribute to the occupied points of the given group. Section V.D.2 describes examples of such weighting. Alternatively, the transform is weighted in some other way.

For the given group, the transform can be iteratively applied along each of three axes in the 3D space. For example, as shown in FIG. 20, the encoder can apply (2010) the transform to attributes of occupied points along the x axis, then apply (2020) the transform to attributes of occupied points along the y axis (that is, to lowpass coefficients resulting from the transform along the x axis), and then apply (2030) the transform to attributes of occupied points along the z axis (that is, to lowpass coefficients resulting from the transform along the y axis).

The definition of the transform depends on implementation. For example, for two adjacent points of the given group, the transform includes the following operations. If both of the two adjacent points are occupied, the encoder converts the attributes of the two adjacent points into a lowpass coefficient and a highpass coefficient. The highpass coefficient is one of the transform coefficients that are output. The lowpass coefficient can be a value reserved for successive application of the transform at a lower level. Or, the lowpass coefficient can be an intermediate attribute for additional transforming at the given level (when transforming along another axis). If only one of the two adjacent points is occupied, the encoder passes through the attribute of the occupied point to be the reserved value or the intermediate attribute.

Transforming the attributes produces one or more values for the given group. The value(s) include any of the transform coefficients (e.g., highpass coefficients) that are associated with the given group at the given level. If the given level is not the bottom level of the hierarchy, the encoder reserves one of value(s) for the given group. The reserved value (lowpass coefficient) will be used as an attribute of an occupied point at a next lower level in the hierarchy, in successive application of the RAHT at the next lower level.

The encoder checks (1940) whether there are any more groups with occupied points at the given level. If so, the encoder continues by selecting (1920) the next group of points with at least one occupied point at the given level. Otherwise (no more groups with occupied points at the given level), the encoder checks (1950) whether there are any more levels of the hierarchy. If so, the encoder continues by selecting (1910) the next (lower) level of the hierarchy.

In this way, the encoder applies the transform to successively lower levels of the hierarchy of point cloud data. Suppose the hierarchy includes a bottom level, zero or more intermediate levels, and a top level. For each of the top level and zero or more intermediate levels (as the given level), the encoder can perform the transforming and the reserving (of lowpass coefficients) for each of the group(s) of points at the given level. This provides at least one reserved value for the next lower level. It also provides, as output, any of the transform coefficients that are associated with the given level (that is, highpass coefficients). At the bottom level of the hierarchy, for a group of points at the bottom level, the encoder can transform any attributes of occupied points of the group at the bottom level. This produces one or more of the transform coefficients (that is, lowpass coefficient and highpass coefficient(s) for the bottom level).

According to FIG. 19, an encoder applies the technique (1900) during coding of attributes of occupied points for intra-frame compression. The same technique (1900) can be used during inter-frame compression—applying a RAHT to prediction residuals for attributes of occupied points, instead of to the attributes themselves.

4. Decompression Using an Inverse RAHT.

FIG. 21 shows an example technique (2100) for applying an inverse RAHT during decoding of transform coefficients for attributes of occupied points of point cloud data. A decoder such as the decoder (401) of FIG. 4a, decoder (402) of FIG. 4b, or other decoder performs the technique (2100) when performing an inverse RAHT during decoding (e.g., in stage (840) described with reference to FIG. 8).

To start, the decoder selects (2110) a level of a hierarchy for point cloud data. The decoder can start at the bottom level of the hierarchy (i.e., at level 1 of an L-level decomposition). In later iterations, the decoder can select successively higher levels of the hierarchy for point cloud data.

At a given level of the hierarchy for the point cloud data, the decoder performs operations for each of one or more groups of points at the level. Thus, at the selected level (given level), the decoder selects (2120) a group of points (given group) with at least one occupied point. The decoder applies (2130) the inverse transform to one or more values for any attributes of occupied points of the given group. The inverse transformed value(s) include any of the transform coefficients (e.g., highpass coefficients) that are associated with the given group at the given level. At the bottom level of the hierarchy, the inverse transformed value(s) are initially lowpass and highpass coefficients for attributes of occupied points of the given group. If the given level is not the bottom level of the hierarchy, the inverse transformed value(s) initially include a value (attribute) passed from a next lower level in the hierarchy as well as one or more highpass coefficients associated with the given group at the given level. Also, for a given group, the value(s) can include an intermediate attribute that results from one or more previous inverse transforms applied to values for attributes of occupied points of the given group (e.g., from transforming along the z axis, or z and y axes), as well as one or more highpass coefficients.

In some example implementations, the inverse transform is a weighted inverse transform. The weights of the weighted inverse transform depend at least in part on counts of occupied points that contribute to the occupied points of the given group. Section V.D.2 describes examples of such weighting. Alternatively, the inverse transform is weighted in some other way.

For the given group, the inverse transform can be iteratively applied along each of three axes in the 3D space. For example, as shown in FIG. 22, the decoder can apply (2210) the inverse transform to values (a lowpass coefficient/attribute from the next lower level and a highpass coefficient) for attributes of occupied points along the z axis, then apply (2220) the inverse transform to values (one or more intermediate attributes from the inverse transform along the z axis, and one or more highpass coefficients) for attributes of occupied points along the y axis, and then apply (2230) the inverse transform to values (one or more intermediate attributes from the inverse transform along the y axis, and one or more highpass coefficients) for attributes of occupied points along the x axis.

The definition of the inverse transform depends on implementation. For example, for two adjacent points of the given group, the inverse transform includes the following operations. If both of the two adjacent points are occupied, the decoder converts a lowpass coefficient and a highpass coefficient into the attributes of the two adjacent points. The highpass coefficient is one of the transform coefficients that were received and decoded. The lowpass coefficient can be an attribute passed from the next lower level. Or, the lowpass coefficient can be an intermediate attribute from previous inverse transforming at the given level (when inverse transforming along another axis). If only one of the two adjacent points is occupied, the decoder passes through, to be the attribute of the occupied point of the given group, the attribute of the occupied point from the next lower level or the intermediate attribute.

Inverse transforming the value(s) produces the attributes of occupied points of the given group. If the given level is not the top level of the hierarchy, the decoder reserves the attributes of occupied points of the given group. The reserved values will be used as lowpass coefficients (attributes of occupied points) at a next higher level in the hierarchy, in successive application of the inverse RAHT at the next higher level.

The decoder checks (2140) whether there are any more groups with occupied points at the given level. If so, the decoder continues by selecting (2120) the next group of points with at least one occupied point at the given level. Otherwise (no more groups with occupied points at the given level), the decoder checks (2150) whether there are any more levels of the hierarchy. If so, the decoder continues by selecting (2110) the next (higher) level of the hierarchy.

In this way, the decoder applies the inverse transform to successively higher levels of the hierarchy of point cloud data. Suppose the hierarchy includes a bottom level, zero or more intermediate levels, and a top level. For each of the bottom level and zero or more intermediate levels (as the given level), the decoder can perform the inverse transforming and the reserving (of attributes) for each of the group(s) of points at the given level. This provides at least one reserved value for the next higher level. It also uses, as input for the inverse transforming, any of the transform coefficients that are associated with the given level (that is, highpass coefficients). At the top level of the hierarchy, for each of the group(s) of points at the top level, the decoder can inverse transform values (that is, passed attributes as lowpass coefficients, and highpass coefficients) for any attributes of occupied points of the group(s) at the top level. This produces the reconstructed attributes of occupied points for the point cloud data.

According to FIG. 21, a decoder applies the technique (2100) during decoding of attributes of occupied points for intra-frame decompression. The same technique (2100) can be used during inter-frame decompression—applying an inverse RAHT to transform coefficients for prediction residuals for attributes of occupied points, instead of to transform coefficients for the attributes themselves.

5. Alternatives and Variations.

A single application of the RAHT reduces to the Haar transform when weights are uniform. This is the case when a region is fully occupied. The RAHT can be considered a region-adaptive variation of the Haar transform.

In many of the preceding examples, the RAHT and inverse RAHT use pair-wise transforms. Alternatively, the RAHT and inverse RAHT use transforms that operate on more than a pair of values at a time. For example, the RAHT and inverse RAHT can use a transform based on a 4-point Haar transform, with appropriate weighting for counts of occupied points. Or, the RAHT and inverse RAHT switch between different transform sizes. For example, the RAHT and inverse RAHT switch between 2-point and 4-point transform sizes.

E. Coefficient Coding and Decoding.

This section describes examples of quantization and entropy coding of transform coefficients produced by applying a RAHT, as well as examples of entropy decoding and inverse quantization of such transform coefficients.

As explained above, the transform coefficients produced by applying a RAHT have weights associated with them. For a transform coefficient, the weight generally indicates the count of occupied points that have contributed attributes to the transform coefficient. For highpass coefficients generated in initial transforms, the weight is 2. For highpass coefficients generated in later transforms, the weight is higher. In this role, the weights can be used as a proxy for the perceptual importance of the respective transform coefficients.

A subband can be defined as the collection of all coefficients that are associated with the same weight. For example, a highpass coefficient $h_{la,xa,ya,za}$ is in the same subband as another highpass coefficient $h_{lb,xb,yb,zb}$ if and only if the two highpass coefficients have the same weight (that is, $w_{la,xa,ya,za} = w_{lb,xb,yb,zb}$). Highpass coefficients in the same subband can be associated with the same level l of a hierarchy of point cloud data, or they can be associated with different levels. Also, the DC coefficient can be treated as forming its own subband, even though the weight for the DC coefficient is the same as the weight for the lowest-frequency highpass coefficient.

Suppose there are N occupied points in point cloud data. After the RAHT, transform coefficients can be organized into S subbands, with each subband having $N_m$ transform coefficients. In typical examples of point cloud compression, S is, for example, around 2,000, although there can be more or fewer subbands depending on the density of occupied points. In example implementations, the overall number of transform coefficients is the same as the number $N_v$ of occupied points:

$$\sum_{m=0}^{S-1} N_m = N_v.$$

Suppose H ($\{att_i\}$) represents the RAHT for set of attributes $\{att_i\}$, which uses geometry data that indicates the occupied points having those attributes. The transform coefficients resulting from the RAHT can be organized by subband m and coefficient index n as follows: $f_{atti}(m,n)=H(\{att_i\})$, where m indicates a subband index in the range of $0 \le m < S$, and n indicates a coefficient index in the range of $0 \le n < N_m$ within the $m^{th}$ subband.

An encoder and decoder can use geometry data to determine which coefficients are in the respective subbands. The encoder compresses the geometry data, as described in section V.C, and outputs the compressed geometry data as part of the encoded data for a point cloud. The decoder decompresses the geometry data. The encoder and decoder use the geometry data, including indicators of which points are occupied points, to determine the hierarchical decomposition that is followed in the RAHT and reversed in the inverse RAHT. Thus, the encoder and decoder each can determine the number of subbands S, the count $N_m$ of transform coefficients in each subband, and which transform coefficients are in each subband.

1. Examples of Non-Adaptive Entropy Coding and Decoding.

In some example implementations, the transform coefficients produced by applying a RAHT are coded using quantization and non-adaptive entropy coding. The transform coefficients can be reconstructed using non-adaptive entropy decoding and inverse quantization.

After an encoder applies the RAHT to attributes $\{att_i\}$ of occupied points of point cloud data to produce transform coefficients $f_{atti}(m,n)$, the encoder quantizes the transform coefficients. For example, the encoder uses a uniform quantizer with quantization step size Q, generating quantized transform coefficients $k_{mn}$ by $k_{mn}$=round ($f_{atti}(m,n)/Q$). The encoder can use a single quantization step size Q for all transform coefficients. Or, the encoder can vary the quantization step size Q. For example, the encoder can use different quantization step sizes for different tiles. Or, the encoder can use different quantization step sizes for different subbands. Or, the encoder can use different quantization step sizes for different blocks. In a real-time system, the quantization step size can be set dynamically based on feedback from the decoder/renderer (e.g., depending on the distance between the viewer and rendered object). Alternatively, the encoder uses some other form of quantization. The encoder encodes and outputs parameters indicating the quantization step size(s) Q as part of the encoded data.

The encoder entropy codes the quantized transform coefficients $k_{mn}$. For example, the encoder uses arithmetic coding, RLGR coding, or some other form of entropy coding. The entropy coding is non-adaptive. For example, it uses a fixed, pre-defined model for the distribution of quantized transform coefficients, or uses multiple fixed, pre-defined models for the distributions of quantized transform coefficients in different subbands or groups of subbands.

The encoder repeats this process for other attributes of the point cloud data. For example, the encoder encodes luma (Y) sample values for occupied points, then encodes first chroma (U) sample values for the occupied points, and then encodes second chroma (V) sample values for the occupied points. Alternatively, the encoder encodes other and/or additional attributes.

In general, a decoder operates in a reverse manner. The decoder entropy decodes the quantized transform coefficients, producing the quantized transform coefficients $k_{mn}$. For example, the decoder uses arithmetic decoding, RLGR decoding, or some other form of entropy decoding. The entropy decoding is non-adaptive. For example, it uses the same fixed, pre-defined model applied during encoding for the distribution of quantized transform coefficients, or it uses the same multiple fixed, pre-defined models applied during encoding for the distributions of quantized transform coefficients in different subbands or groups of subbands.

The decoder receives and decodes the parameters indicating the quantization step size(s) Q used during quantization of the quantized transform coefficients $k_{mn}$. As indicated by the parameters provided by the encoder, the decoder can use a single quantization step size Q for all transform coefficients, or the decoder can vary the quantization step size Q. After reconstructing the quantization step size(s) Q, the decoder inverse quantizes the quantized transform coefficients $k_{mn}$. For example, the decoder uses a uniform scalar quantizer to reconstruct an approximation $\hat{f}_{atti}(m,n)$ of the transform coefficients: $\hat{f}_{atti}(m,n)=k_{mn} \times Q$. Alternatively, the decoder uses some other form of inverse quantization. The decoder performs the inverse RAHT to reconstruct versions of the attributes $\{att_i\}$. Depending on the level of quantization error introduced (and the extent to which $f_{atti}(m,n)$ differs from $\hat{f}_{atti}(m,n)$), the reconstructed versions of the attributes may differ from the original attributes.

The decoder repeats this process for other attributes of the point cloud data. For example, the decoder decodes luma (Y) sample values for occupied points, then decodes first chroma (U) sample values for the occupied points, and then decodes second chroma (V) sample values for the occupied points. Alternatively, the decoder decodes other and/or additional attributes.

2. Examples of Adaptive Entropy Coding and Decoding.

In some example implementations, the transform coefficients produced by applying a RAHT are coded using quantization and adaptive entropy coding. For example, quantized transform coefficients from the RAHT are entropy coded using an adaptive arithmetic coder, which is driven by parameters that depend on distributions of values of quantized transform coefficients in different subbands. The parameters are encoded and output as part of encoded data. During decoding, the parameters can be reconstructed and used to adapt arithmetic decoding, and transform coefficients can be reconstructed using inverse quantization.

In typical scenarios, quantized transform coefficients produced by RAHT have a distribution that is symmetric about zero, but the shape of the distribution can very from subband to subband, and depending on content. The encoder can calculate a parameter that indicates the shape (slope, steepness, etc.) of the distribution of quantized transform coefficients in a subband or group of subbands, then use that parameter to adapt entropy coding. For example, if the distribution of quantized transform coefficients is sharp and steep, the entropy coding can be skewed to encode zero and low-amplitude values very efficiently. On the other hand, if the distribution of quantized transform coefficients is relatively flat, the entropy coding can be skewed to encode higher-amplitude values more efficiently.

Figure 23:
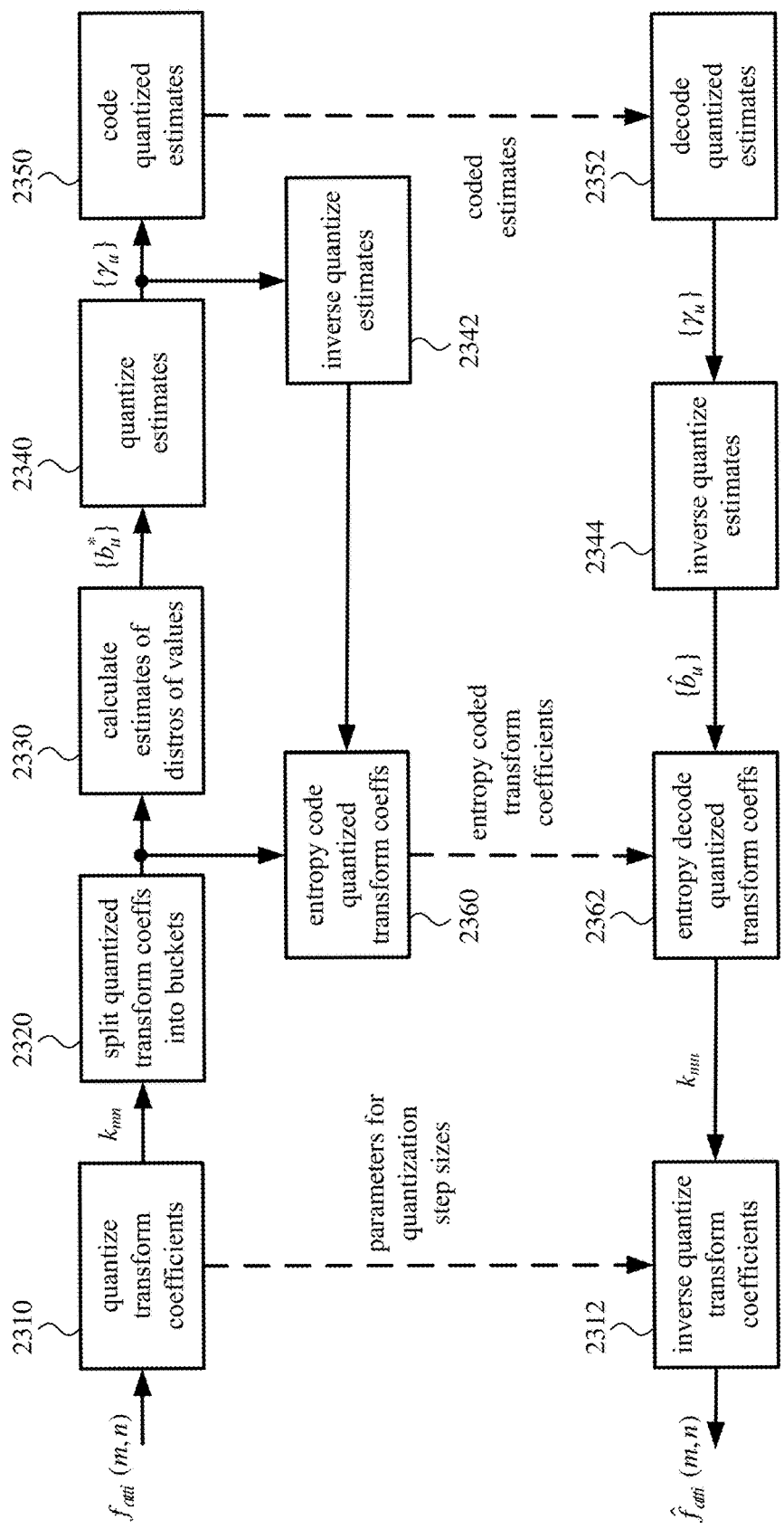
FIG. 23 is a diagram illustrating features of adaptive entropy coding and decoding of quantized transform coefficients produced by applying a RAHT.

FIG. 23 shows an example (2300) of adaptive entropy coding and decoding of quantized transform coefficients from a RAHT. As part of the adaptive entropy encoding, the encoder codes transform coefficients $f_{atti}$ (m,n) for attributes ({$att_1$}) of occupied points of point cloud data, producing coded parameters for distributions and coded transform coefficients. The decoder uses the coded parameters and coded transform coefficients to produce reconstructed versions $\hat{f}_{atti}$ (m,n) of the transform coefficients.

As shown in FIG. 23, after an encoder applies the RAHT to attributes land of occupied points of point cloud data to produce transform coefficients $f_{atti}$ (m,n), the encoder quantizes (2310) the transform coefficients $f_{atti}$ (m,n). For example, the encoder uses a uniform quantizer with quantization step size Q, generating quantized transform coefficients $k_{mn}$ by $k_{mn}$=round($f_{atti}$(m,n)/Q). The encoder can use a single quantization step size Q for all transform coefficients. Or, the encoder can vary the quantization step size Q. For example, the encoder can use different quantization step sizes for different tiles. Or, the encoder can use different quantization step sizes for different subbands. Or, the encoder can use different quantization step sizes for different blocks. In a real-time system, the quantization step size can be set dynamically based on feedback from the decoder/renderer (e.g., depending on the distance between the viewer and rendered object). Alternatively, the encoder uses some other form of quantization. The encoder encodes and outputs parameters indicating the quantization step size(s) Q as part of the encoded data.

Next, the encoder splits (2320) the quantized transform coefficients $k_{mn}$ into multiple buckets using the weights associated with the respective quantized transform coefficients. The number of buckets is U. Each of the multiple buckets can be associated with a different subband (that is, a different weight). Or, a given one of the multiple buckets can be associated with a range of multiple subbands (that is, a range of weights). The subbands can be split evenly into multiple buckets, such that each of the multiple buckets has (at least roughly) quantized transform coefficients for the same number of subbands. Or, the subbands can be split unevenly (e.g., so that subbands have roughly the same number of quantized transform coefficients but may have different numbers of subbands). The encoder provides the quantized transform coefficients $k_{mn}$, split into buckets or otherwise, to an entropy coder, which awaits parameters that specify the distributions of values in the respective buckets.

The encoder calculates (2330) estimates of distributions of values in at least some of the respective buckets. For example, the estimate of the distribution of values in a bucket u is a parameter $b_u$ of a Laplacian distribution that characterizes the distribution of values. For a bucket u associated with a single subband, suppose each transform coefficient X within a given subband has a Laplacian density with parameter b:

$$p(X) = \frac{1}{2b} e^{-\frac{|X|}{b}}$$

The variance $\sigma^2$ of the quantized transform coefficients is $\sigma^2 = 2b^2$. Also suppose the transform coefficient X is uniformly scalar quantized with a quantization step size Q, producing a quantized transform coefficient k as: k=round(X/Q). The probability that X lies in the $k^{th}$ quantization bin is:

$$p_k \triangleq P((k-1/2)Q \leq X < (k+1/2)Q)$$
$$= \int_{(k-\frac{1}{2})Q}^{(k+\frac{1}{2})Q} \frac{1}{2b} e^{-\frac{|x|}{b}} dx$$
$$= \begin{cases} \frac{1}{2} e^{-\frac{|k|Q}{b}} \left(e^{\frac{Q}{2b}} - e^{-\frac{Q}{2b}}\right) & \text{for } k \neq 0 \\ 1 - e^{-\frac{Q}{2b}} & \text{for } k = 0 \end{cases}.$$

The fractional rate r(k,b) (in nats) used by arithmetic coding to encode the quantized transform coefficient if it falls into the $k^{th}$ quantization bin is:

$$r(k,b) = -\ln p_k = \begin{cases} \frac{|k|Q}{b} - \ln\left(\sinh\left(\frac{Q}{2b}\right)\right) & \text{for } k \neq 0 \\ -\ln\left(1 - e^{-\frac{Q}{2b}}\right) & \text{for } k = 0 \end{cases}.$$

When Q<<2b, fractional rate r(k,b) is well-approximated for all k by:

$$r(k,b) \approx \tilde{r}(k,b) = \frac{|k|Q}{b} - \ln\left(\frac{Q}{2b}\right).$$

This provides a probability model for arithmetic coding. Any valid parameter b can be used, as long as the encoder and decoder agree on it.

For a bucket u with quantized transform coefficients of a single subband m, in order to find an acceptable parameter choice, the encoder can sum the fractional rate r(k,b) over all symbols $k_n$ in a given subband m, taking the derivative with respect to b, and equating to zero:

$$\frac{d}{db} \sum_{n=0}^{N_m-1} \tilde{r}(k_{mn}, b) = \sum_{n=0}^{N_m-1} \left(-\frac{|k_{mn}|Q}{b^2} + \frac{1}{b}\right) = 0.$$

For the bucket u associated with a single subband m, the encoder can calculate the value of $b_m$ that minimizes the number of bits needed to encode the $N_m$ symbols in the subband as:

$$b_m^* = \frac{1}{N_m} \sum_{n=0}^{N_m-1} |k_{mn}|Q,$$

where the parameter $b_m^*$ indicates the parameter b* for the $m^{th}$ subband. In other words, the parameter $b_m^*$ can be calculated as the average of the absolute values of reconstructed transform coefficients in the subband m. In this case, the parameter for the bucket $b_u^*$ is $b_m^*$.

If a bucket u includes quantized transform coefficients for multiple subbands, the parameter $b_u^*$ can be calculated, using the preceding equation, as the average of absolute values of all reconstructed transform coefficients in the bucket u. In any case, the set of parameters {$b_u^*$} are conveyed to the decoder so they can be used in adaptive arithmetic decoding.

Alternatively, for a different type of entropy coding, the encoder calculates the set of parameters $\{b_u^*\}$ in a manner appropriate for the probability model associated with that type of entropy coding. For example, for RLGR coding, the encoder may reduce $b_u^*$ by raising it to a power less than one whenever the encoder encodes an index k whose absolute value is less than the supposed mean $b_u^*/Q$; otherwise, the encoder may increase $b_u^*$ by raising it to a power greater than one. Similarly, the decoder may reduce $b_u^*$ by raising it to a power less than one whenever the decoder decodes an index k whose absolute value is less than the supposed mean $b_u^*/Q$; otherwise, the decoder may increase $b_u^*$ by raising it to a power greater than one. In this way, the decoder may track the encoder's adaptation, and explicit signaling of the parameter $b_u^*$ to the decoder can be skipped.

With reference to FIG. 23, to convey the estimates for the subbands to the decoder, the encoder quantizes (2340) the estimates (specifically, the parameters $\{b_u^*\}$ indicating the estimates) and encodes (2350) the quantized estimates. Quantization of the parameters $\{b_u^*\}$ will introduce some errors in the estimates. As a result, the total number of bits used to encode the quantized transform coefficients typically increases slightly (due to decreased efficiency of the adaptive entropy coding of the quantized transform coefficients). To determine how to quantize the parameters $\{b_u^*\}$, the encoder can trade off the increase in bit rate for quantized transform coefficients against the number of bits used to encode the parameters $\{b_u^*\}$ themselves.

For a bucket u that includes quantized transform coefficients for a single subband m, the encoder could quantize the parameter $b_m^*$ in the log domain using a uniform scalar quantizer ($\phi_m^* = \ln b_m^*$), then entropy code the quantized parameter $\phi_m^*$ as part of a sequence of such parameters for other buckets/subbands. For a quantized value $\phi = \phi_m^* + \varepsilon$, the total number of nats needed to code the coefficients in subband m rises from its minimum $$\sum_{n=0}^{N_m-1} \tilde{r}(k_{mn}, b_m^*)$$

to:

$$f(\phi) = \sum_{n=0}^{N_m-1} \tilde{r}(k_{mn}, e^\phi) \approx \sum_{n=0}^{N_m-1} \tilde{r}(k_{mn}, b_m^*) + \frac{N_m}{2}\varepsilon^2,$$

which is the second-order Taylor expansion of $f(\phi)$ around $\phi_m^*$. $N_m$, which is the number of coefficients in subband m, is the second derivative of $f(\phi)$ at $\phi=\phi_m^*$:

$$\frac{d^2 f}{d\phi^2}(\phi_m^*) = \frac{d^2}{d\phi^2}\sum_{n=0}^{N_m-1}\left(\frac{|k_{mn}|Q}{e^\phi} - \ln\left(\frac{Q}{2e^\phi}\right)\right)\Bigg|_{\phi=\phi_m^*} = \sum_{n=0}^{N_m-1}\frac{|k_{mn}|Q}{e^{\phi_m^*}} = \sum_{n=0}^{N_m-1}\frac{|k_{mn}|Q}{b_m^*} = N_m.$$

Thus, $N_m\varepsilon^2/2$ is the increase in the number of nats needed by arithmetic coding to encode the coefficients in subband m if the quantized log parameter $\phi_m^*+\varepsilon$ is used instead of the optimal log parameter $\phi_m^*$. This increase is independent of the parameter $\phi_m^*$ (and $b_m^*$), so the desired step size of the quantizer for $b_m^*$ is independent of the parameter $b_m^*$ itself. If $\delta_m$ is the step size of the quantizer for $b_m^*$, then according to high-rate quantizer theory the expected squared error of the quantizer is approximately $\delta_m^2/12$. Its expected rate is approximately $h - \ln \delta_m$, where h is the differential entropy of the random variable to be quantized. Adding $h - \ln \delta_m$ to the expected value $f(\phi)$, the expected total number of nats for subband m is:

$$h - \ln\delta_m + \sum_{n=0}^{N_m-1}\tilde{r}(k_{mn}, b_m^*) + \frac{N_m}{2}\frac{\delta_m^2}{12}.$$

This is minimized (taking the derivative with respect to $\delta_m$ and equating to zero) by:

$$\delta_m = \frac{C}{\sqrt{N_m}},$$

for some constant C, which depends on implementation. For example, C is 20. This equation yields a quantizer step size $\delta_m$ that is inversely proportional to the square root of the number $N_m$ of transform coefficients in the subband m. Rather than quantize the log parameter $\phi_m^*$, the encoder can directly quantize $b_m^*$: $\gamma_m =$round $(b_m^* \sqrt{N_m}/C)$.

For the encoding (2350) of the quantized estimates, the encoder can use a RLGR coder on the sequence of quantized parameters $\{\gamma_m\}$. Alternatively, the encoder uses another type of entropy coding on the sequence of quantized parameters $\{\gamma_m\}$.

The lowest and highest subbands can be handled in a different way from other subbands. Typically, the first subband (highest frequency highpass coefficients) has a large number of transform coefficients, but a small parameter $b_m^*$ and hence small parameter $\gamma_m$. The parameter $\gamma_m$ for the first subband can be quantized and encoded using a 24-bit floating point representation. The last two subbands (lowpass coefficient and lowest frequency highpass coefficient) have one transform coefficient each, which can be large. The coefficients for the last two subbands are rounded and encoded using a fixed 16-bit integer representation for each, and no parameter $\gamma_m$ is coded. The overhead for the additional care taken encoding the lowest and highest subbands is insignificant in a point cloud with hundreds of thousands of occupied points.

If a bucket u includes quantized transform coefficients for multiple subbands, the parameter $\gamma_u$ can be calculated from the bucket estimate $b_u^*$ for the bucket u and number $N_u$ of transform coefficients in the bucket u as:

$$\gamma_u = \text{round}(b_u^* \sqrt{N_u}/C).$$

The quantized parameters $\{\gamma_u\}$ are entropy coded (2350) (e.g., using RLGR coding).

Alternatively, for a different type of entropy coding, the encoder calculates the quantized parameters $\{\gamma_u\}$ in a manner appropriate for the probability model associated with that type of entropy coding.

With reference to FIG. 23, the encoder inverse quantizes (2342) the quantized estimates. For example, for buckets associated with individual subbands, the encoder reconstructs the parameters $\hat{b}_m$ associated with the respective buckets:

$$\hat{b}_m = \gamma_m C/\sqrt{N_m}.$$

Or, more generally, for buckets associated with any number of subbands, the encoder reconstructs the parameters $\hat{b}_u$ associated with the respective buckets:

$\hat{b}_u = \gamma_u C / \sqrt{N_u}$.

As explained above, the encoder can handle the parameter for the first subband differently, in which case the parameter for the first subband is reconstructed accordingly. The encoder conveys the set $\{\hat{b}_u^*\}$ of reconstructed parameters to the entropy coder.

Finally, the encoder entropy codes (2360) the quantized transform coefficients $k_{mn}$, using the reconstructed parameters $\hat{b}_u$ to guide the adaptive entropy coding. The adaptive entropy coding is, for example, adaptive arithmetic coding with a probability model based on a Laplacian distribution with parameter $\hat{b}_u$, adaptive RLGR coding, or some other type of adaptive entropy coding. As explained above, the entropy coding (2360) can include special treatment of coefficients for the last subbands (DC coefficient and lowest frequency highpass coefficient).

The encoder repeats this process for other attributes of the point cloud data. For example, the encoder encodes luma (Y) sample values for occupied points, then encodes first chroma (U) sample values for the occupied points, and then encodes second chroma (V) sample values for the occupied points. Alternatively, the encoder encodes other and/or additional attributes.

In general, a decoder operates in a reverse manner. The decoder decodes (2352) the quantized estimates. For example, the decoder reverses RLGR coding applied to the sequence of quantized parameters $\{\gamma_u\}$ (which are $\{\gamma_m\}$ for buckets u associated with single subbands m). Alternatively, the decoder uses another type of entropy decoding on the sequence of quantized parameters $\{\gamma_u\}$.

Next, the decoder inverse quantizes (2344) the estimates. For example, for buckets associated with individual subbands m, the decoder reconstructs the parameters $\hat{b}_m$ associated with the respective buckets:

$\hat{b}_m = \gamma_m C / \sqrt{N_m}$.

Or, more generally, for buckets associated with any number of subbands, the decoder reconstructs the parameters $\hat{b}_u$ associated with the respective buckets:

$\hat{b}_u = \gamma_u C / \sqrt{N_u}$.

As explained above, the encoder can handle the parameter for the first subband differently, in which case the decoder reconstructs the parameter for the first subband accordingly. The decoder conveys the set $\{\hat{b}_u\}$ of reconstructed parameters to the entropy decoder.

The decoder entropy decodes (2362) the quantized transform coefficients $k_{mn}$, using the reconstructed parameters $\hat{b}_u$ to guide the adaptive entropy decoding. The adaptive entropy decoding is, for example, adaptive arithmetic decoding with a probability model based on a Laplacian distribution with parameter $\hat{b}_u$, adaptive RLGR decoding, or some other type of adaptive entropy decoding. The entropy decoding (2362) can include special treatment of coefficients for the last subbands (DC coefficient and lowest frequency highpass coefficient), when such coefficients are specially coded (see above).

The decoder also receives and decodes the parameters indicating the quantization step size(s) Q used during quantization of the quantized transform coefficients $k_{mn}$. As indicated by the parameters provided by the encoder, the decoder can use a single quantization step size Q for all transform coefficients, or the decoder can vary the quantization step size Q. After reconstructing the quantization step size(s) Q, the decoder inverse quantizes the quantized transform coefficients $k_{mn}$. For example, the decoder uses a uniform scalar quantizer to reconstruct an approximation of the transform coefficients: $\hat{f}_{atti}(m,n) = k_{mn} \times Q$. Alternatively, the decoder uses some other form of inverse quantization. The decoder performs the inverse RAHT to reconstruct versions of the attributes $\{att_i\}$. Depending on the level of quantization error introduced (and the extent to which $\hat{f}_{atti}(m,n)$ differs from $f_{atti}(m,n)$), the reconstructed versions of the attributes may differ from the original attributes.

The decoder repeats this process for other attributes of the point cloud data. For example, the decoder decodes luma (Y) sample values for occupied points, then decodes first chroma (U) sample values for the occupied points, and then decodes second chroma (V) sample values for the occupied points. Alternatively, the decoder decodes other and/or additional attributes.

3. Compression with Quantization and Adaptive Entropy Coding of RAHT Coefficients.

FIG. 24 shows an example technique (2400) for adaptive entropy coding of quantized transform coefficients from a RAHT. An encoder such as the encoder (301) of FIG. 3a, encoder (302) of FIG. 3b, or other encoder performs the technique (2400) when coding quantized transform coefficients (e.g., in stage (640) described with reference to FIG. 6).

To start, the encoder splits (2410) quantized transform coefficients between multiple buckets. For example, the quantized transform coefficients are split between the multiple buckets depending on weights associated with the quantized transform coefficients, respectively. The weights can depend at least in part on counts of occupied points that contribute to the quantized transform coefficients. Section V.D describes examples of weights. A different bucket can be associated with each different weight. Or, a given bucket can include quantized transform coefficients having a range of weights (subbands). For example, a first bucket includes quantized transform coefficients having a weight of 2, a second bucket includes quantized transform coefficients having a weight in the range of 3 . . . 4, a third bucket includes quantized transform coefficients having a weight in the range of 5 . . . 7, and so on. Section V.E.2 describes examples of strategies for splitting quantized transform coefficients into buckets. Alternatively, the encoder splits quantized transform coefficients into buckets in some other way. Also, the encoder can split transform coefficients into buckets before quantization of the transform coefficients.

For each of at least some of the multiple buckets, the encoder calculates (2420) an estimate of distribution of values of the quantized transform coefficients in the bucket. In general, the estimate is an estimate of the variance of the values of the quantized transform coefficients in the bucket. Section V.E.2 describes examples of strategies for calculating estimates for buckets. Alternatively, the encoder calculates estimates for the respective buckets in some other way. As noted above, the encoder need not calculate estimates for all buckets. For example, the quantized transform coefficients for some buckets (e.g., DC coefficient, lowest-frequency highpass coefficient) can be handled differently.

The encoder quantizes (2430) the estimates and codes (2440) the quantized estimates. Section V.E.2 describes examples of strategies for quantizing estimates for buckets and coding the quantized estimates. Alternatively, the encoder quantizes and codes estimates for the respective buckets in some other way. The encoder also reconstructs (2450) the estimates. For example, the encoder inverse quantizes quantized versions of the estimates to reconstruct the estimates.

Finally, the encoder entropy codes (2460) the quantized transform coefficients. In doing so, the encoder uses the reconstructed estimates to guide the entropy coding process. For example, the encoder uses the reconstructed estimates to define a probability model for arithmetic coding or RLGR coding of the quantized transform coefficients. Alternatively, the encoder uses another form of adaptive entropy coding.

4. Decompression with Adaptive Entropy Decoding and Inverse Quantization of RAHT Coefficients.

FIG. 25 shows an example technique (2500) for adaptive entropy decoding of quantized transform coefficients from a RAHT. A decoder such as the decoder (401) of FIG. 4a, decoder (402) of FIG. 4b, or other decoder performs the technique (2500) when decoding quantized transform coefficients (e.g., in stage (820) described with reference to FIG. 8).

To start, the decoder decodes (2510) quantized estimates and, for each of at least some of the multiple buckets of the quantized transform coefficients, reconstructs (2520) an estimate of distribution of values of the quantized transform coefficients in the bucket. In general, the estimate is an estimate of the variance of the values of the quantized transform coefficients in the bucket. Section V.E.2 describes examples of strategies for decoding and inverse quantizing estimates for buckets. Alternatively, the decoder decodes and reconstructs estimates for the respective buckets in some other way.

The decoder entropy decodes (2530) the quantized transform coefficients. In doing so, the decoder uses the reconstructed estimates to guide the entropy decoding process. For example, the decoder uses the reconstructed estimates to define a probability model for arithmetic decoding or RLGR decoding of the quantized transform coefficients. Alternatively, the decoder uses another form of adaptive entropy decoding.

F. Results.

For some example implementations, compression of point cloud data using a RAHT was evaluated for test data. For example sequences of dynamic point cloud data, point cloud frames were extracted and compressed. The example sequences and point cloud frames were captured under different conditions and had different resolutions.

Some frames were captured using a real-time, high-resolution sparse voxelization algorithm. Cameras, pointed at a region covering roughly a cubic meter of space, captured video. The captured video was processed on a high-end graphics card using the sparse voxelization algorithm in real time, producing an octtree with the number of levels L=9. This yielded a 512×512×512 voxel space, including up to $512^3$=134217728 points. For typical examples of point cloud frames, however, the number of occupied points was between 200,000 and 400,000. Other frames were captured using a non-real-time approach.

In the evaluation of the example implementations, geometry data was encoded without loss. For quantization and adaptive arithmetic coding of transform coefficients produced by the RAHT, the quantization parameter Q varied between 10 and 40, and the constant C was 20.

Bit rate was measured in terms of bits per occupied voxel (bpv). Distortion was measured in terms of peak signal-to-noise ratio (PSNR, in dB), comparing the luma components of the original and reconstructed point cloud frames.

The rate-distortion performance for compression with the RAHT in example implementations was comparable to rate-distortion performance for point cloud compression using a graph transform. Compression with the RAHT is much simpler, however, since its complexity is nearly constant and proportional to the number of occupied points. Also, the RAHT can explore deep levels of the octtree to exploit data redundancies, passing through isolated attributes at higher levels for effective consolidation with attributes at much lower levels.

Different embodiments may include one or more of the inventive features shown in the following table of features.

| # | Feature |
|---|---|
| | A. Compression of Point Cloud Data Using a RAHT |
| A1 | A computer system comprising: an input buffer configured to receive point cloud data comprising multiple points in three-dimensional ("3D") space, each of the multiple points being associated with an indicator of whether the point is occupied and, if the point is occupied, an attribute of the occupied point; an encoder configured to encode the point cloud data, thereby producing encoded data, by performing operations that include: applying a region-adaptive hierarchical transform to attributes of occupied points among the multiple points, thereby producing transform coefficients; and an output buffer configured to store the encoded data as part of a bitstream for output. |
| A2 | In a computer system, a method comprising: receiving point cloud data comprising multiple points in three-dimensional ("3D") space, each of the multiple points being associated with an indicator of whether the point is occupied and, if the point is occupied, an attribute of the occupied point; encoding the point cloud data, thereby producing encoded data, wherein the encoding includes: applying a region-adaptive hierarchical transform to attributes of occupied points among the multiple points, thereby producing transform coefficients; and outputting the encoded data as part of a bitstream. |
| A3 | One or more computer-readable media storing computer-executable instructions for causing a computer system, when programmed thereby, to perform operations comprising: receiving point cloud data comprising multiple points in three-dimensional ("3D") space, each of the multiple points being associated with an indicator of whether the point is occupied and, if the point is occupied, an attribute of the occupied point; encoding the point cloud data, thereby producing encoded data, wherein the encoding includes: |

| # | Feature |
|---|---|
| | applying a region-adaptive hierarchical transform to attributes of occupied points among the multiple points, thereby producing transform coefficients; and outputting the encoded data as part of a bitstream. |
| A4 | The feature of A1, A2, or A3, wherein the applying the region-adaptive hierarchical transform includes, at a given level of a hierarchy for the point cloud data, for each given group of one or more groups of points at the given level:<br>transforming any attributes of occupied points of the given group, thereby producing one or more values for the given group, the one or more values including any of the transform coefficients that are associated with the given group at the given level; and<br>if the given level is not bottom level of the hierarchy, reserving one of the one or more values for the given group, for use as an attribute of an occupied point at a next lower level than the given level in the hierarchy, in successive application of the region-adaptive hierarchical transform at the next lower level. |
| A5 | The feature of A4, wherein, if the given level is not top level of the hierarchy, each of the any attributes of occupied points of the given group is a reserved value from a next higher level than the given level in the hierarchy. |
| A6 | The feature of A4, wherein, for two adjacent points of the given group, the transforming includes:<br>if both of the two adjacent points are occupied, converting the attributes of the two adjacent points into a lowpass coefficient and a highpass coefficient, wherein the highpass coefficient is one of the transform coefficients, and wherein the lowpass coefficient is the reserved value or is an intermediate attribute for additional transforming at the given level; and<br>if only one of the two adjacent points is occupied, passing through the attribute of the occupied point to be the reserved value or the intermediate attribute. |
| A7 | The feature of A4, wherein the transforming includes applying a weighted transform, wherein weights of the weighted transform depend at least in part on counts of occupied points that contribute to the occupied points of the given group. |
| A8 | The feature of A4, wherein the transforming includes iteratively applying a weighted transform along each of three axes in the 3D space. |
| A9 | The feature of A4, wherein the hierarchy includes a bottom level, zero or more intermediate levels, and the top level, and wherein the applying the region-adaptive hierarchical transform includes:<br>for each of the top level and zero or more intermediate levels, as the given level, performing the transforming and the reserving for each given group of the one or more groups of points at the given level, thereby providing at least one reserved value for the next lower level and providing any of the transform coefficients that are associated with the given level; and<br>at the bottom level of the hierarchy, for a group of points at the bottom level, transforming any attributes of occupied points of the group at the bottom level, thereby producing one or more of the transform coefficients. |
| A10 | The feature of A1, A2, or A3, wherein the applying the region-adaptive hierarchical transform includes using the indicators to determine which of the multiple points, respectively, are occupied. |
| A11 | The feature of A1, A2, or A3, wherein, to encode the point cloud data, the operations further include or the encoding further includes:<br>quantizing the transform coefficients; and<br>entropy coding the quantized transform coefficients. |
| A12 | The feature of A11, wherein, to encode the point cloud data, the operations further include or the encoding further includes:<br>splitting the quantized transform coefficients between multiple buckets; and<br>for each of at least some of the multiple buckets, calculating an estimate of distribution of values of the quantized transform coefficients in the bucket. |
| A13 | The feature of A12, wherein the quantized transform coefficients are split between the multiple buckets depending on weights associated with the quantized transform coefficients, respectively, the weights depending at least in part on counts of occupied points that contribute to the quantized transform coefficients. |
| A14 | The feature of A12, wherein, for each of the at least some of the multiple buckets, the estimate is an estimate of variance of the values of the quantized transform coefficients in the bucket. |
| A15 | The feature of A12, wherein, to encode the point cloud data, the operations further include or the encoding further includes:<br>quantizing the estimates;<br>entropy coding the quantized estimates; and<br>reconstructing the estimates, wherein the reconstructed estimates are used by the entropy coding of the quantized transform coefficients. |
| A16 | The feature of A11, wherein the entropy coding of the quantized transform coefficients is arithmetic coding or run-length Golomb-Rice coding. |
| A17 | The feature of A1, A2, or A3, wherein the attribute is selected from the group consisting of:<br>a sample value defining, at least in part, a color associated with the occupied point;<br>an opacity value defining, at least in part, an opacity associated with the occupied point;<br>a specularity value defining, at least in part, a specularity coefficient associated with the occupied point;<br>a surface normal value defining, at least in part, direction of a flat surface associated |

| # | Feature |
|---|---|
| | with the occupied point;<br>a motion vector defining, at least in part, motion associated with the occupied point; and<br>a light field defining, at least in part, a set of light rays passing through or reflected from the occupied point. |
| A18 | The feature of A1, A2, or A3, wherein, to encode the point cloud data, the operations further include, or the encoding further includes, applying octtree compression to the indicators of whether the multiple points, respectively, are occupied. |
| A19 | The feature of A18, wherein the octtree compression is lossless. |
| A20 | The feature of A18, wherein, to encode the point cloud data, the operations further include, or the encoding further includes:<br>applying geometry compression to the indicators of whether the multiple points, respectively, are occupied, wherein the geometry compression is lossy; and<br>reconstructing the indicators of whether the multiple points, respectively, are occupied, wherein the applying the region-adaptive hierarchical transform uses the reconstructed indicators to determine which of the multiple points, respectively, are occupied. |
| | B. Decompression of Point Cloud Data Using an Inverse RAHT |
| B1 | A computer system comprising:<br>an input buffer configured to receive encoded data as part of a bitstream;<br>a decoder configured to decode the encoded data to reconstruct point cloud data, the point cloud data comprising multiple points in three-dimensional ("3D") space, each of the multiple points being associated with an indicator of whether the point is occupied and, if the point is occupied, an attribute of the occupied point, wherein the decoder is configured to decode the encoded data by performing operations that include:<br>applying an inverse region-adaptive hierarchical transform to transform coefficients for attributes of occupied points among the multiple points; and<br>an output buffer configured to store the reconstructed point cloud data. |
| B2 | In a computer system, a method comprising:<br>receiving encoded data as part of a bitstream; and<br>decoding the encoded data to reconstruct point cloud data, the point cloud data comprising multiple points in three-dimensional ("3D") space, each of the multiple points being associated with an indicator of whether the point is occupied and, if the point is occupied, an attribute of the occupied point, wherein the decoding the encoded data includes:<br>applying an inverse region-adaptive hierarchical transform to transform coefficients for attributes of occupied points among the multiple points; and<br>storing the reconstructed point cloud data. |
| B3 | One or more computer-readable media storing computer-executable instructions for causing a computer system, when programmed thereby, to perform operations comprising:<br>receiving encoded data as part of a bitstream;<br>decoding the encoded data to reconstruct point cloud data, the point cloud data comprising multiple points in three-dimensional ("3D") space, each of the multiple points being associated with an indicator of whether the point is occupied and, if the point is occupied, an attribute of the occupied point, wherein the decoding the encoded data includes:<br>applying an inverse region-adaptive hierarchical transform to transform coefficients for attributes of occupied points among the multiple points; and<br>storing the reconstructed point cloud data. |
| B4 | The feature of B1, B2, or B3, wherein the applying the inverse region-adaptive hierarchical transform includes, at a given level of a hierarchy for the point cloud data, for each given group of one or more groups of points at the given level:<br>inverse transforming one or more values for the given group, thereby producing any attributes of occupied points of the given group, wherein the one or more values include any of the transform coefficients that are associated with the given group at the given level; and<br>if the given level is not top level of the hierarchy, reserving the any attributes of occupied points of the given group, for use as attributes at a next higher level than the given level in the hierarchy, in successive application of the inverse region-adaptive hierarchical transform at the next higher level. |
| B5 | The feature of B4, wherein if the given level is not bottom level of the hierarchy, one of the one or more values is an attribute of an occupied point from a next lower level than the given level in the hierarchy. |
| B6 | The feature of B5, wherein, for two adjacent points of the given group, the inverse transforming includes:<br>if both of the two adjacent points are occupied, converting a lowpass coefficient and a highpass coefficient into the attributes of the two adjacent points, wherein the highpass coefficient is one of the transform coefficients, and wherein the lowpass coefficient is the attribute of the occupied point from the next lower level or is an intermediate attribute from previous inverse transforming at the given level; and<br>if only one of the two adjacent points is occupied, passing through, to be the attribute of the occupied point of the given group, the attribute of the occupied point from the next lower level or the intermediate attribute. |

| # | Feature |
|---|---|
| B7 | The feature of B4, wherein the inverse transforming includes applying a weighted inverse transform, wherein weights of the inverse weighted transform depend at least in part on counts of occupied points that contribute to the occupied points of the given group. |
| B8 | The feature of B4, wherein the inverse transforming includes iteratively applying a weighted inverse transform along each of three axes in the 3D space. |
| B9 | The feature of B4, wherein the hierarchy includes the bottom level, zero or more intermediate levels, and a top level, and wherein the applying the inverse region-adaptive hierarchical transform includes:<br>for each of the bottom level and zero or more intermediate levels, as the given level, performing the inverse transforming and the reserving for each given group of the one or more groups of points at the given level, thereby providing at least one reserved value for the next higher level; and<br>at the top level of the hierarchy, for each given group of one or more groups of points at the top level, inverse transforming one or more values for the given group at the top level, thereby producing any attributes of occupied points of the given group. |
| B10 | The feature of B1, B2, or B3, wherein the applying the inverse region-adaptive hierarchical transform includes using the indicators to determine which of the multiple points, respectively, are occupied. |
| B11 | The feature of B1, B2, or B3, wherein, to decode the encoded data, the operations further include or the decoding the encoded data further includes:<br>entropy decoding quantized transform coefficients; and<br>inverse quantizing the quantized transform coefficients to reconstruct the transform coefficients for attributes of occupied points among the multiple points. |
| B12 | The feature of B11, wherein, to decode the encoded data, the operations further include or the decoding the encoded data further includes:<br>for each of at least some of multiple buckets of the quantized transform coefficients, reconstructing an estimate of distribution of values of the quantized transform coefficients in the bucket, wherein the entropy decoding of the quantized transform coefficients uses the reconstructed estimates. |
| B13 | The feature of B12, wherein the quantized transform coefficients have been split between the multiple buckets depending on weights associated with the quantized transform coefficients, respectively, the weights depending at least in part on counts of occupied points that contribute to the quantized transform coefficients. |
| B14 | The feature of B12, wherein, for each of the at least some of the multiple buckets, the estimate is an estimate of variance of the values of the quantized transform coefficients in the bucket. |
| B15 | The feature of B12, wherein, to decode the encoded data, the operations further include or the decoding the encoded data further includes:<br>entropy decoding quantized estimates. |
| B16 | The feature of B11, wherein the entropy decoding of the quantized transform coefficients is arithmetic decoding or run-length Golomb-Rice decoding. |
| B17 | The feature of B1, B2, or B3, wherein the attribute is selected from the group consisting of:<br>a sample value defining, at least in part, a color associated with the occupied point;<br>an opacity value defining, at least in part, an opacity associated with the occupied point;<br>a specularity value defining, at least in part, a specularity coefficient associated with the occupied point;<br>a surface normal value defining, at least in part, direction of a flat surface associated with the occupied point;<br>a motion vector defining, at least in part, motion associated with the occupied point; and<br>a light field defining, at least in part, a set of light rays passing through or reflected from the occupied point. |
| B18 | The feature of B1, B2, or B3, wherein, to decode the encoded data, the operations further include or the decoding the encoded data further includes:<br>applying octtree decompression to recover the indicators of whether the multiple points, respectively, are occupied. |
| B19 | The feature of B18, wherein the octtree decompression reverses lossless octtree compression. |
| B20 | The feature of B18, wherein the indicators of whether the multiple points, respectively, are occupied are compressed using geometric compression that is lossy, and wherein, to decode the encoded data, the operations further include or the decoding the encoded data further includes:<br>reconstructing the indicators of whether the multiple points, respectively, are occupied, wherein the applying the inverse region-adaptive hierarchical transform uses the reconstructed indicators to determine which of the multiple points, respectively, are occupied. |

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A computer system comprising:
an input buffer configured to receive point cloud data comprising multiple points in three-dimensional ("3D") space, each of the multiple points being associated with an indicator of whether the point is occupied and, if the point is occupied, an attribute of the occupied point;

an encoder configured to encode the point cloud data, thereby producing encoded data, by performing operations that include:

applying a region-adaptive hierarchical transform ("RAHT") to attributes of occupied points among the multiple points, thereby producing transform coefficients, wherein the applying the RAHT includes, at a given level of a hierarchy for the point cloud data, for each given group of one or more groups of points at the given level:

transforming any attributes of occupied points of the given group, thereby producing one or more values for the given group, the one or more values including any of the transform coefficients that are associated with the given group at the given level; and if the given level is not bottom level of the hierarchy, reserving one or more values for the given group, for use as an attribute of an occupied point at a next lower level than the given level in the hierarchy, in successive application of the RAHT at the next lower level; and an output buffer configured to store the encoded data as part of a bitstream for output.

2. The computer system of claim 1, wherein, if the given level is not top level of the hierarchy, each of the any attributes of occupied points of the given group is a reserve value from a next higher level than the given level in the hierarchy.

3. The computer system of claim 1, wherein, for two adjacent points of the given group, the transforming includes:

if both of the two adjacent points are occupied, converting the attributes of the two adjacent points into a lowpass coefficient and a highpass coefficient, wherein the highpass coefficient is one of the transform coefficients, and wherein the lowpass coefficient is the reserved value or is an intermediate attribute for additional transforming at the given level; and if only one of the two adjacent points is occupied, passing through the attribute of the occupied point to be the reserved value or the intermediate attribute.

4. The computer system of claim 1, wherein the transforming includes applying a weighted transform, and wherein weights of the weighted transform depend at least in part on counts of occupied points that contribute to the occupied points of the given group.

5. The computer system of claim 1, wherein the transforming includes iteratively applying a weighted transform along each of three axes in the 3D space.

6. The computer system of claim 1, wherein the hierarchy includes a bottom level, zero or more intermediate levels, and the top level, and wherein the applying the RAHT includes:

for each of the top level and zero or more intermediate levels, as the given level, performing the transforming and the reserving for each given group of the one or more groups of points at the given level, thereby providing at least one reserved value for the next lower level and providing any of the transform coefficients that are associated with the given level; and at the bottom level of the hierarchy, for a group of points at the bottom level, transforming any attributes of occupied points of the group at the bottom level, thereby producing one or more of the transform coefficients.

7. The computer system of claim 1, wherein the applying the RAHT includes using the indicators to determine which of the multiple points, respectively, are occupied.

8. The computer system of claim 1, wherein, to encode the point cloud data, the operations further include:

quantizing the transform coefficients; and
entropy coding the quantized transform coefficients.

9. The computer system of claim 8, wherein, to encode the point cloud data, the operations further include:

splitting the quantized transform coefficients between multiple buckets; and for each of at least some of the multiple buckets, calculating an estimate of distribution of values of the quantized transform coefficients in the bucket.

10. The computer system of claim 9, wherein the quantized transform coefficients are split between the multiple buckets depending on weights associated with the quantized transform coefficients, respectively, the weights depending at least in part on counts of occupied points that contribute to the quantized transform coefficients.

11. The computer system of claim 9, wherein, to encode the point cloud data, the operations further include:

quantizing the estimates;
entropy coding the quantized estimates; and
reconstructing the estimates, wherein the reconstructed estimates are used by the entropy coding of the quantized transform coefficients.

12. The computer system of claim 8, wherein the entropy coding of the quantized transform coefficients is arithmetic coding or run-length Golomb-Rice coding.

13. The computer system of claim 1, wherein the attribute is selected from the group consisting of:

a sample value defining, at least in part, a color associated with the occupied point;

an opacity value defining, at least in part, an opacity associated with the occupied point;

a specularity value defining, at least in part, a specularity coefficient associated with the occupied point;

a surface normal value defining, at least in part, direction of a flat surface associated with the occupied point;

a motion vector defining, at least in part, motion associated with the occupied point; and a light field defining, at least in part, a set of light rays passing through or reflected from the occupied point.

14. The computer system of claim 1, wherein, to encode the point cloud data, the operations further include applying octtree compression to the indicators of whether the multiple points, respectively, are occupied.

15. One or more computer-readable media storing computer-executable instructions for causing a computer system, when programmed thereby, to perform operations comprising:

receiving encoded data as part of a bitstream;
decoding the encoded data to reconstruct point cloud data, the point cloud data comprising multiple points in three-dimensional ("3D") space, each of the multiple points being associated with an indicator of whether the point is occupied and, if the point is occupied, an attribute of the occupied point, wherein the decoding the encoded data includes:

applying an inverse region-adaptive hierarchical transform ("RAHT) to transform coefficients for attributes of occupied points among the multiple points, wherein the applying the inverse RAHT includes, at a given level of a hierarchy for the point cloud data, for each given group of one or more groups of points at the given level:
  inverse transforming one or more values for the given group, thereby producing any attributes of occupied points of the given group, wherein the one or more values include any of the transform coefficients that are associated with the given group at the given level; and
  if the given level is not top level of the hierarchy, reserving the any attributes of occupied points of the given group, for use as attributes at a next higher level than the given level in the hierarchy, in successive application of the inverse RAHT at the next higher level; and
storing the reconstructed point cloud data.

16. The one or more computer-readable media of claim 15, wherein the inverse transforming includes applying a weighted inverse transform, wherein weights of the weighted inverse transform depend at least in part on counts of occupied points that contribute to the occupied points of the given group.

17. The one or more computer-readable media of claim 15, wherein the decoding the encoded data further includes:
  entropy decoding quantized transform coefficients; and
  inverse quantizing the quantized transform coefficients to reconstruct the transform coefficients for attributes of occupied points among the multiple points.

18. In a computer system, a method comprising:
  receiving encoded data as part of a bitstream; and
  decoding the encoded data to reconstruct point cloud data, the point cloud data comprising multiple points in three-dimensional ("3D") space, each of the multiple points being associated with an indicator of whether the point is occupied and, if the point is occupied, an attribute of the occupied point, wherein the attribute is selected from the group consisting of:
    a sample value defining, at least in part, a color associated with the occupied point;
    an opacity value defining, at least in part, an opacity associated with the occupied point;
    a specularity value defining, at least in part, a specularity coefficient associated with the occupied point;
    a surface normal value defining, at least in part, direction of a flat surface associated with the occupied point;
    a motion vector defining, at least in part, motion associated with the occupied point; and
    a light field defining, at least in part, a set of light rays passing through or reflected from the occupied point; and
  wherein the decoding the encoded data includes:
    applying an inverse region-adaptive hierarchical transform ("RAHT") to transform coefficients for attributes of occupied points among the multiple points; and
  storing the reconstructed point cloud data.

19. The method of claim 18, wherein the applying the inverse RAHT includes, at a given level of a hierarchy for the point cloud data, for each given group of one or more groups of points at the given level:
  inverse transforming one or more values for the given group, thereby producing any attributes of occupied points of the given group, wherein the one or more values include any of the transform coefficients that are associated with the given group at the given level; and
  if the given level is not top level of the hierarchy, reserving the any attributes of occupied points of the given group, for use as attributes at a next higher level than the given level in the hierarchy, in successive application of the inverse RAHT at the next higher level.

20. The method of claim 19, wherein if the given level is not bottom level of the hierarchy, one of the one or more values is an attribute of an occupied point from a next lower level than the given level in the hierarchy.

21. The method of claim 19, wherein, for two adjacent points of the given group, the inverse transforming includes:
  if both of the two adjacent points are occupied, converting a lowpass coefficient and a highpass coefficient into the attributes of the two adjacent points, wherein the highpass coefficient is one of the transform coefficients, and wherein the lowpass coefficient is the attribute of the occupied point from the next lower level or is an intermediate attribute from previous inverse transforming at the given level; and
  if only one of the two adjacent points is occupied, passing through, to be the attribute of the occupied point of the given group, the attribute of the occupied point from the next lower level or the intermediate attribute.

22. The method of claim 19, wherein the inverse transforming includes applying a weighted inverse transform, and wherein weights of the weighted inverse transform depend at least in part on counts of occupied points that contribute to the occupied points of the given group.

23. The method of claim 19, wherein the hierarchy includes the bottom level, zero or more intermediate levels, and a top level, and wherein the applying the inverse RAHT includes:
  for each of the bottom level and zero or more intermediate levels, as the given level, performing the inverse transforming and the reserving for each given group of the one or more groups of points at the given level, thereby providing at least one reserved value for the next higher level; and
  at the top level of the hierarchy, for each given group of one or more groups of points at the top level, inverse transforming one or more values for the given group at the top level, thereby producing any attributes of occupied points of the given group.

24. The method of claim 18, wherein the applying the inverse RAHT includes using the indicators to determine which of the multiple points, respectively, are occupied.

25. The method of claim 18, wherein the decoding the encoded data further includes:
  applying octtree decompression to recover the indicators of whether the multiple points, respectively, are occupied.

26. In a computer system, a method comprising:
  receiving point cloud data comprising multiple points in three-dimensional ("3D") space, each of the multiple points being associated with an indicator of whether the point is occupied and, if the point is occupied, an attribute of the occupied point, wherein the attribute is selected from the group consisting of:
    a sample value defining, at least in part, a color associated with the occupied point;
    an opacity value defining, at least in part, an opacity associated with the occupied point;
    a specularity value defining, at least in part, a specularity coefficient associated with the occupied point;

a surface normal value defining, at least in part, direction of a flat surface associated with the occupied point;

a motion vector defining, at least in part, motion associated with the occupied point; and a light field defining, at least in part, a set of light rays passing through or reflected from the occupied point;

encoding the point cloud data, thereby producing encoded data, wherein the encoding includes:

applying a region-adaptive hierarchical transform ("RAHT") to attributes of occupied points among the multiple points, thereby producing transform coefficients; and outputting the encoded data as part of a bitstream.

27. The method of claim 26, wherein the applying the RAHT includes, at a given level of a hierarchy for the point cloud data, for each given group of one or more groups of points at the given level:

transforming any attributes of occupied points of the given group, thereby producing one or more values for the given group, the one or more values including any of the transform coefficients that are associated with the given group at the given level; and if the given level is not bottom level of the hierarchy, reserving one of the one or more values for the given group, for use as an attribute of an occupied point at a next lower level than the given level in the hierarchy, in successive application of the region-adaptive hierarchical transform at the next lower level.

28. The method of claim 27, wherein, for two adjacent points of the given group, the transforming includes:

if both of the two adjacent points are occupied, converting the attributes of the two adjacent points into a lowpass coefficient and a highpass coefficient, wherein the highpass coefficient is one of the transform coefficients, and wherein the lowpass coefficient is the reserved value or is an intermediate attribute for additional transforming at the given level; and if only one of the two adjacent points is occupied, passing through the attribute of the occupied point to be the reserved value or the intermediate attribute.

29. The method of claim 27, wherein the transforming includes applying a weighted transform, and wherein weights of the weighted transform depend at least in part on counts of occupied points that contribute to the occupied points of the given group.

30. The method of claim 26, wherein the applying the RAHT includes using the indicators to determine which of the multiple points, respectively, are occupied.

* * * * *